United States Patent
Herbsommer et al.

(10) Patent No.: US 11,782,392 B2
(45) Date of Patent: Oct. 10, 2023

(54) HERMETIC VIAL FOR QUANTUM TRANSITIONS DETECTION IN ELECTRONIC DEVICES APPLICATIONS

(71) Applicant: TEXAS INSTRUMENTS INCORPORATED, Dallas, TX (US)

(72) Inventors: Juan Alejandro Herbsommer, Allen, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/491,284

(22) Filed: Sep. 30, 2021

(65) Prior Publication Data
US 2022/0107609 A1 Apr. 7, 2022

Related U.S. Application Data

(60) Provisional application No. 63/144,566, filed on Feb. 2, 2021, provisional application No. 63/087,949, filed on Oct. 6, 2020.

(51) Int. Cl.
*G04F 5/14* (2006.01)
*H01S 1/06* (2006.01)
*H03L 7/26* (2006.01)

(52) U.S. Cl.
CPC ............ *G04F 5/145* (2013.01); *H01S 1/06* (2013.01); *H03L 7/26* (2013.01)

(58) Field of Classification Search
CPC ... G04F 5/14; G04F 5/145; H03L 7/26; H03B 17/00; H01S 1/06
See application file for complete search history.

(56) References Cited

U.S. PATENT DOCUMENTS 9,529,334 B2 12/2016 Herbsommer et al.
10,131,115 B1 11/2018 Fruehling et al.
(Continued)

FOREIGN PATENT DOCUMENTS

RU 2683455 C1 * 3/2019

OTHER PUBLICATIONS

Knappe, Svenja, et al. "Compact atomic vapor cells fabricated by laser-induced heating of hollow-core glass fibers." Review of scientific instruments 74.6 (2003): 3142-3145. (Year: 2003).*

(Continued)

*Primary Examiner* — Ryan Johnson
(74) *Attorney, Agent, or Firm* — Frank D. Cimino

(57) ABSTRACT

A physics cell includes a sealed glass vial that contains a high-purity dipolar gas (e.g., OCS) at a low pressure (e.g., between about 0.01 millibar and 0.2 millibar). The vial can be sealed using a laser cutting process that involves only local heating of the vial that does not denature the bulk of the contained gas. One or more electromagnetically translucent windows or vial-end access points provide access to electromagnetic waves launched or received by one or more electromagnetic antennas at a frequency that is adjusted to match the quantum transition frequency of the gas based on a detected maximum absorption frequency. The glass-vial physics cell can be fabricated at lower cost than physics cells fabricated from bonded wafers. Multiple vials can be joined by a waveguide in an enclosure so that launch and receive antennas can be provided at a single end of the vials.

22 Claims, 35 Drawing Sheets

(56) References Cited

U.S. PATENT DOCUMENTS

| | | |
|---|---|---|
| 10,364,144 B2 | 7/2019 | Herbsommer et al. |
| 10,370,760 B2 | 8/2019 | Jacobs et al. |
| 10,374,621 B2 | 8/2019 | Herbsommer et al. |
| 10,424,523 B2 | 9/2019 | Fruehling et al. |
| 10,444,102 B2 | 10/2019 | Herbsommer et al. |
| 10,498,001 B2 | 12/2019 | Fruehling et al. |
| 10,544,039 B2 | 1/2020 | Cook et al. |
| 10,549,986 B2 | 2/2020 | Herbsommer et al. |
| 10,551,265 B2 | 2/2020 | Cook et al. |
| 10,589,986 B2 | 3/2020 | Fruehling et al. |
| 10,620,589 B1 | 4/2020 | Bahr et al. |
| 10,649,408 B2 | 5/2020 | Herbsommer et al. |
| 10,754,302 B2 | 8/2020 | Herbsommer et al. |
| 10,775,422 B2 | 9/2020 | Fruehling et al. |
| 2005/0007118 A1* | 1/2005 | Kitching ............... H03L 7/26 324/464 |
| 2019/0071306 A1* | 3/2019 | Herbsommer .... H01L 21/76898 |
| 2019/0186007 A1* | 6/2019 | Jacobs ..................... G04F 5/14 |
| 2019/0204786 A1* | 7/2019 | Herbsommer ........... G04F 5/14 |

OTHER PUBLICATIONS

Losev, S. S., et al. "Production of miniature glass cells with rubidium for chip scale atomic clock." Physics Procedia 71 (2015): 242-246. (Year: 2015).*

* cited by examiner

HERMETIC VIAL FOR QUANTUM TRANSITIONS DETECTION IN ELECTRONIC DEVICES APPLICATIONS

CROSS-REFERENCE TO RELATED APPLICATIONS

This application claims priority to U.S. provisional patent application No. 63/087,949, filed Oct. 6, 2020, and U.S. provisional patent application No. 63/144,566, filed Feb. 2, 2021, which are hereby incorporated by reference.

TECHNICAL FIELD

This description relates generally to sealed gas-filled chambers, and more particularly to a hermetic vial for quantum transitions detection in electronic devices applications.

BACKGROUND

A hermetically sealed cavity may be fabricated by bonding two wafers together, at least one of the wafers being hollowed out to form the cavity. The cavity is useful as a physics cell in numerous applications, including as part of a chip-scale millimeter-wave atomic clock. The cavity can contain dipolar molecules at a relatively low pressure that can be chosen to provide a narrow signal absorption frequency peak indicative of the quantum transition molecules as detected at an output of the cavity. An electromagnetic signal can be launched into the cavity through an aperture in the cavity that is electromagnetically translucent or substantially transparent. Closed-loop control can dynamically adjust the frequency of the signal to match the signal absorption frequency peak. The frequency produced by quantum rotation of the selected dipolar molecules may be unaffected by aging of the chip-scale millimeter-wave atomic clock and may not vary with temperature or other environmental factors.

SUMMARY

An example physics cell includes a glass vial that is sealed to contain a dipolar gas. The vial has a width or diameter of between about 1 millimeter and about 10 millimeters. The vial has walls that are between about 50 micrometers and about 250 micrometers thick. The dipolar gas is contained at a pressure of between about 0.01 millibar and 0.2 millibar. The physics cell further includes an electromagnetically translucent window or vial-end access point to the glass vial. The physics cell further includes an electromagnetic antenna coupled to the glass vial at the location of the electromagnetically translucent window or vial-end access point. The antenna is configured to launch or receive electromagnetic waves propagated through the dipolar gas contained in the glass vial. The vial can be dimensioned to support a monomode of propagation of the electromagnetic waves at a frequency of a quantum transition of the dipolar gas.

In an example method of fabricating a physics cell, a glass tube having a width of between about 1 millimeter and about 10 millimeters, and walls that are between about 50 micrometers and about 250 micrometers thick, is repeatedly filled with and, under vacuum, purged of a dipolar gas. The tube is then filled with the dipolar gas at a pressure of between about 0.01 millibar and 0.2 millibar. The tube is then laser cut and sealed to create a vial containing the dipolar gas at the pressure. At least one of the following is then performed: (a) the outside of the vial is coated with an electromagnetically reflective material and is provided with an electromagnetically translucent window or vial-end access point in the coating; (b) the vial is contained in an enclosure that is made of or coated with an electromagnetically reflective material and has an electromagnetically translucent window or vial-end access point, in which exterior walls of the vial adjoin the electromagnetically reflective material of the enclosure. An electromagnetic antenna is then coupled to the vial at the location of the electromagnetically translucent window or vial-end access point. The electromagnetic antenna is configured to launch or receive electromagnetic waves propagated through the dipolar gas contained in the vial. The electromagnetic antenna is electrically coupled to circuitry configured to adjust a frequency of the electromagnetic waves to a quantum transition frequency of the dipolar gas.

An example quantum transition frequency detection system includes a sealed glass vial that contains a dipolar gas. The vial has a cross-sectional width of between about 1 millimeter and about 10 millimeters. The walls of the vial are between about 50 micrometers and about 250 micrometers thick in cross-section. The dipolar gas is contained at a pressure of between about 0.01 millibar and 0.2 millibar. The vial has an electromagnetically translucent window or vial-end access point to the glass vial. The system further includes an electromagnetic antenna is coupled to the glass vial at a location of the electromagnetically translucent window or vial-end access point. The antenna is configured to launch or receive electromagnetic waves propagated through the dipolar gas contained in the glass vial. The system further includes transition frequency-locking control-loop circuitry electrically coupled to the electromagnetic antenna and configured to adjust a frequency of the electromagnetic waves to a quantum transition frequency of the dipolar gas.

DETAILED DESCRIPTION

A hermetically sealed device can hold gas molecules or atoms that can be interrogated with electromagnetic radiation in order to detect and use their quantum transitions for electronic devices applications. For example, a hermetic glass vial can be filled with a relatively pure dipolar gas at low pressure for quantum transition detection of the gas molecules for electronic devices applications. The vial can be configured as a physics cell such that electromagnetic waves within a frequency range can be launched into the vial to interrogate the dipolar gas molecules for quantum molecular rotational transition detection. As an example, the vial can be manufactured to hold the low-pressure gas using a localized gas sealing process that does not denature the bulk of the contained gas. As another example, a metallization and etching process can allow the vial to be suitable for controlled electromagnetic mode propagation, which is useful to detect the quantum transitions of molecules of the trapped gas. Use of a small glass vial for this purpose can be easier to manufacture, more scalable, and lower cost than, for example, a physics cell constructed using two wafers coupled together, wherein a cavity for confining the gas is etched out of a first of the two wafers and bonded to a second of the two wafers to provide a hermetic seal.

Figure 1:
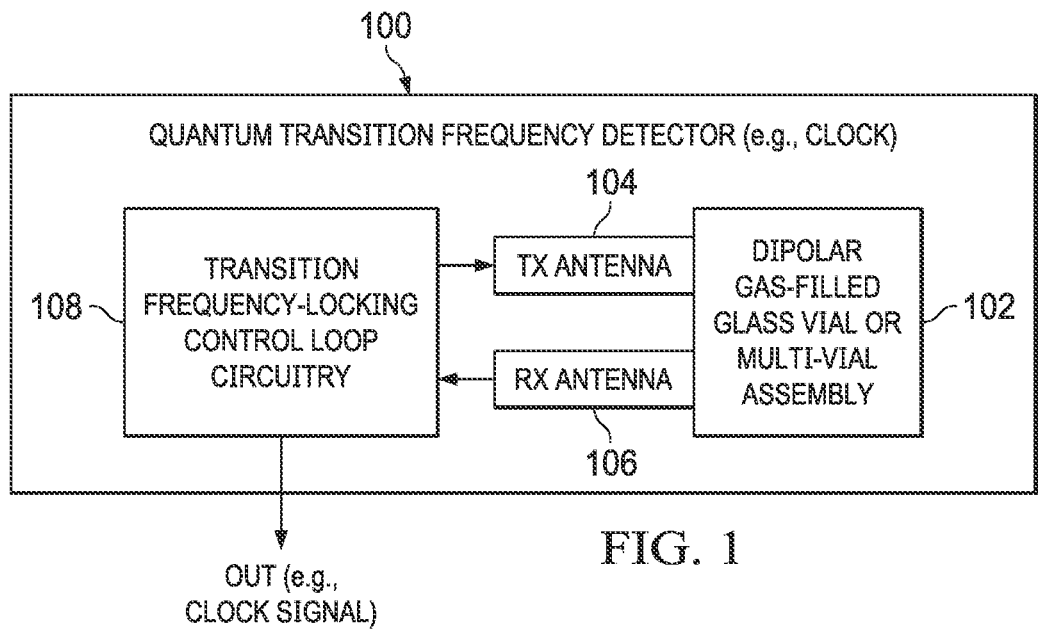
FIG. 1 is a block diagram of an example quantum transition frequency detector.

FIG. 1 is a block diagram of an example quantum transition frequency detector 100 that can be integrated to provide, for example, a clock that is accurate to within one second in several hundred years. In other examples, the frequency detector 100 is useful to create a magnetic field sensor (magnetometer), an electric field sensor, or a pressure sensor. Detector 100 includes a glass vial 102, or an assembly that includes multiple such glass vials. The vial 102 is hermetically sealed to contain a dipolar gas at relatively low pressure, the precise pressure depending on which dipolar gas is used, among other factors. For example, the pressure is less than atmospheric pressure at sea level, e.g., less than one one-hundredth of atmospheric pressure at sea level e.g., less than one one-thousandth of atmospheric pressure at sea level e.g., less than one ten-thousandth of atmospheric pressure at sea level. Suitable dipolar gases include water vapor ($H_2O$), acetonitrile ($CH_3CN$), cyanoacetylene ($HC_3N$), ammonia ($NH_3$), carbonyl sulfide (OCS), hydrogen cyanide (HCN), and hydrogen sulfide ($H_2S$). The vial 102 (or each vial in an assembly) can be coated on the inside or the outside with an electromagnetically reflective (e.g., electrically conductive) material (e.g., a metal), or the vial 102 (or each vial in an assembly) can be placed in an enclosure that is made of or coated with an electromagnetically reflective material such that exterior walls of the vial adjoin (e.g., are substantially in contact with) the electromagnetically reflective material of the enclosure. As examples, the enclosure can be metal or metal-coated plastic. As examples, metallization of the vial 102 or the enclosure can be done by sputtering, evaporation, or chemical vat deposition. A single vial, or multiple vials assembled in an enclosure, can form a physics cell. Transmitter (TX)

and receiver (RX) antennas 104, 106 are coupled to the glass vial at electromagnetically translucent or substantially transparent windows or vial-end access points to respectively launch into the glass vial or assembly 102 and receive from the glass vial or assembly 102 millimeter-wave electromagnetic radiation that courses through the vial(s) 102.

Circuitry 108 coupled to the antennas 104, 107 provides a closed loop that can sweep the frequency of millimeter-wavelength electromagnetic waves (e.g., between about 20 GHz and about 400 GHz, e.g., between about 70 GHz and about 180 GHz) radiated to the dipolar gas molecules confined in the vials 102. An absorption at the particular frequency of a quantum transition of the dipolar gas molecules can be observed as a decrease in the power transmitted between transmitter and receiver, and specifically, as a dip in transmitted power when viewed as a function of frequency within the swept frequency range (e.g., dip 2000 in FIG. 20). Iteratively locking to the bottom of the dip provides the quantum transition frequency of the molecules of the confined gas, which transition frequency is stable with age of the hermetic vial, temperature, and other environmental factors. The stability permits detector 100 to be used for creating accurate quantum references and clocks, the accuracy of which is not substantially reduced with device age or changes in operating environment. Circuitry 108 can include, for example, a voltage-controlled oscillator (VCO) or a digital controlled oscillator (DCO) to generate millimeter waves at a particular frequency that is adjusted until the frequency matches the reference peak absorption frequency (the frequency location of the transmitted power dip).

Linear dipolar molecules have rotational quantum absorption at regular frequencies. As an example, OCS exhibits a transition approximately every 12.16 GHz. A physics cell as described herein thus can make use of any of the many available quantum transitions in the millimeter-wave frequency range. Circuitry 108 can further include, for example, a divider to divide down the matched frequency, which can be in the tens or hundreds of gigahertz, to a lower output clock frequency, e.g., about 100 MHz. The use of millimeter waves eliminates the need for a laser as a quantum transition interrogation mechanism, reducing cost and complexity of detector 100 over devices requiring lasers. Operation within the aforementioned frequency ranges permits the transmitter and receiver antennas 104, 106 to be of lengths less than about 10 millimeters, e.g., less than about 5 millimeters, e.g., less than about 1 millimeter, depending on the quantum transition frequency of the dipolar gas selected. The glass vial 102 or (or each vial used in an assembly of vials) can, for example, each measure between about 1 centimeter and about 20 centimeters in length, e.g., between about 2 centimeters and about 10 centimeters in length, and can measure less than about 1 centimeter in dimensions of width and height, or diameter for a vial shaped as a circular, elliptical, or rectangular cross-section tube. Because quantum absorption increases with vial length, with longer vial lengths providing for a better-defined observed quantum transition, the length of the vial 102 can be limited by fabrication limitations and system package size limitations. Meandering or serpentine-shaped physics cells can provide longer effective vial length within a more compact system package size either by using a bent (e.g., U-shaped) vial or by coupling together multiple vials.

Figure 2:
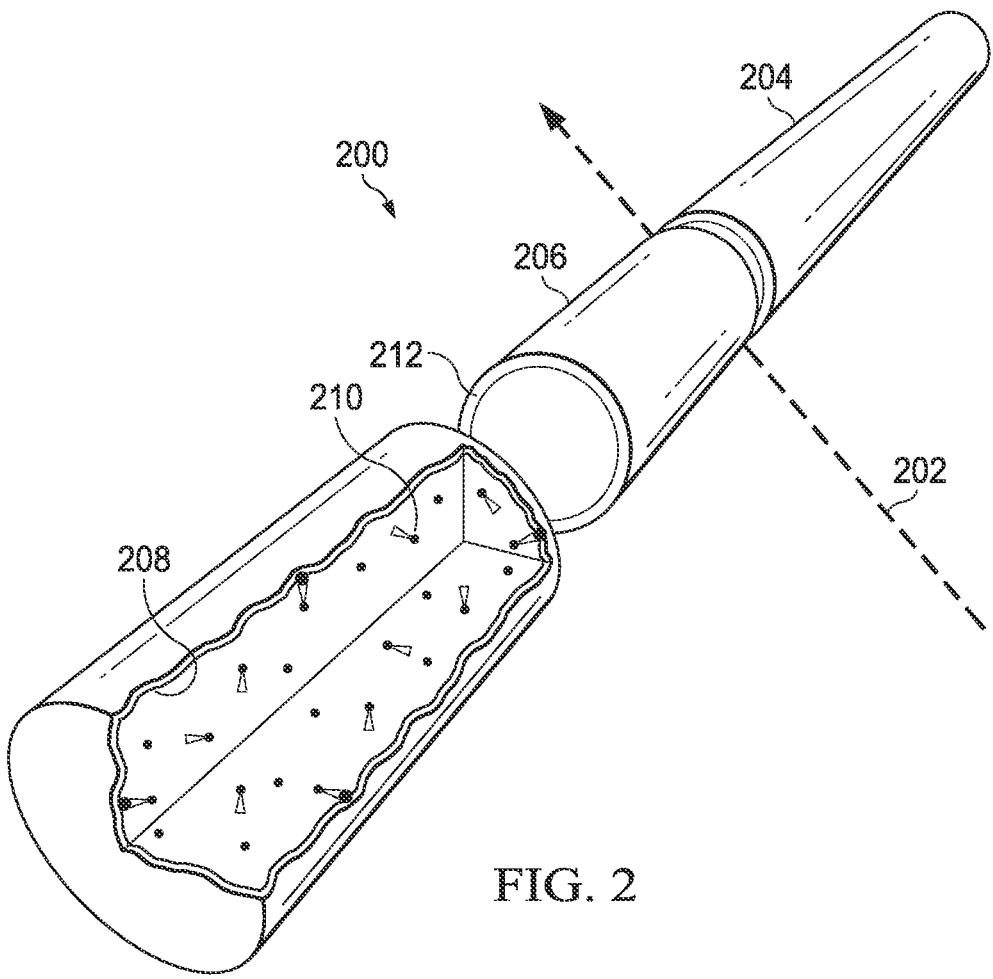
FIG. 2 is a diagram of an example laser cutting and sealing process for sealing gas-filled glass vials.

FIG. 2 is an illustration of an example laser cutting and sealing process 200 for sealing gas-filled glass vials, as may be used in detector 100 of FIG. 1. Prior to the cutting and sealing process 200 illustrated in FIG. 2, a glass (e.g., borosilicate) tube can be fabricated using, as examples, an extrusion process, a Danner process, a Vello process, a down-draw, or any suitable process. The tube may then be filled with a dipolar gas at low pressure to a purity. To achieve a desired gas purity, a successive vacuum approach can be used to purge air from inside the tube and to eliminate molecules coating the walls of the tube by chemisorption or physisorption. A baking process can also be used prior to cutting and sealing process 200 to eliminate molecules that are absorbed to the internal surface of the tube. Process 200 achieves hermeticity by completely sealing each gas-containing glass vial as it is cut from the tube, and preserves gas purity in part by using a laser cutting process that ensures only local heating, so as to avoid denaturing the contained gas.

In the illustrated example 200, a directed laser beam 202 cuts and seals a continuous glass (e.g., borosilicate) tube, which can have been manufactured, e.g., by extrusion, into smaller hermetically sealed glass vials each filled with gas at low pressure. The vials can be circular in cross-section, as illustrated in FIG. 2, or, or in other examples, can be square, rectangular, rounded rectangular, oval, ellipsoid, or other shapes in cross-section. Laser beam 202 is illustrated as separating vial 206 from tube portion 204. Previously in process 200, the laser beam 202 separated vial 208 from a glass tube that included tube portion 204 as well as then not-yet-sealed-and-separated vial 206. Subsequently in process 200, the laser beam 202 can separate tube portion 204 into additional separate sealed dipolar-gas-containing glass vials (not shown). Vial 208 is shown in cut-away in FIG. 2 to show trapped gas molecules 210 inside vial 208. Vial 208 can, for example, be cut from the tube that included tube portion 204 and vial 206 at a thinned portion 212 of the tube. Alternatively, vials can be sealed and cut by locally heating and softening the tube (e.g., using a laser) and then pinching the softened portion of the tube using a mechanical clamp. The same clamp may also cut the vial, or the vial can be cut using a separate tool. Vials cut from the tube in process 200, e.g., vials 208 and 206, can undergo further manufacturing steps, such as exterior metallic coating, and photolithographic etching or laser ablating into the coating of launch and receive windows. In some examples, no metallization of the vials is performed, but instead, each vial is, in a subsequent part of the manufacturing process, placed into an enclosure that is either made of an electromagnetically reflective material (e.g., metal) or is interiorly coated with an electromagnetically reflective material (e.g., metallized) such that when a vial is seated in the enclosure, metal adjoins (e.g., is substantially in contact with) the outside of the glass walls of the vial.

Because the interior of the tube from which each vial is cut is filled with dipolar gas at low pressure, once the glass of the tube melts from the laser energy, the outside pressure compresses and sinks the tube at the point of cutting, which heals sealed subsequent to the removal of the laser beam 202. The laser beam 202 may heat the glass to temperatures of more than 650° C. in the cutting process, which temperatures may be enough to decompose the contained dipolar gas. Such decomposition can be a non-reversible process that can cause loss of the ability to obtain a quantum absorption at the expected frequency. However, the heating is local, and does not propagate more than a few millimeters during the short time that laser energy is applied. Because the contained gas is low-pressure, it is not very thermally conductive. Only a small amount of the gas in the vicinity of the laser cutting can be denatured by the heating incurred by the laser cutting and sealing process. Each vial cut and sealed during the process may be a centimeter long or more, so the majority of the gas inside each vial maintains its chemical integrity during the cutting and sealing process. The thermal insulation of the glass, as well as that of the low-pressure gas itself, protects the bulk of the gas from thermal denaturing.

Figure 3A:
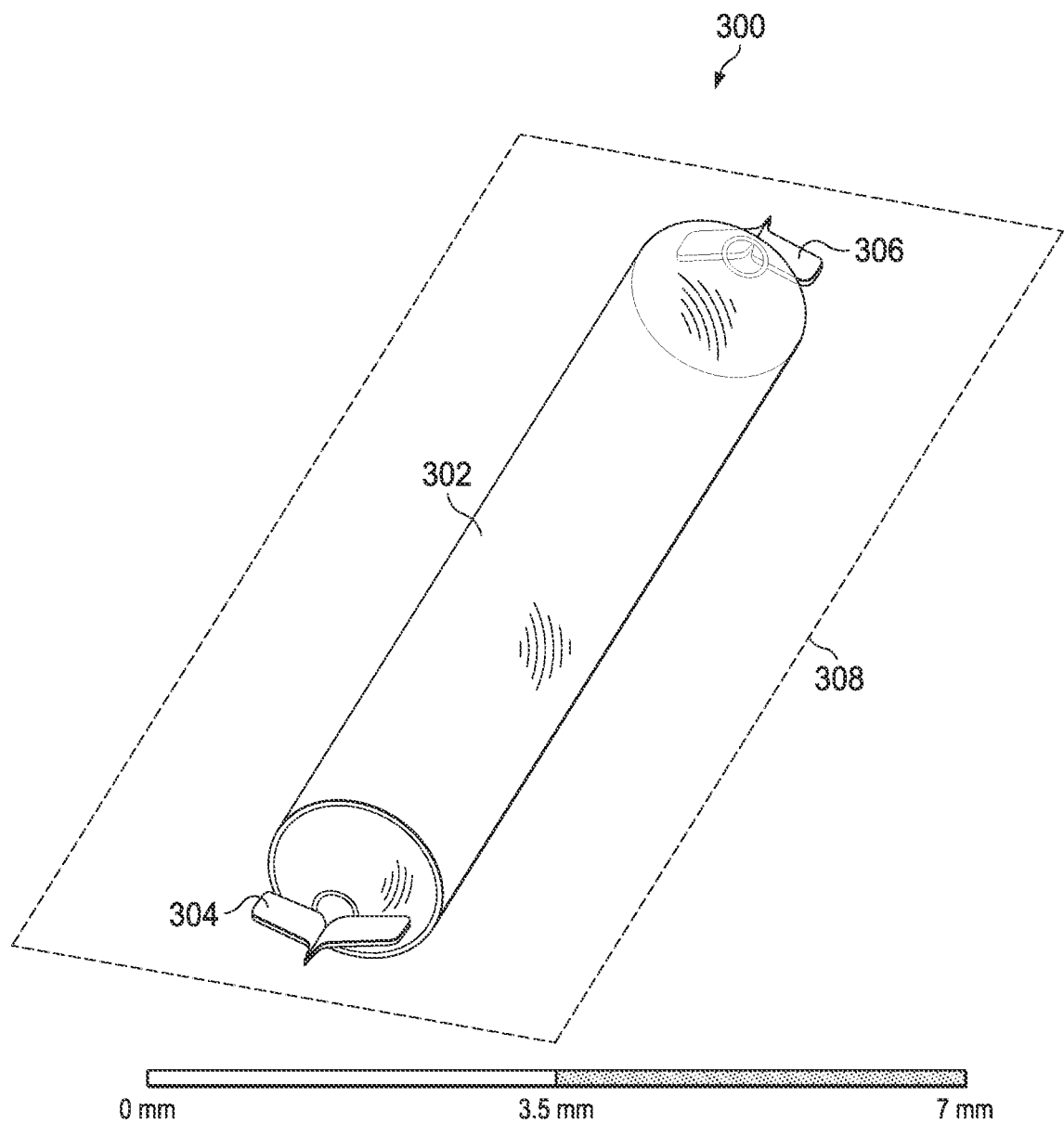
FIGS. 3A and 3B are parallel projection and top-down views of an example sealed glass vial configured with transmit and receive antennas placed for lateral signal launch and receipt.

FIG. 3A is an oblique parallel projection view 300 of an example sealed glass vial 302 configured with transmit and receive antennas 304, 306 (e.g., Vivaldi antennas) coupled to vial 302 at vial-end access points for lateral signal launch and receipt. Each antenna 304, 306 can be centered on a cone-shaped, or pyramid-shaped, or tapering tip of a respective end of the vial 302, the tip working like a horn to guide an electromagnetic signal produced by the transmit antenna 304 into the vial 302 or to guide a received electromagnetic signal out of the vial 302 to be received by the receive antenna 306.

The vial 302 contains a dipolar gas at low pressure. The vial 302 is illustrated as having a circular cross-section with conical ends, but other examples can have cross-sections of other shapes, such as rectangular or ellipsoid. The vial 302 can be interiorly or exteriorly coated with an electromagnetically reflective (e.g., electrically conductive) material (e.g., a metal) to form a waveguide. Because the dipolar gases contemplated for containment in the vial are, in general, chemically reactive, to avoid depletion of the trapped gas over time, a non-reactive metal such as gold (Au), silver (Ag), platinum (Pt), palladium (Pd), ruthenium (Ru), rhodium (Rh), osmium (Os), or iridium (Ir) is useful if the vial is interiorly coated. However, because the walls of the glass vial may be made so thin as to make electromagnetic absorption within the glass walls negligible, the use of a glass vial permits for the vial 302 to be exteriorly coated with an electromagnetically reflective material, or for the vial to be placed in an enclosure that is made of or coated with an electromagnetically reflective material. In such case, a substantially less expensive reactive metal is useful for the coating. Suitable reactive metals include copper (Cu), aluminum (Al), chromium (Cr), and titanium (Ti). In the illustrated example of FIGS. 3A and 3B, either the ends of the vial are left unmetallized, or the metal coating can be removed from the conical or tapered ends of the vial subsequent to the coating, to provide vial-end access points that are translucent or substantially transparent to the electromagnetic waves used to interrogate the confined gas.

Within a certain dimension of the wavelength and the dielectric constant of the glass material of the vial 302, the vial 302 exhibits a mono-mode of electromagnetic propagation. For example, detector 100 can be configured to use the first mono-mode of the waveguide (e.g., $TE_{10}$ for a rectangular or circular waveguide).

Figure 3B:
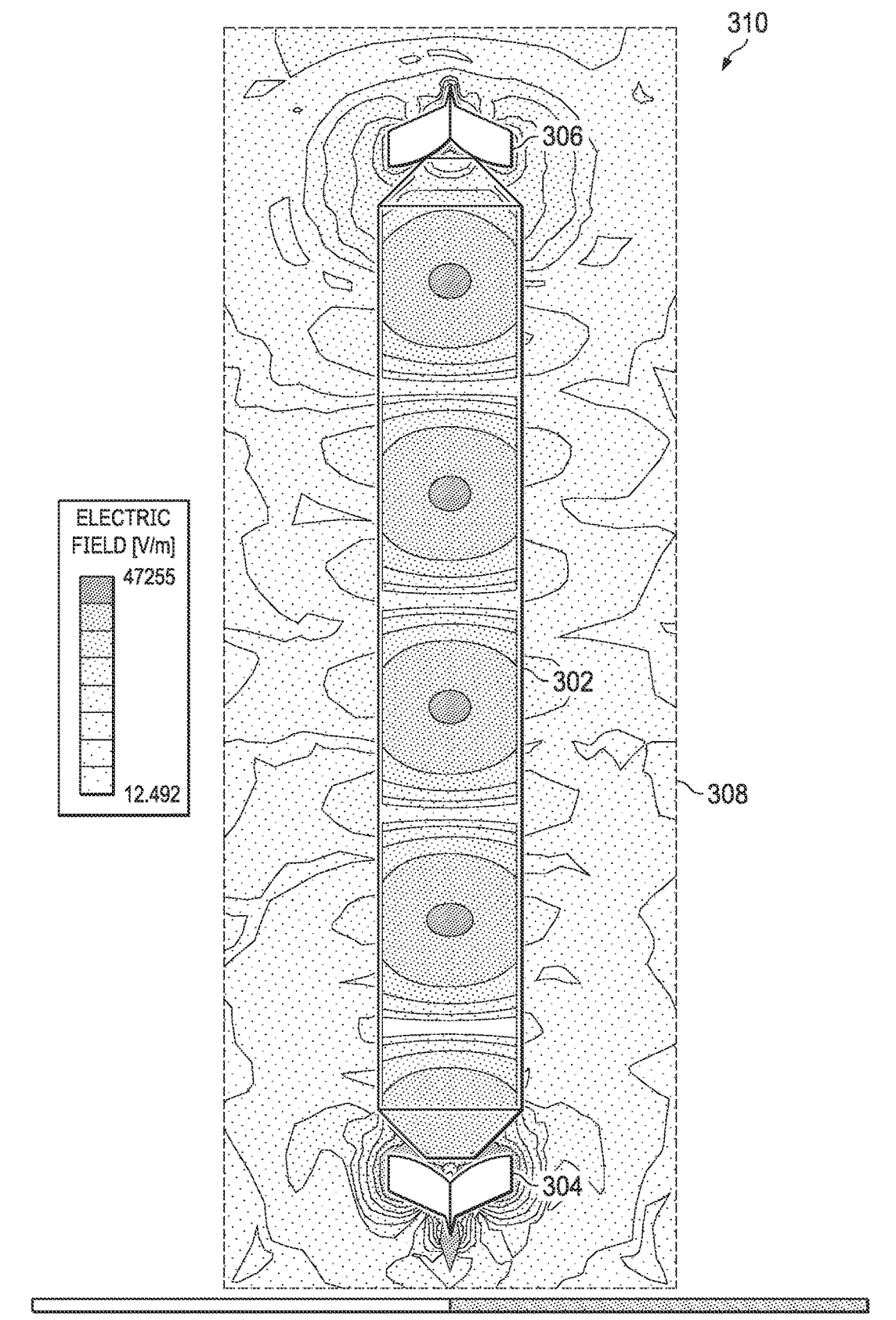

FIG. 3B provides a longitudinal section view 310 of the vial 302 through longitudinal plane 308, showing the electric field in volts per meter under the condition of propagation of electromagnetic waves at a given transition frequency from transmit antenna 304 to receive antenna 306. In the example illustrated in FIGS. 3A and 3B, antennas 304, 306 provide launch and reception longitudinal to the vial 502 through unmetallized vial-end access points. In other examples, such as those illustrated in FIGS. 6A, 7A, 11A, 11B, 12A, 12B, 14A, 14B, 15A, and 15B, an electromagnetically translucent or substantially transparent window can be provided in a top, bottom, or side of the vial.

An advantage of the example configuration shown in FIGS. 3A and 3B is that the antennas 304, 306 consist of metal flats that are on a single plane, which plane can be the plane of a printed circuit board (PCB) on which electronic circuitry, e.g., circuitry 108 in detector 100 of FIG. 1, can also be mounted. The antennas 304, 306 can therefore be printed on the PCB, or on respective PCBs located at each end of vial 302, and electrically coupled to the circuitry via wiring printed on the PCB. The millimeter electromagnetic waves used to interrogate the dipolar gas contained by the vial 302 can therefore be launched directly from the edge of a PCB to which the vial 302 is coupled. In other examples, the antennas can be placed in the substrate of a microelectronic package mounted on a PCB. In such examples, the vial can be individually mounted on the same PCB to which the microelectronic package containing the antennas is mounted, in a manner such that the vial's alignment with the antennas is maintained. The antennas 304, 306 can, as examples, be Vivaldi antennas, patch antennas, dipole antennas, or bow antennas, provided that they can be configured to excite the desired electromagnetic propagation mode in the vial 302.

Figures 4A, 4B:
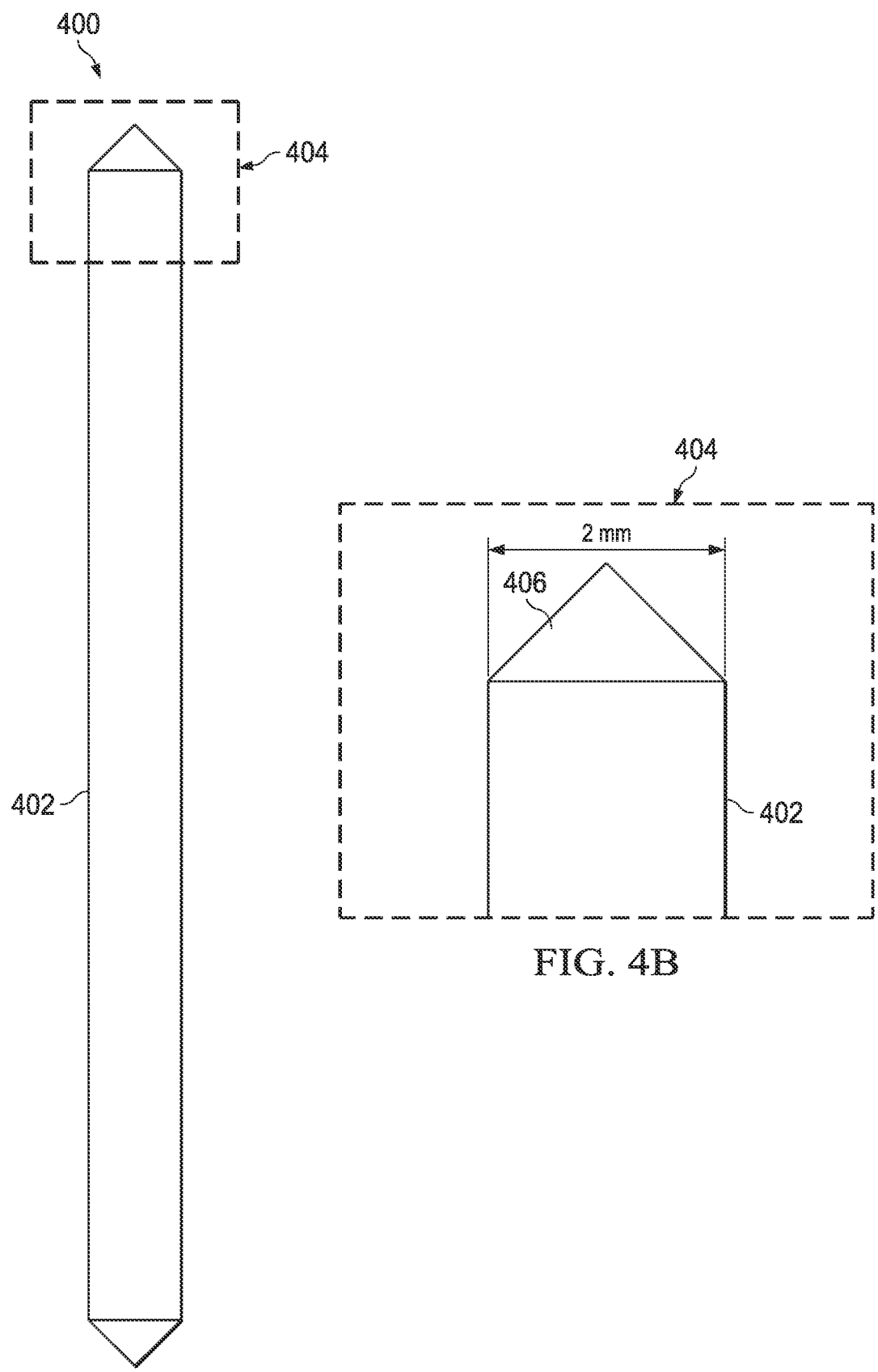
FIGS. 4A and 4B are top-down views of an example vial with conical, pyramidal, or tapered ends.

FIG. 4A is a top-down view 400 of an example vial 402 with conical, pyramidal, or tapered ends 406. The ends 406 can be partially or totally unmetallized to provide vial-end access points that are translucent or substantially transparent to electromagnetic waves and that allow electromagnetic waves to be launched into or received from the vial 402. FIG. 4B provides a zoomed-in view of one end portion 404 of the vial 402 in FIG. 4A. In the illustrated example, vial 402 may be of any shape cross-section, including rectangular, circular, or ellipsoid. As shown in FIG. 4B, the illustrated example vial is 2 mm in width.

Figure 5A:
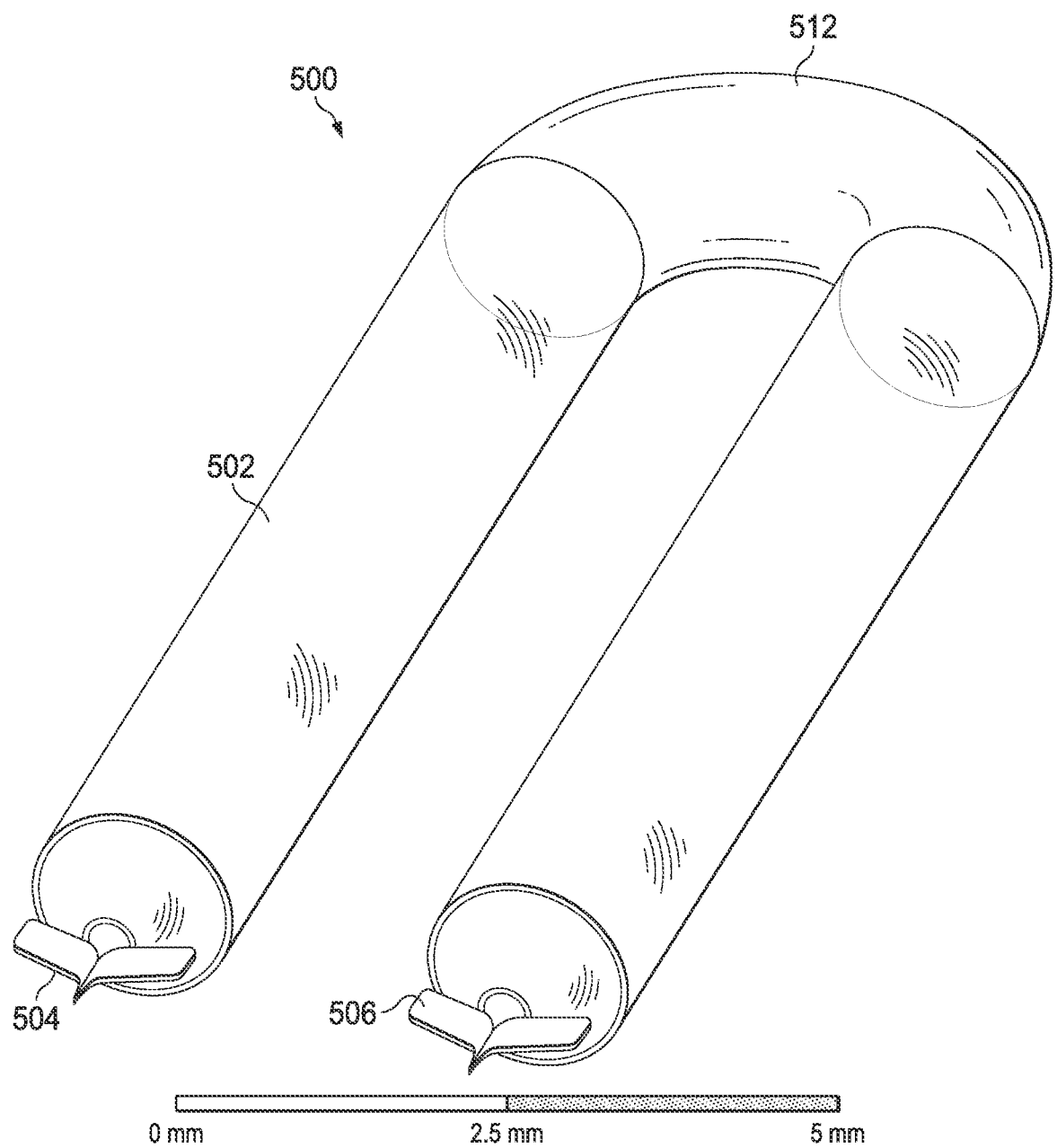
FIGS. 5A and 5B are parallel projection and top-down views of an example U-shaped sealed glass vial configured with transmit and receive antennas placed for lateral signal launch and receipt.
Figure 5B:
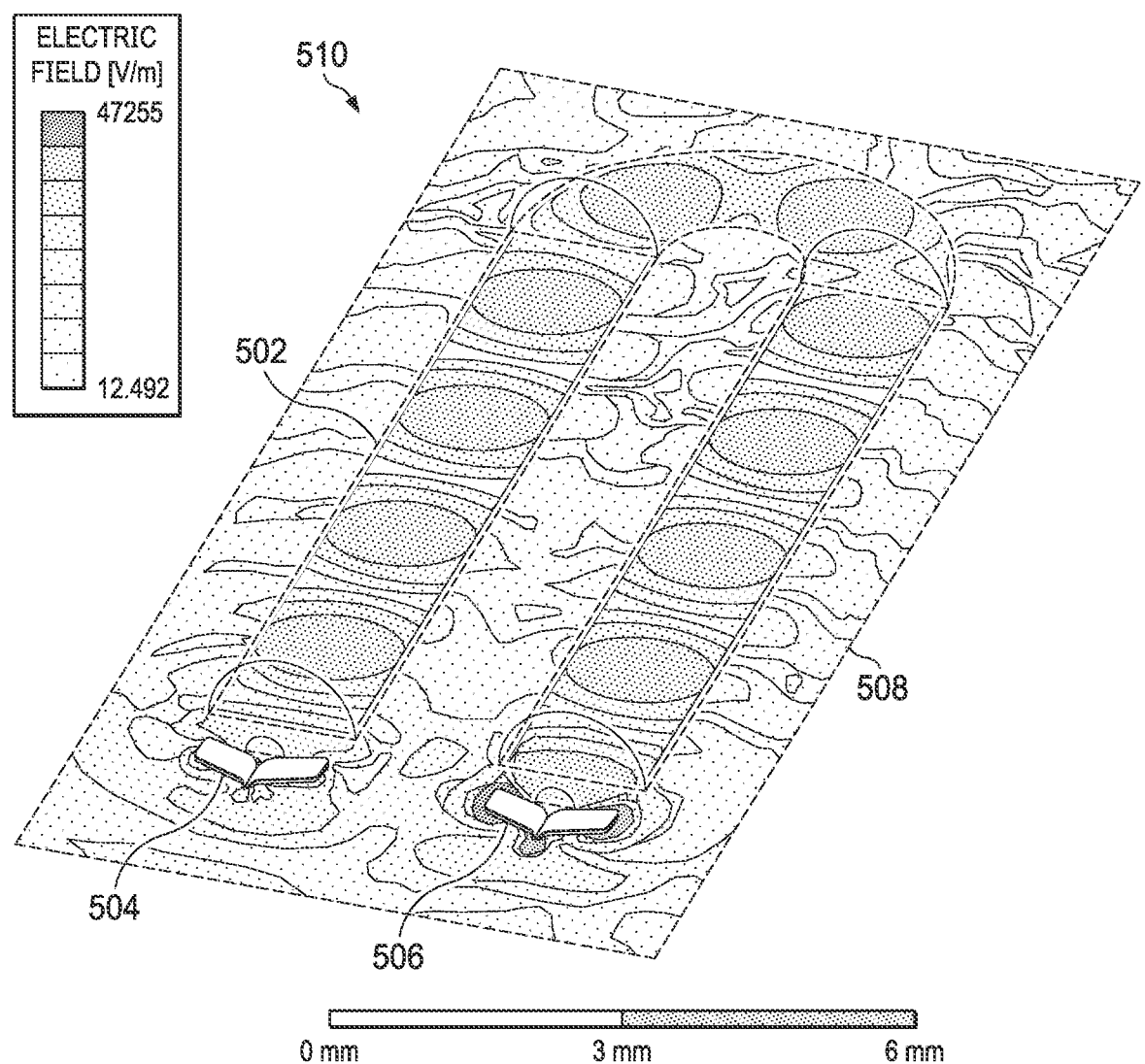

FIG. 5A is an oblique parallel projection view 500 of an example sealed glass vial 502 configured with transmit and receive antennas 504, 506 (e.g., Vivaldi antennas) coupled to vial 502 at vial-end access points for lateral signal launch and receipt. In contrast to the straight vial 302 of FIG. 3A, vial 502 of FIG. 5A has a U-shaped bend 512, e.g., at about the midpoint of the vial 502, that permits the transmit and receive antennas 504, 506 to be placed side-by-side, which conveniently and cost-effectively allows both antennas 504, 506 to be fabricated on or attached to the same substrate. The substrate with the antennas 504, 506 can thus be coupled to the vial 502 at only one side of the vial 502, as opposed to two opposite ends of the vial 502. Although only a one-bend example 500 is illustrated, other examples can have multiple bends of the vial, permitting, for example, for a serpentine vial that provides a long length within a compact volume. As in the above-described examples, the vial 502 contains a dipolar gas at low pressure, and can be interiorly or exteriorly coated with an electromagnetically reflective (e.g., electrically conductive) material (e.g., a metal) to form a waveguide. In the example of FIGS. 5A and 5B, antennas 504, 506 are coupled to the vial 502 at unmetallized vial-end access points that are translucent or substantially transparent to electromagnetic waves. The U-shaped vial 502 can be dimensioned to provide a mono-mode of electromagnetic propagation at a quantum transition frequency of the contained dipolar gas.

FIG. 5B provides a longitudinal section view 510 of the vial 502 through longitudinal plane 508, showing the electric field in volts per meter under the condition of propagation of electromagnetic waves at a given transition frequency from transmit antenna 504 to receive antenna 506. In the example illustrated in FIGS. 5A and 5B, antennas 504, 506 provide launch and reception longitudinal to the vial 502.

Figure 6A:
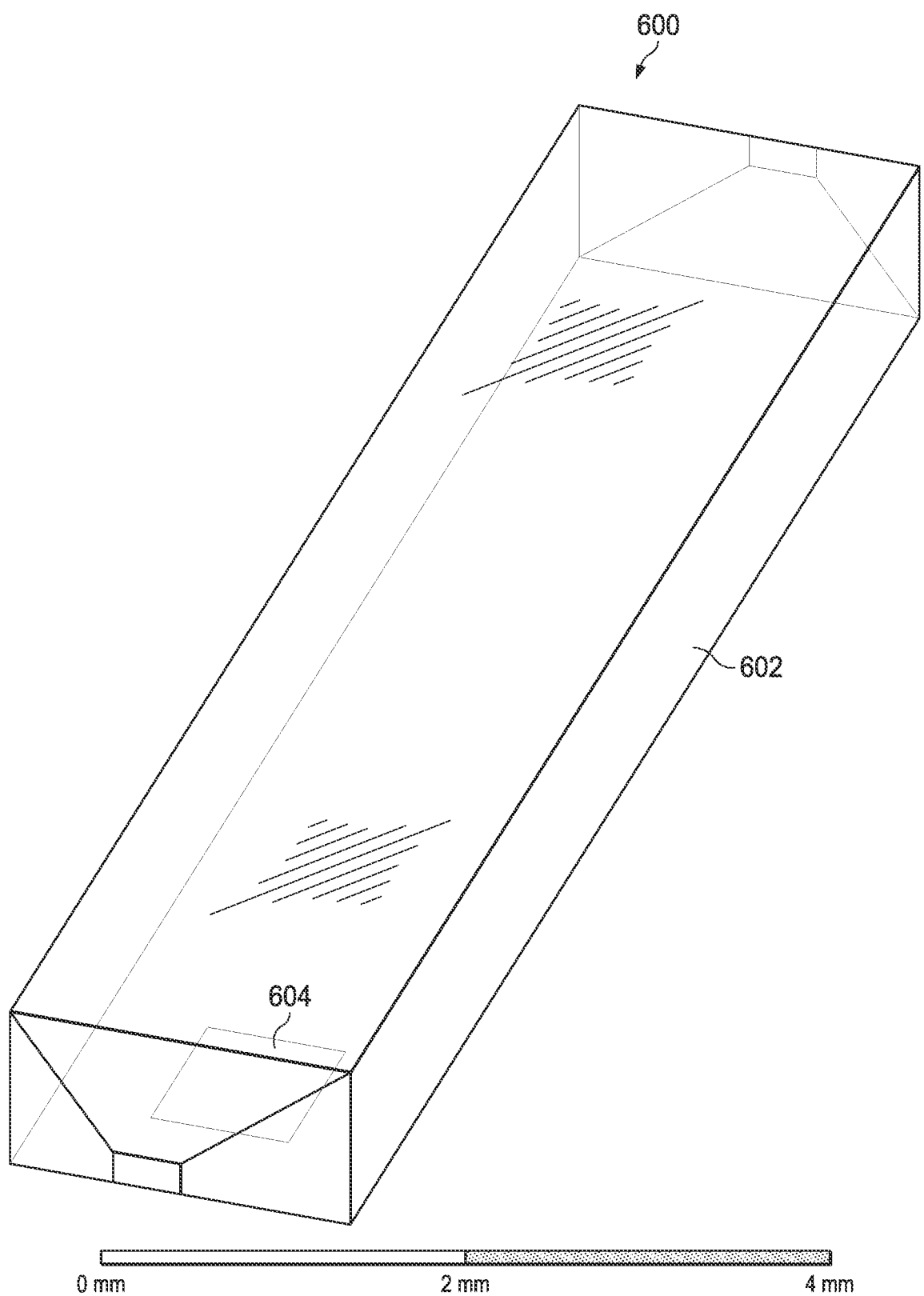
FIGS. 6A and 6B are parallel projection views of an example rectangular cross-section glass vial configured with a window for under-side signal launch and receipt.

FIG. 6A is an oblique parallel projection view 600 of an example sealed glass vial 602 configured with transmit and receive antennas (not shown) placed underneath the vial near launch/receipt windows (e.g., window 604) for underside signal launch and receipt. In contrast to vials 302 and 502, vial 602 does not use unmetallized vial-end access points to introduce electromagnetic waves to the inside of the vial 602. The vial 602 contains a dipolar gas at low pressure. The vial 602 can be interiorly or exteriorly coated with an electrically conductive material (e.g., a metal) to form a waveguide. In examples of vials having windows for the launch and receipt of the electromagnetic waves used for interrogation of the contained gas, the metal coating can cover the glass except for at two portions, e.g., rectangles each of certain dimensions, placed with certain spacing from the edges of the vial. Transmit and receive antennas can, in examples of vials having windows, be placed above, below, or to the side of the vial, next to respective windows, or to a single window. The vial 602 exhibits a mono-mode of electromagnetic propagation. The example vial 602 has a rectangular cross-section and only a single window 602 through which electromagnetic signals are both launched and received. In other examples, however, the vial can have cross-sections of other shapes, and/or can have windows near both ends of the vial, as opposed to just one.

Figure 6B:
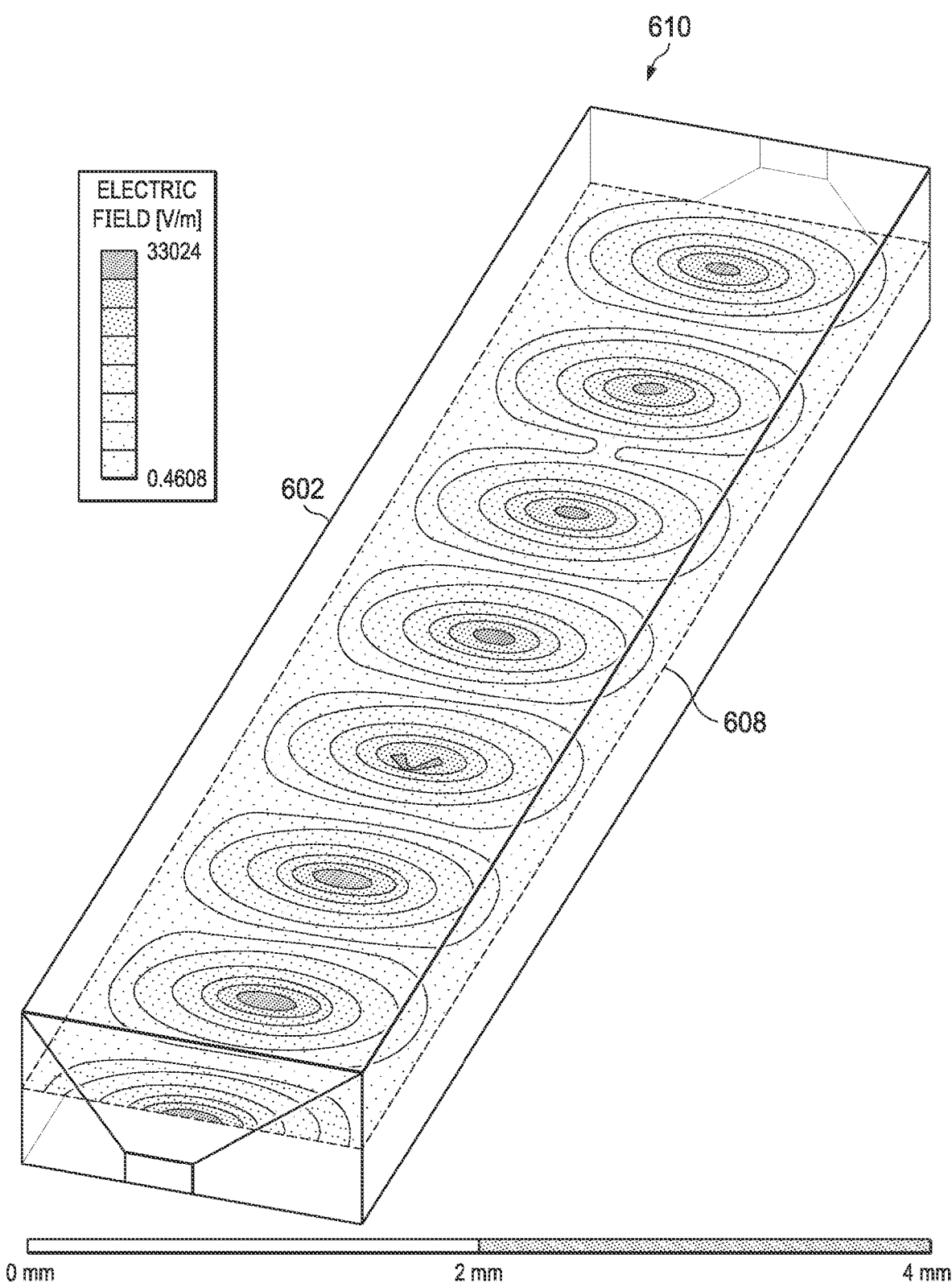

FIG. 6B provides a longitudinal section view 610 of the vial 602 through longitudinal plane 608, showing the electric field in volts per meter under the condition of propagation of electromagnetic waves at a given transition frequency from a transmit antenna (not shown) to a receive antenna (not shown). In the example illustrated in FIGS. 6A and 6B, electromagnetic signals are launched and received at the underside of the vial 602, but in other examples, the launch window(s) could be placed at the top or either side of the vial.

Figures 7A, 7B:
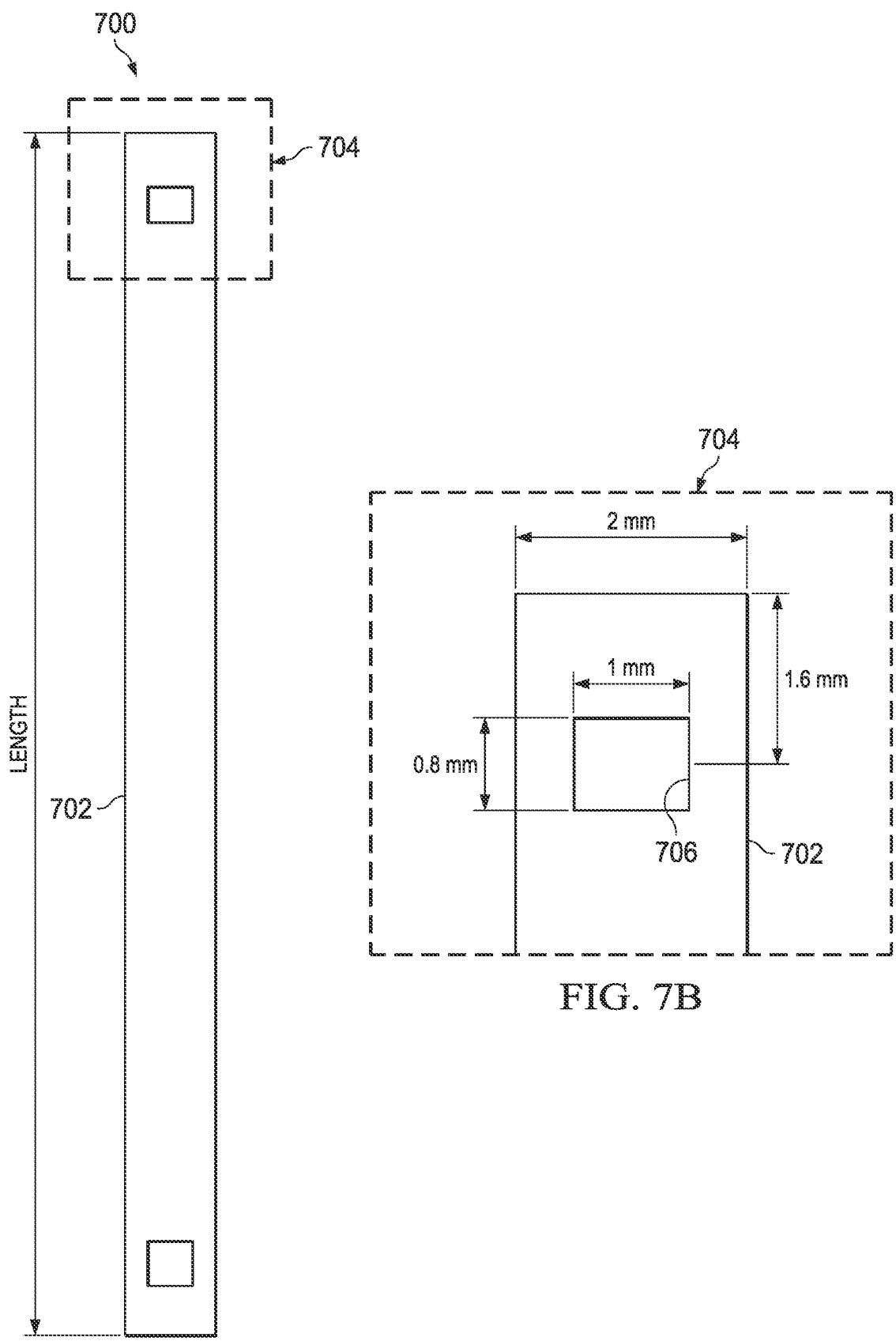
FIGS. 7A and 7B are top-down views of an example vial with a rectangular launch window near each end of the vial.

FIG. 7A is a top-down view 700 of an example vial 702 with a rectangular launch window (e.g., window 706) near each end of the vial 702. FIG. 7B provides a view of one end portion 704 of the vial 702 in FIG. 7A. In the illustrated example, vial 702 may be of any shape cross-section, including rectangular, circular, or ellipsoid. As shown in FIG. 7B, the illustrated example vial is 2 mm in width, and has a launch window placed about 1.6 mm from one end of the vial 702, the launch window having dimensions of about 1 mm width by about 0.8 mm length.

As illustrated in FIGS. 8 through 10B, the glass vials used for containing the electromagnetically interrogated dipolar gas can be manufactured to have either blunt or tapered ends. Depending on how the laser beam cuts and whether mechanical clamping is employed, versus using only an exterior-interior pressure differential to collapse the tube, different cutting and sealing techniques allow for making a cone or a flat top. Cutting and sealing techniques can create a protrusion of the glass at the end, or can create a flat end with a ridged surface. Vials to be coupled to a Vivaldi antenna for lateral signal launch or receipt can be made to have a protruding conical, pyramidal, or tapered end to which the Vivaldi antenna can be coupled. Vials to be coupled to an antenna for side signal launch or receipt through a window can be made to have a blunt or flat end for improved wave propagation.

Figure 8:
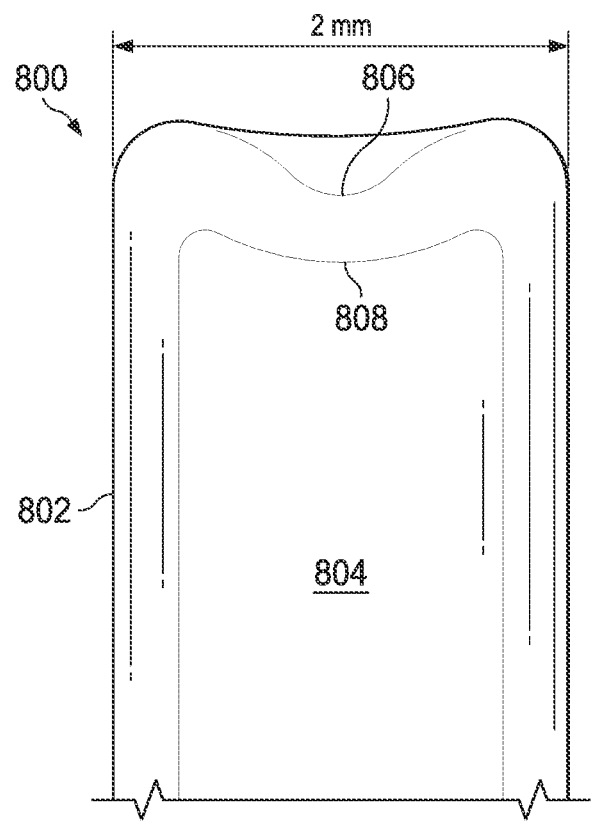
FIG. 8 is a cross-sectional top-down view of one end of an example vial.

FIG. 8 is a view 800 of one end of an example 2 mm wide vial 802 after having been cut and sealed using a laser cutting and sealing method to confine a dipolar gas at the interior 804 of the vial 802. The illustrated end of the vial 800 is blunt or flat. The vial end has an outer surface 806 and a concave inner surface 808.

Figures 9A, 9B:
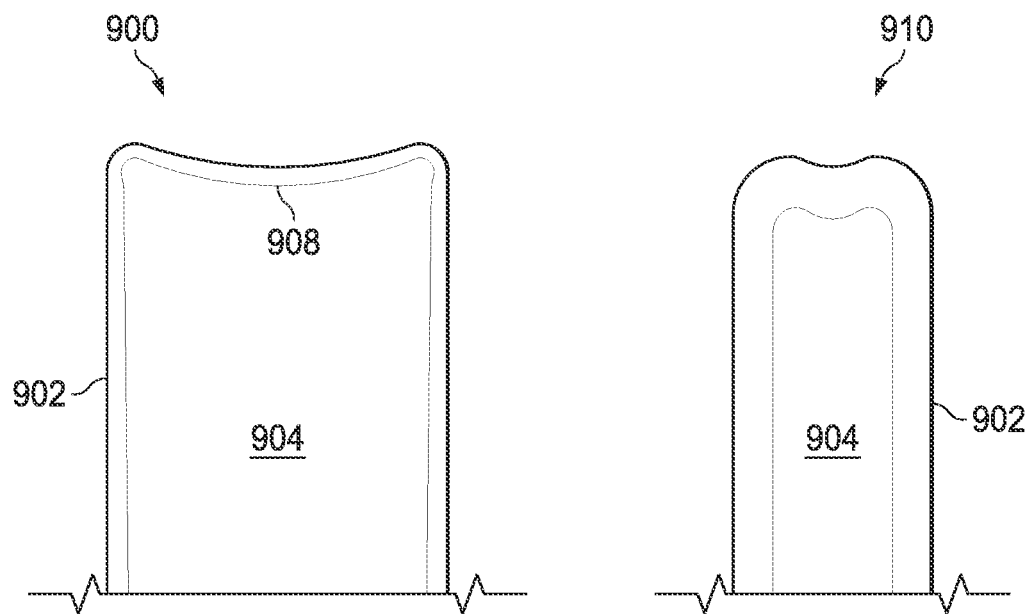
FIGS. 9A and 9B are cross-sectional top-down and side views of one end of an example vial with blunt ends.

FIGS. 9A and 9B are views 900, 910 of one end of an example 2 mm wide vial 902 after having been cut and sealed using a laser cutting and sealing method to confine a dipolar gas at the interior 904 of the vial 902. The illustrated end of the vial 900 is blunt or flat. As shown especially in the top-down view 900 of FIG. 9A, the vial end has a concave inner surface 908. FIG. 9B shows a side view of the same end of the vial 902.

Figure 10A:
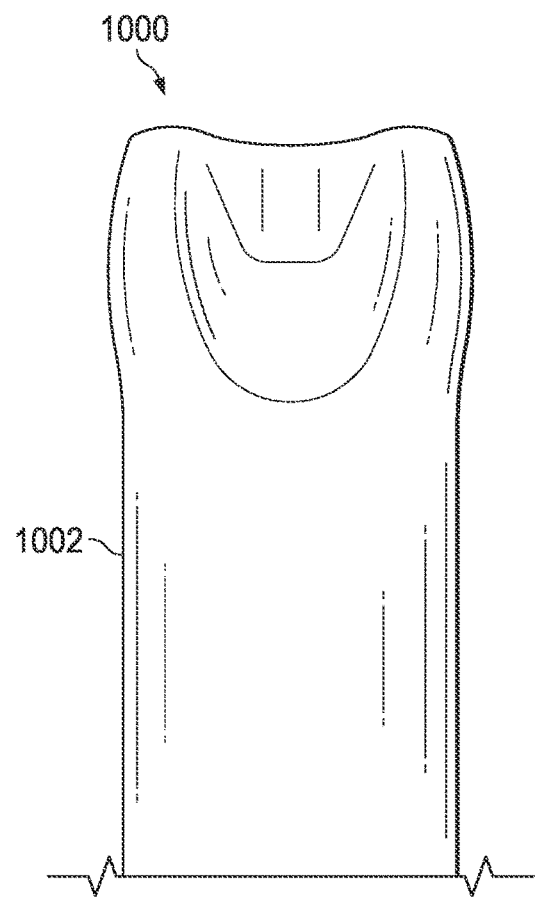
FIGS. 10A and 10B are top-down and side views of one end of an example vial with tapered ends.
Figure 10B:
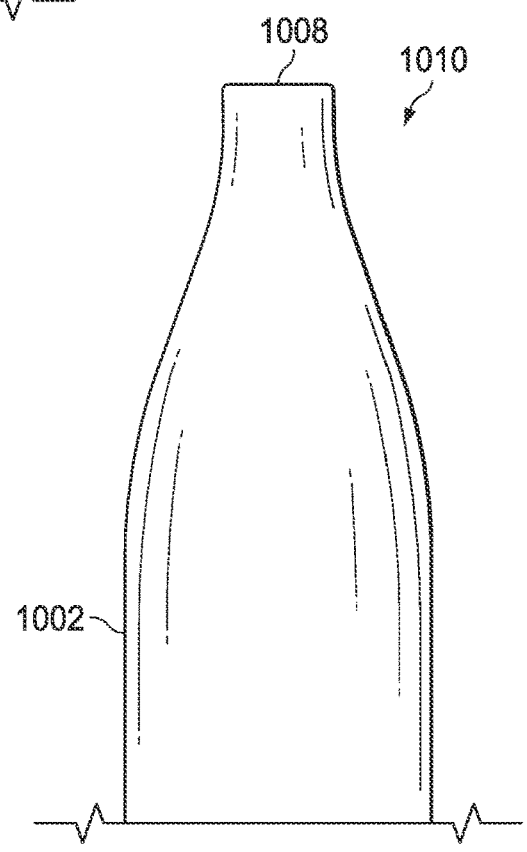

FIGS. 10A and 10B are views 1000, 1010 of one end of an example 2 mm wide vial 1002 after having been cut and sealed using a laser cutting and sealing method to confine a dipolar gas inside of the vial 1002. In contrast to the cutting and sealing method used to cut and seal vial 902 shown in FIGS. 9A and 9B, and as shown particularly in the side view of FIG. 10B, vial 1002 has been cut with a process that provides a tapered end 1008, e.g., by including a mechanical clamping or pinching during the laser cutting process. FIG. 10A shows a top-down view of the same end of the vial 1002.

Figure 11A:
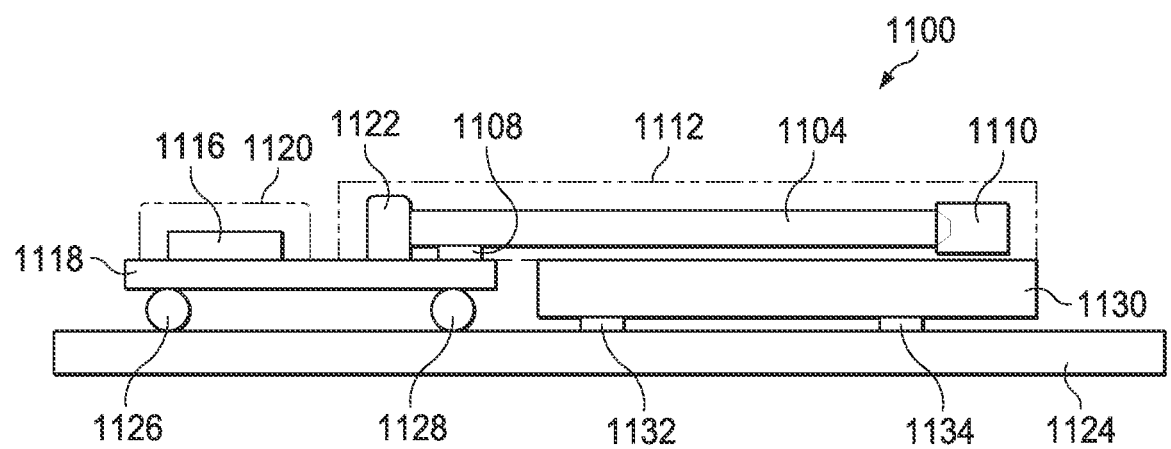
FIGS. 11A and 11B are side and top-down views of an example quantum transition frequency detector system incorporating two glass vials coupled by a U-shaped waveguide, the vials having windows for under-side signal launch and receipt.
Figure 11B:
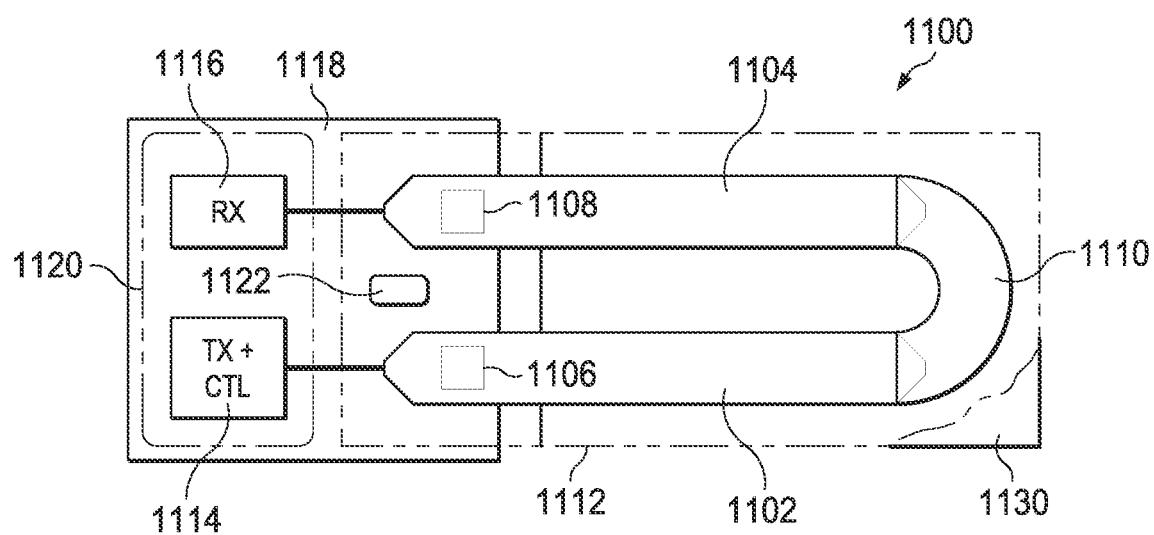

FIGS. 11A and 11B show system-level side and top-down views, respectively, of an example quantum transition frequency detector system 1100 (e.g., configured as a clock) that incorporates two dipolar gas confining glass vials 1102, 1104 configured with respective rectangular windows at the locations of millimeter wave antennas 1106, 1108 for underside signal launch and receipt. Vials 1102, 1104 are illustrated as being rectangular in cross-section, but can be of any shape. Rather than using a U-shaped single vial as shown in FIG. 5A, the system 1100 shown in FIGS. 11A and 11B couples the two separately sealed vials 1102, 1104 via a U-shaped cavity 1110 configured as a waveguide. The waveguide can be constructed, for example, by interiorly coating all or only the U-shaped cavity 1110 of a vial enclosure 1112 with an electromagnetically reflective (e.g., electrically conductive) material (e.g., a metal). The vial enclosure 1112 can be made, for example, of a molded plastic. The vial enclosure 1112 securely seats the two hermetically sealed vials 1102, 1104. In examples in which the entirety of the interior of the vial enclosure 1112 is so coated (e.g., metalized), then the vials 1102, 1104 themselves can be left uncoated. In examples where only the U-shaped cavity 1110 is so coated, the vials 1102, 1104 could be interiorly or exteriorly coated (e.g., metalized), with an end portion of each vial 1102, 1104 left uncoated, or having had the coating etched away, to permit electromagnetic communicativity with the U-shaped cavity 1110 of the waveguide. In either case, during operation of the system 1100, electromagnetic signals are funneled from the first vial 1102 through the U-shaped cavity 1110 and into the second vial 1104. No substantial absorption of the electromagnetic signals occurs in the U-shaped cavity 1110, the function of which is simply to redirect the signal from the first vial 1102 to the second vial 1104.

The coupling of the two independently sealed vials 1102, 1104 in system 1100 by the U-shaped cavity 1110 configured as a waveguide permits coupling of the two straight vials 1102, 1104 to board-mounted processing circuitry 1114, 1116 at only a single end of the vials. Avoiding a need to connect at opposite ends of a single vial, and avoiding the need to create a single U-shaped vial, can reduce system fabrication complexity and system cost. Transmitter antenna 1106 can be electrically coupled to transmitter and control circuitry 1114. Receiver antenna 1108 can be electrically coupled to receiver circuitry 1116. Transmitter and receiver circuitry 1114, 1116 can be fabricated on respective individual integrated circuit (IC) semiconductor chips as or as a single transceiver/control chip (not shown). Circuitry 1114, 1116 can be mounted on and electrically coupled to an electronics board 1118, e.g., a PCB. The board 1118 can, for example, measure about 5 mm by 5 mm in length and width (the dimensions shown in the top-down view of FIG. 11B). The board 1118 can further include wiring to electrically couple the circuitry 1114, 1116 to antennas 1106, 1108. Circuitry 1114, 1116 can be encapsulated over the board 1118 with a molded enclosure 1120. The vial enclosure 1112 can be mounted to the board by pin or screw (or other securing device) 1122, or can be glued thereon.

As shown in FIG. 11A, the quantum transition frequency detector system 1100 can be mounted to a larger system board 1124 belonging to a larger system. For example, larger system board 1124 (omitted from FIG. 11B) can be a motherboard of a computer system or main system board of a mobile device, such as a smartphone. Electronics board 1118 can be electrically and mechanically coupled to the larger system board 1124 by bump bonds, for example, such as bump bonds 1126, 1128, through which output signals can be provided from the quantum transition frequency detector system 1100 to the larger system, and/or input signals can be provided to the quantum transition frequency detector system 1100 from the larger system. Bump bonds can be provided, for example, using a ball grid array (BGA) package. Other types of package technology can also be used, such as a land grid array (LGA) package. The vials 1102, 1104 in their vial enclosure 1112 can likewise be secured to the larger system board 1124 via an enclosure mounting block 1130 that is coupled to the larger system board 1124 with mounting feet 1132, 1134. Mounting block 1130 can be a singular piece with the enclosure 1112 or can be fabricated separately from the enclosure 1112 and secured (e.g., glued) to it.

An advantage of the example configuration shown in FIGS. 11A and 11B is that the antennas 1106, 1108 can consist of metal flats that are on a single plane, which plane can be the plane of electronics board 1118 on which electronic circuitry 1114, 1116 is mounted. The antennas 1106, 1108 can therefore be printed on the single electronics board 1118 and electrically coupled to the circuitry 1114, 1116 via wiring printed on the electronics board 1118. The millimeter electromagnetic waves used to interrogate the dipolar gas contained by the vials 1102, 1104 can therefore be launched directly from the electronics board 1118 to which the vials 1102, 1104 are coupled.

Figure 12A:
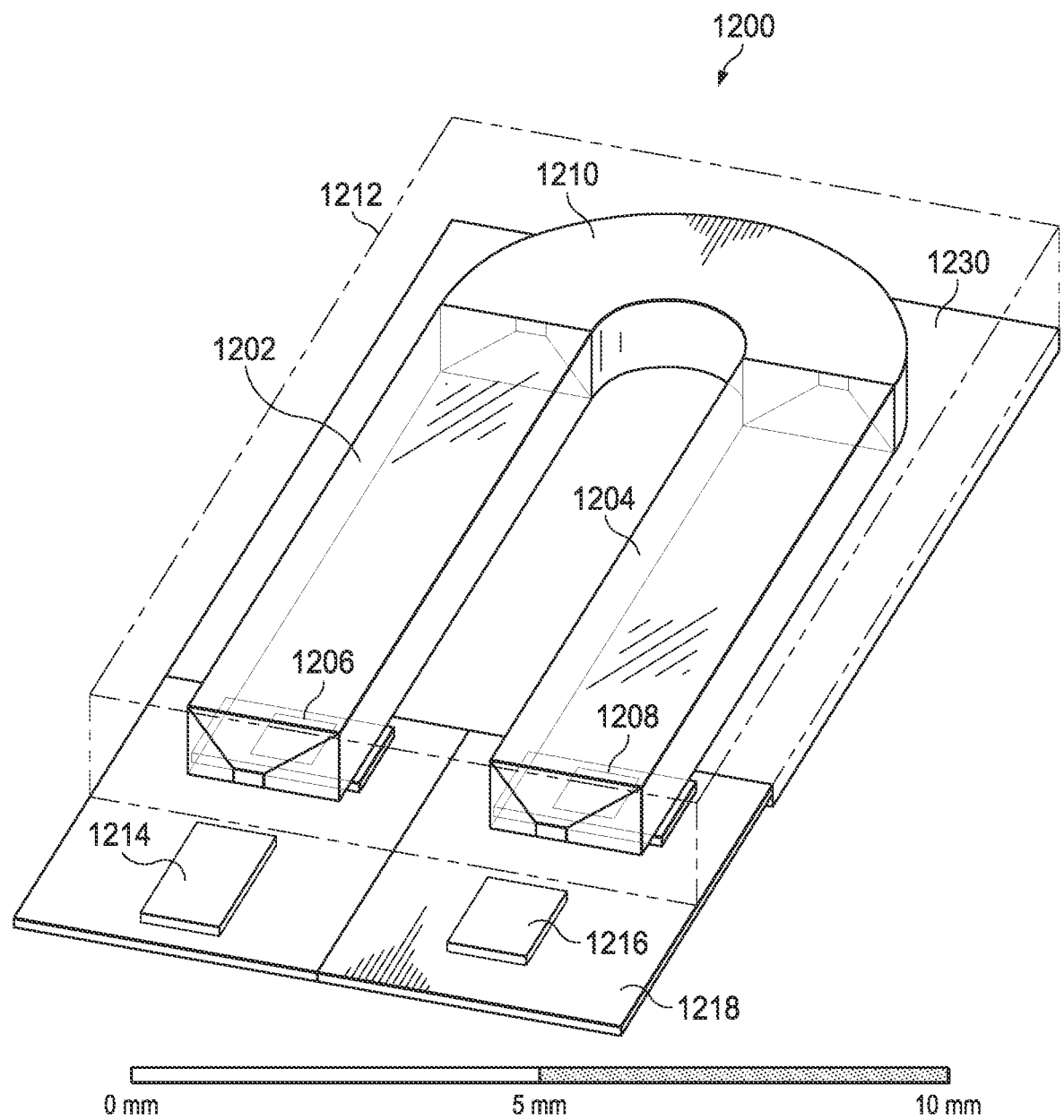
FIGS. 12A, 12B and 12C are parallel projection and side views of an example quantum transition frequency detector system incorporating two glass vials coupled by a U-shaped waveguide, the vials having windows for under-side signal launch and receipt.

FIG. 12A is an oblique parallel projection view 1200 of an example quantum transition frequency detector system 1200 (e.g., configured as a clock), similar in material respects to system 1100, that incorporates two dipolar gas confining glass vials 1202, 1204 configured with respective rectangular windows at the locations of millimeter wave antennas 1206, 1208 for under-side signal launch and receipt. U-shaped cavity 1210 in vial enclosure 1212 is configured as a waveguide, e.g., with interior coating of electromagnetically reflective material. Vials 1202, 1204 are illustrated as being rectangular in cross-section, but can be of any shape. Transmitter antenna 1206 is electrically coupled to transmitter and control circuitry 1214. Receiver antenna 1208 is electrically coupled to receiver circuitry 1216. Transmitter and receiver circuitry 1214, 1216 are mounted on and electrically coupled to electronics board 1218 that can further include wiring to electrically couple the circuitry 1214, 1216 to antennas 1206, 1208. The molded enclosure 1212 can include or can be mounted to block 1230.

Figure 12B:
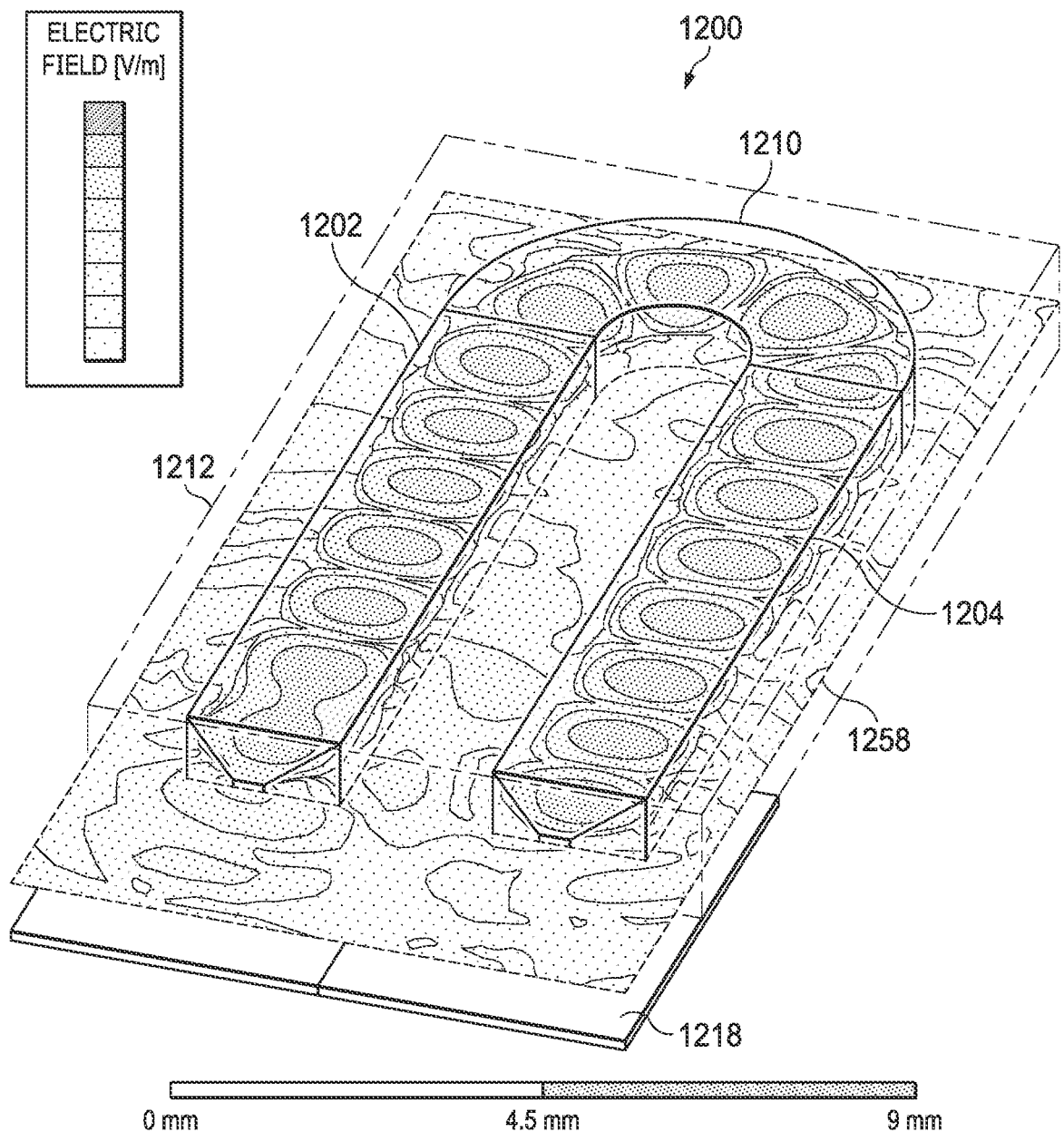

FIG. 12B provides a longitudinal section view of the system 1200 through longitudinal plane 1258, showing the electric field in volts per meter under the condition of propagation of electromagnetic waves at a given transition frequency from transmit antenna 1206 to receive antenna 1208 (antennas not shown in FIG. 12B).

Figure 12C:
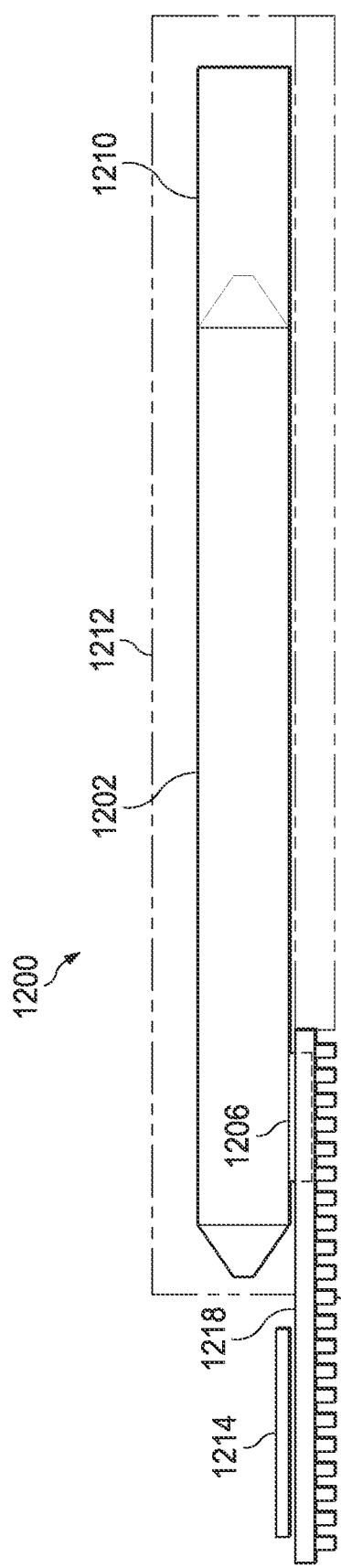

FIG. 12C provides a side view of the system 1200. The side view of FIG. 12C shows that board 1218 can be provided with a number of pins or other electrical connections 1272 for input and output.

Figure 13:
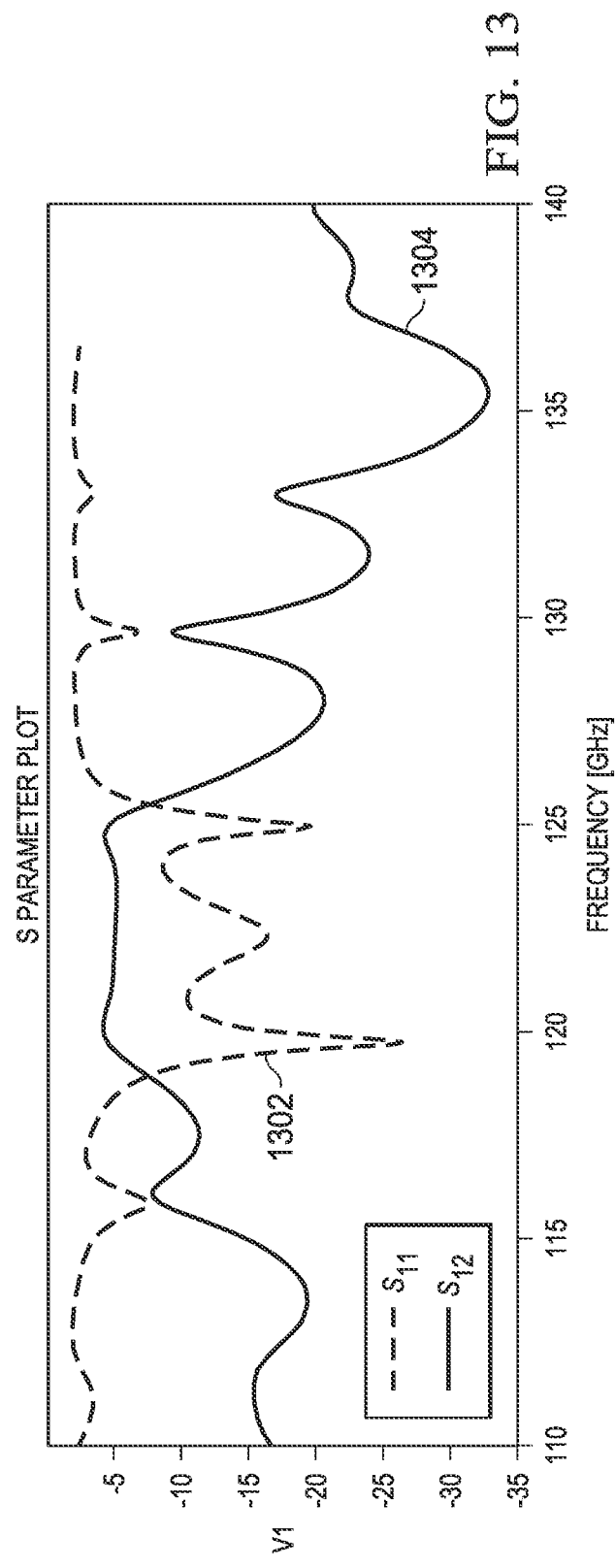
FIG. 13 is an S-parameter graph showing the power reflected at the transmitter and power transmitted between the transmitter and the receiver for the system of FIGS. 12A-12C.

FIG. 13 is a scattering parameter (S-parameter) graph showing the power reflected ($S_{11}$) 1302 at the transmitter and power transmitted ($S_{12}$) 1304 between the transmitter and the receiver for the system 1200 of FIGS. 12A-12C over a frequency range between 110 GHz and 140 GHz. Transmitted power 1304 is particularly high in the frequency range of about 120 GHz to about 125 GHz.

Figure 14A:
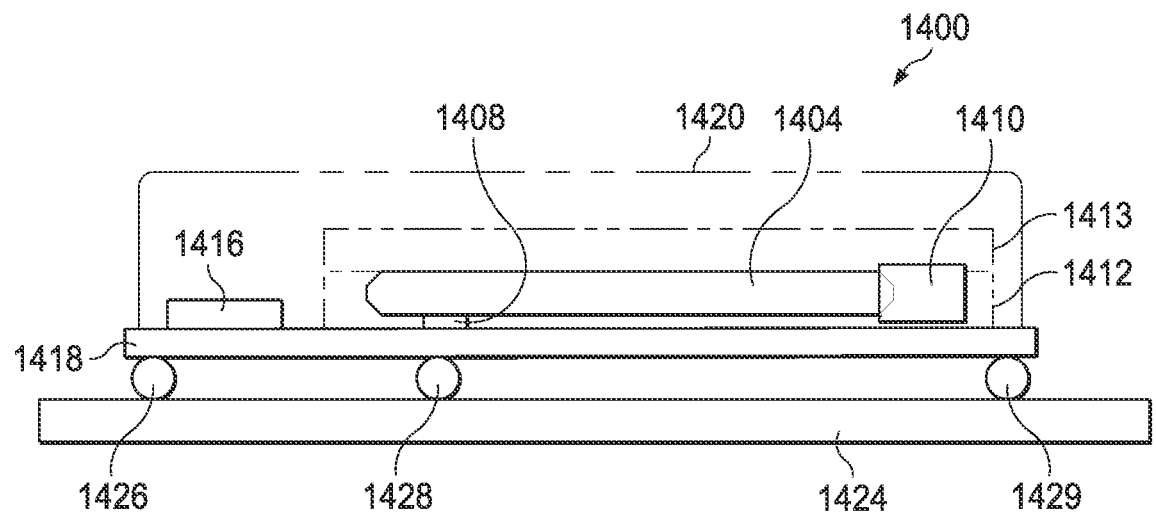
FIGS. 14A and 14B are side and top-down views of an example quantum transition frequency detector system incorporating two glass vials coupled by a U-shaped waveguide, the vials having windows for under-side signal launch and receipt.
Figure 14B:
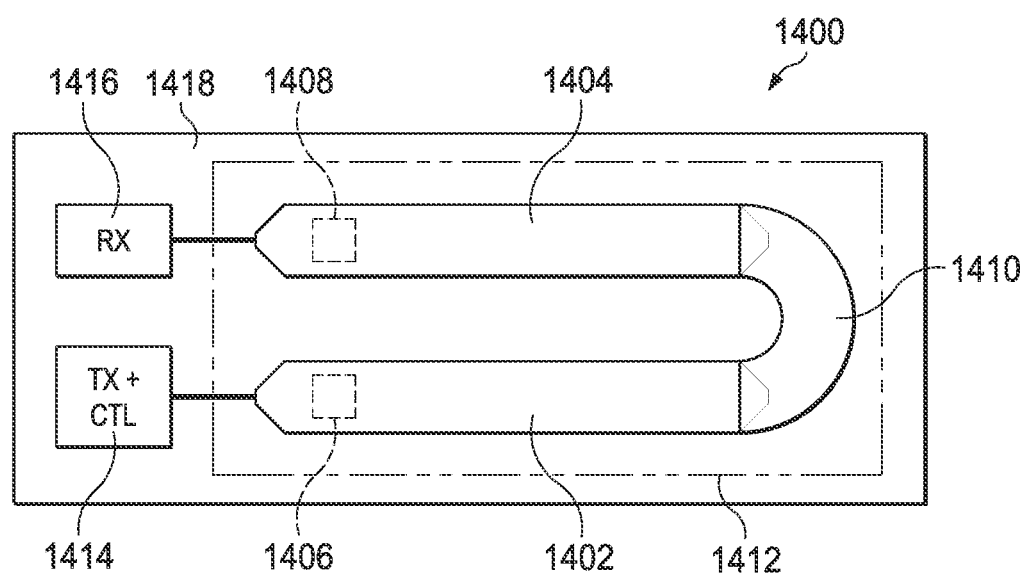

FIGS. 14A and 14B show system-level side and top-down views, respectively, of an example quantum transition frequency detector system 1400 (e.g., configured as a clock) that incorporates two dipolar gas confining glass vials 1402, 1404 configured with respective rectangular windows at the locations of millimeter wave antennas 1406, 1408 for underside signal launch and receipt. Vials 1402, 1404 are illustrated as being rectangular in cross-section, but can be of any shape. As in system 1100 of FIGS. 11A and 11B, the system 1400 shown in FIGS. 14A and 14B couples the two separately sealed vials 1402, 1404 via a U-shaped cavity 1410 configured as a waveguide. In contrast with system 1100, however, the vial enclosure is configured as a box with a lower enclosure portion 1412 and an enclosure lid 1413, each of which can be made, for example, of a molded plastic. The box enclosure configuration may in some instances allow for more efficient manufacturability, permitting vials to be set into the lower enclosure portion 1412 and sealed in by coupling the molded lid 1413 to the lower enclosure portion 1412. Together, these two pieces of the vial enclosure securely seat the two hermetically sealed vials 1402, 1404. Lower enclosure portion 1412 and enclosure lid 1413 can be interiorly coated (e.g., metalized) to form the waveguide, including at U-shaped cavity 1410. During operation of the system 1400, electromagnetic signals are funneled from the first vial 1402 through the U-shaped cavity 1410 and into the second vial 1404.

The two straight vials 1402, 1404 are coupled to board-mounted processing circuitry 1414, 1416 at only a single end of the vials. Transmitter antenna 1406, placed adjacent to an electromagnetically translucent or substantially transparent rectangular launch window of the first vial 1402, is electrically coupled to transmitter and control circuitry 1414. Receiver antenna 1408, placed adjacent to an electromagnetically translucent or substantially transparent rectangular receipt window of the second vial 1404, is electrically coupled to receiver circuitry 1416. Transmitter and receiver circuitry 1414, 1416 can be fabricated on respective individual integrated circuit (IC) semiconductor chips as or as a single transceiver/control chip (not shown). Circuitry 1414, 1416 can be mounted on and electrically coupled to an electronics board 1418. The board 1418 can, for example, measure about 25 mm by 5 mm in length and width (the dimensions shown in the top-down view of FIG. 14B). The board 1418 can further include wiring to electrically couple the circuitry 1414, 1416 to antennas 1406, 1408. In example system 1400, not only the circuitry 1414, 1416, but also the vials 1402, 1404 with enclosure parts 1412, 1413 are encapsulated over the board 1418 with a molded enclosure 1420, securing all pieces of the system 1400 together into a solid component.

As shown in FIG. 14A, the quantum transition frequency detector system 1400 can be mounted to a larger system board 1424 belonging to a larger system. For example, larger system board 1424 (omitted from FIG. 14B) can be a motherboard of a computer system or main system board of a mobile device, such as a smartphone. Electronics board 1418 can be electrically and mechanically coupled to the larger system board 1424 by bump bonds, for example, such as bump bonds 1426, 1428, 1429 through which output signals can be provided from the quantum transition frequency detector system 1400 to the larger system, and/or input signals can be provided to the quantum transition frequency detector system 1400 from the larger system. As compared to system 1100, system 1400 avoids needing to mount the electronics 1414, 1416, 1418 and the vials 1402, 1404 to the larger system board 1424 separately. Instead, the package contained by board 1418 and encapsulating enclosure 1420, including electronics and vials, is coupled to the larger system board 1424 in one piece, providing manufacturability convenience benefits.

Figure 15A:
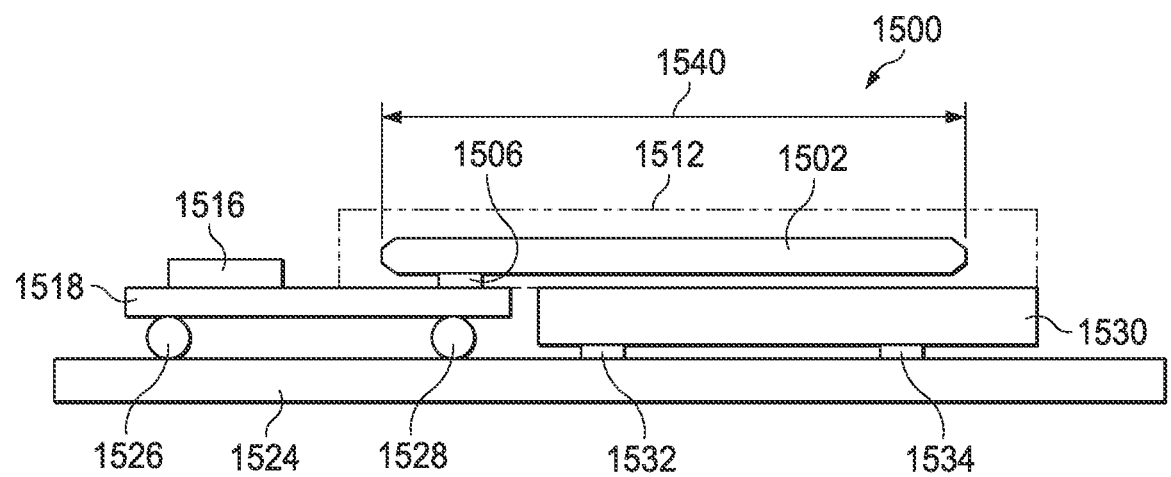
FIGS. 15A and 15B are side and top-down views of an example quantum transition frequency detector system incorporating one glass vial configured for under-side signal launch and receipt from a single window.
Figure 15B:
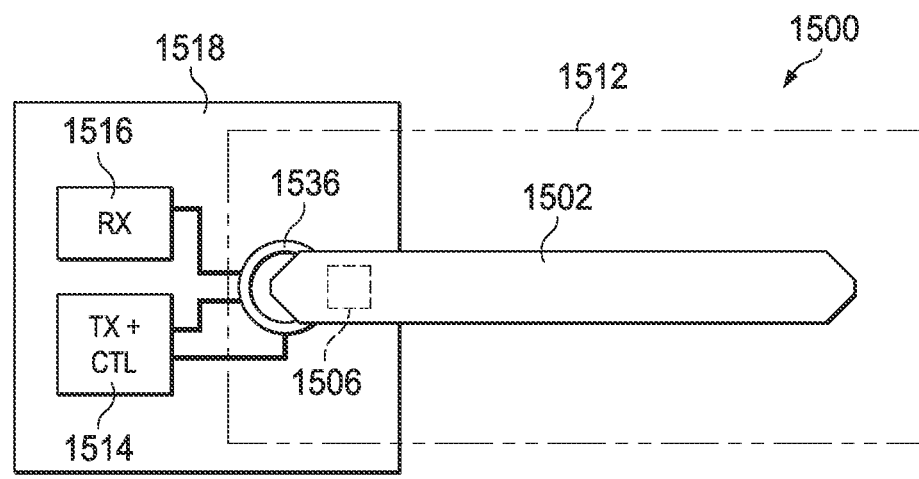

FIGS. 15A and 15B show system-level side and top-down views, respectively, of an example quantum transition frequency detector system 1500 (e.g., configured as a clock) that incorporates only a single dipolar gas confining glass vial 1502 configured with a single rectangular launch/receipt window at the locations of a millimeter wave antenna 1506 for under-side signal launch and receipt. Vial 1502 is illustrated as being rectangular in cross-section, but can be of any shape. As compared to systems 1100 and 1400, the system 1500 shown in FIGS. 15A and 15B does not require a waveguide coupling two separate vials. Instead, the system 1500 is configured for launch and receipt from a single window in a single vial 1502. Vial 1502 can, for example, be exteriorly coated with a metal (e.g., a reactive metal such as Cu, Al, Cr, or Ti), either omitting the coating from the window region or subsequently etching away the coating from the window region to form the window, and then encapsulated in enclosure 1512, which can be, e.g., injection-molded plastic. In other examples, the enclosure 1512 is made of or interiorly coated with a metal (e.g., a reactive metal such as Cu, Al, Cr, or Ti) and the vial 1502 can be placed inside the enclosure 1512 such that at least portions of the exterior of the glass walls of the vial adjoin (e.g., are substantially in contact with) the metal of the enclosure interior, so that the metal of the enclosure interior acts as a waveguide for electromagnetic waves propagating through the vial. During operation of the system 1500, electromagnetic signals are launched into the vial 1502 through the single launch-receipt window, propagate to the far end of the vial 1502, and reflect back to the single launch/receipt window. The vial 1502 can, for example, be fabricated to have a propagation length 1540 of $2N\lambda/2$, where N is an integer multiple and $\lambda$ is the quantum transition wavelength of the dipolar gas to be expected to be observed.

The straight vial 1502 is coupled to board-mounted processing circuitry 1514, 1516 at only a single end of the vial. The single transmitter/receiver antenna 1506 is placed adjacent to the single electromagnetically translucent or substantially transparent rectangular launch window of the vial 1502, and is electrically coupled to both transmitter and control circuitry 1514 and to receiver circuitry 1516. Transmitter and receiver circuitry 1514, 1516 can be fabricated on respective individual integrated circuit (IC) semiconductor chips as or as a single transceiver/control chip (not shown). Circuitry 1514, 1516 can be mounted on and electrically coupled to an electronics board 1518. The board 1518 can, for example, measure about 5 mm by 5 mm in length and width (the dimensions shown in the top-down view of FIG. 15B). The board 1518 can further include wiring to electrically couple the circuitry 1514, 1516 to the antenna 1506. A circulator or a rat-race structure 1536 can allow separation of the transmitted signal from the received signal with the correct ratio of attenuation. Processing electronics 1514, 1516 can also be configured to distinguish transmitted and received electromagnetic signals.

As shown in FIG. 15A, the quantum transition frequency detector system 1500 can be mounted to a larger system board 1524 belonging to a larger system. For example, larger system board 1524 (omitted from FIG. 15B) can be a motherboard of a computer system or main system board of a mobile device, such as a smartphone. Electronics board 1518 can be electrically and mechanically coupled to the larger system board 1524 by bump bonds, for example, such as bump bonds 1526, 1528 through which output signals can be provided from the quantum transition frequency detector system 1500 to the larger system, and/or input signals can be provided to the quantum transition frequency detector system 1500 from the larger system. The vial 1502 in its vial enclosure 1512 can likewise be secured to the larger system board 1524 via an enclosure mounting block 1530 that is coupled to the larger system board 1124 with mounting feet 1532, 1534. Mounting block 1530 can be a singular piece with the enclosure 1512 or can be fabricated separately from the enclosure 1512 and secured (e.g., glued) to it.

Figure 16A:
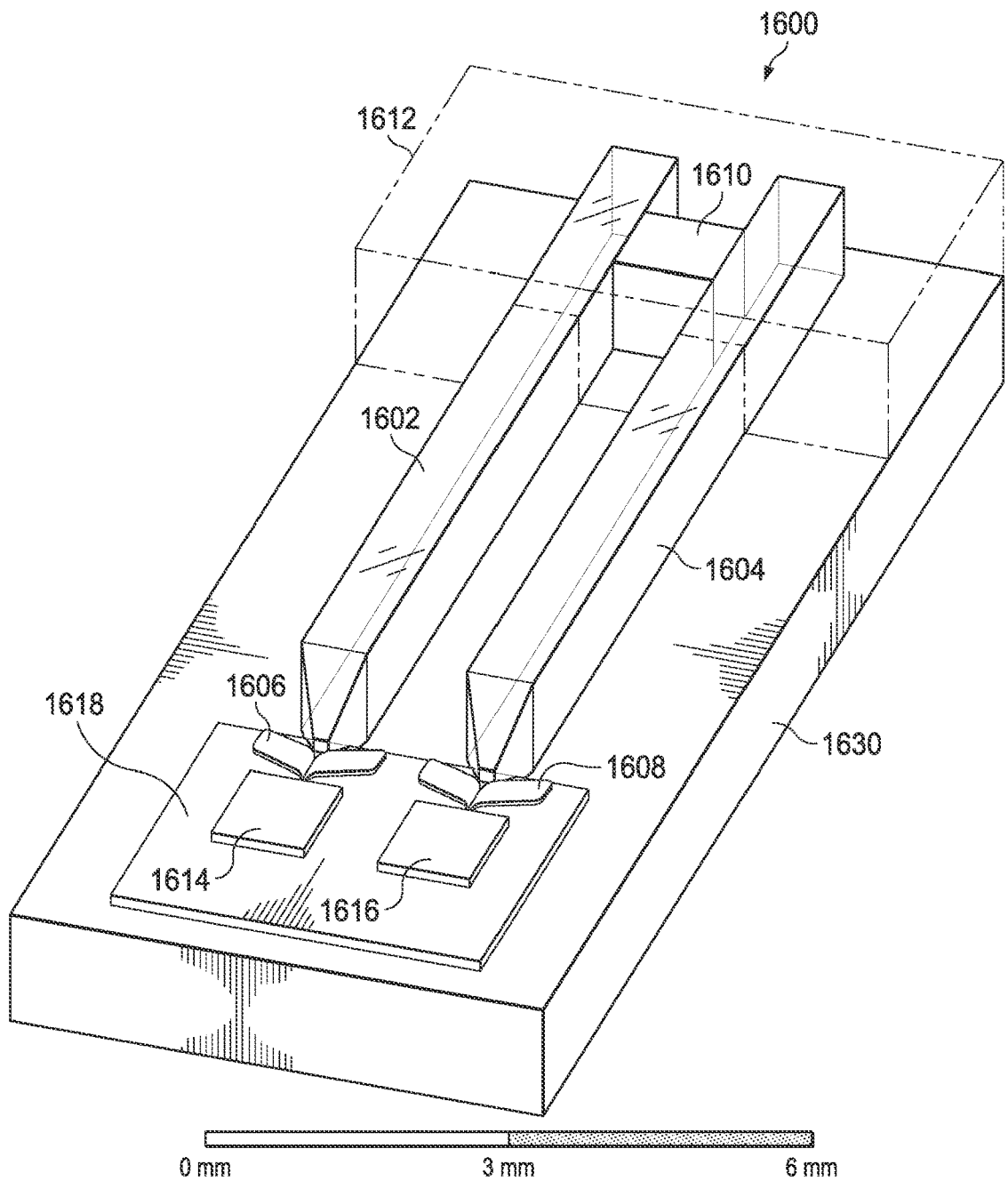
FIGS. 16A, 16B, 16C, and 16D are parallel projection, side, and top-down views of an example quantum transition frequency detector system incorporating two glass vials coupled by an H-shaped waveguide, the vials having vial-end access points for lateral signal launch and receipt.

FIG. 16A is an oblique parallel projection view 1600 of an example quantum transition frequency detector system 1600 (e.g., configured as a clock) that incorporates two dipolar gas confining glass vials 1602, 1604 configured with respective millimeter wave antennas 1606, 1608 (e.g., Vivaldi antennas) respectively coupled to vials 1602, 1604 at vial-end access points for lateral signal launch and receipt. An H-shaped cavity 1610 in vial-coupling waveguide component 1612 is configured as a waveguide, e.g., with interior coating of electromagnetically reflective material in vial-coupling waveguide component 1612, or by vial-coupling waveguide component 1612 having been made of an electromagnetically reflective material. Vials 1602, 1604 are illustrated as being rectangular in cross-section, but can be of any shape. Transmitter antenna 1606 is electrically coupled to transmitter and control circuitry 1614. Receiver antenna 1608 is electrically coupled to receiver circuitry 1616. Transmitter and receiver circuitry 1614, 1616 are mounted on and electrically coupled to electronics board 1618 that can further include wiring to electrically couple the circuitry 1614, 1616 to antennas 1606, 1608. The vial-coupling waveguide component 1612 can include or can be mounted to block 1630.

Figure 16B:
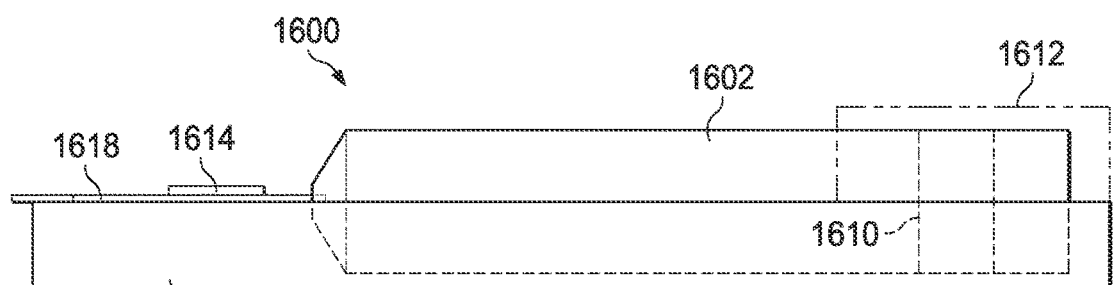
Figure 16C:
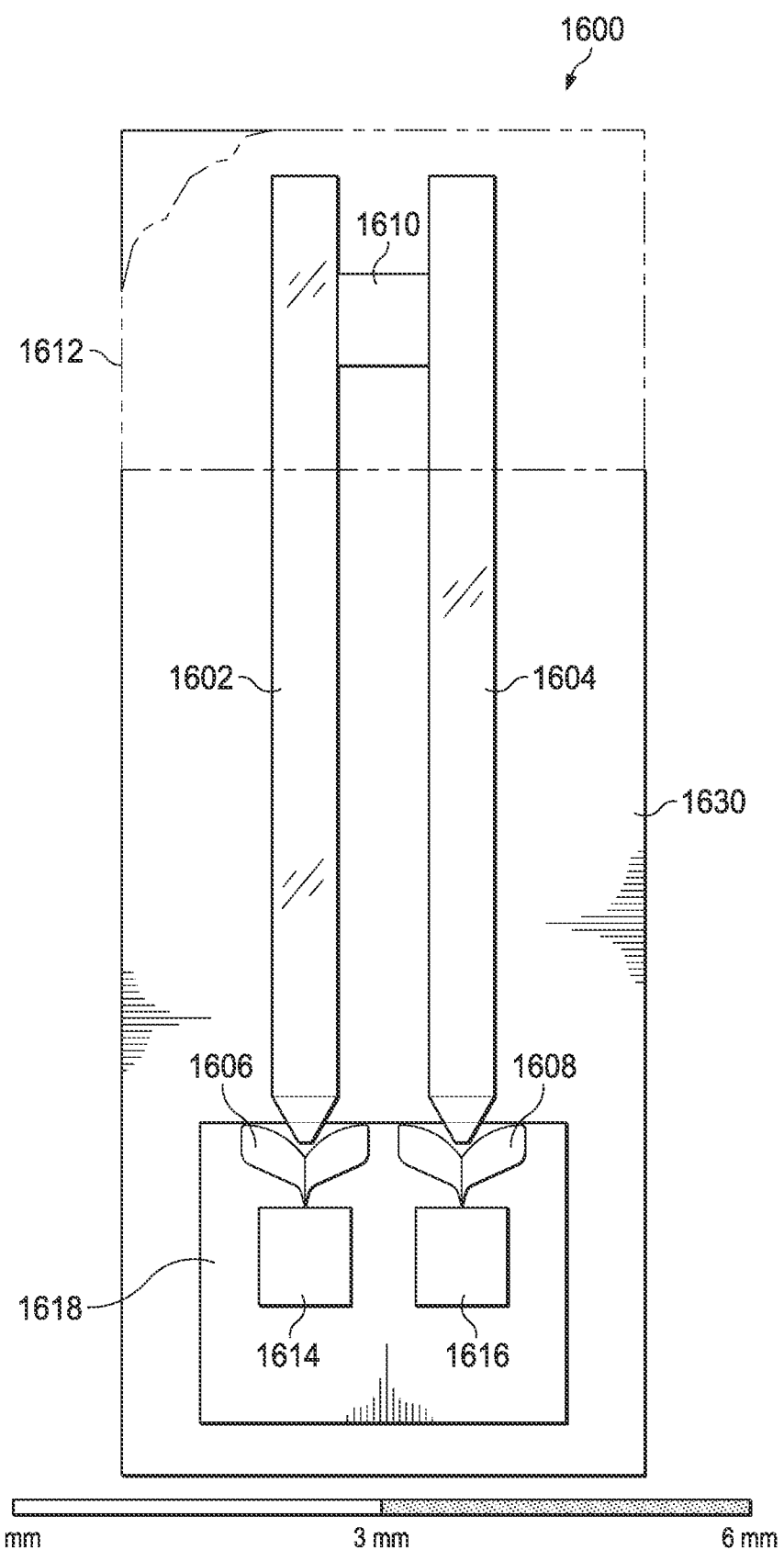
Figure 16D:
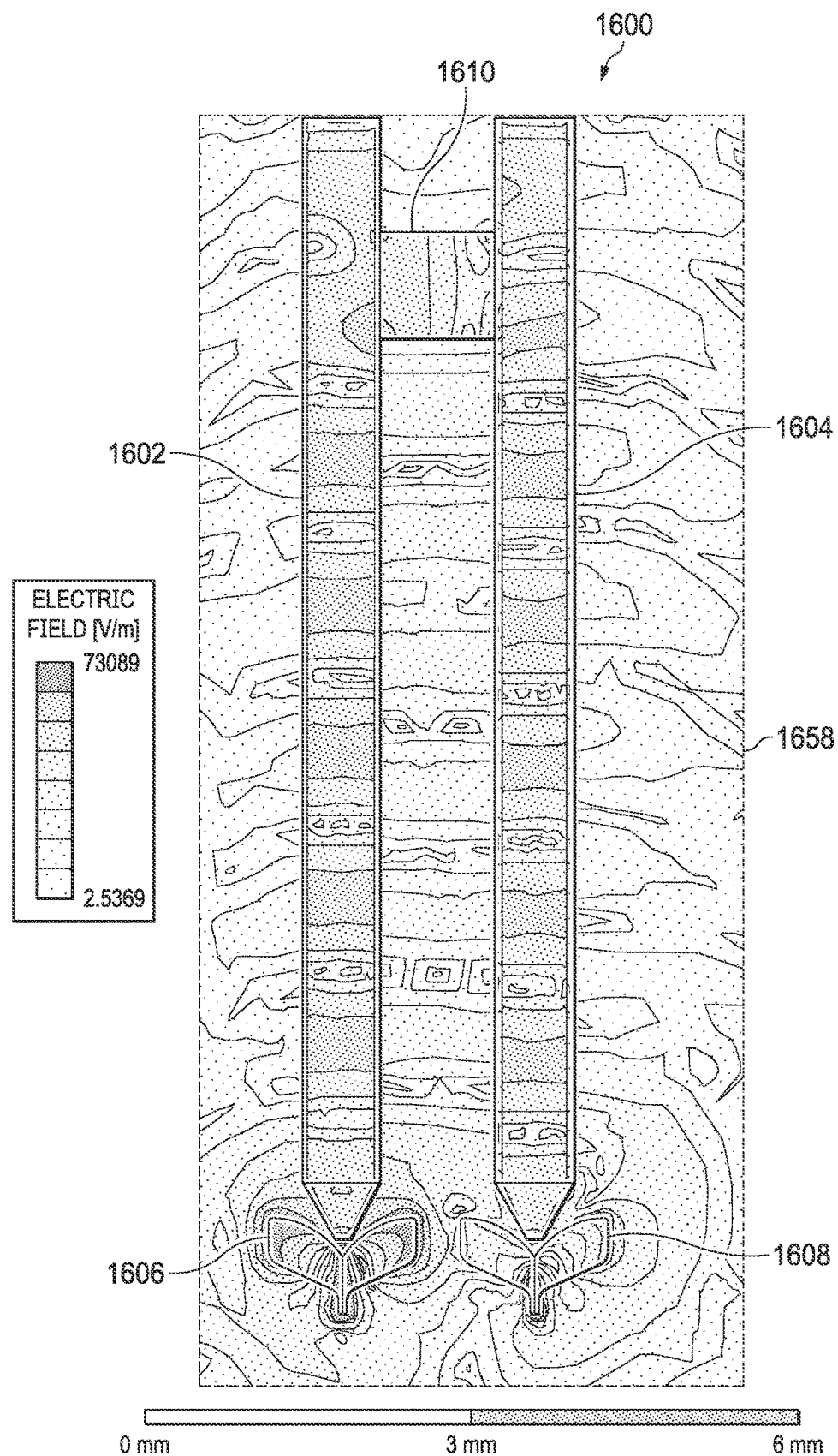

FIGS. 16B and 16C provide a side view and a top-down view, respectively, of the system 1600. FIG. 16D provides a top-down longitudinal section view of the system 1600 through longitudinal plane 1658, showing the electric field in volts per meter under the condition of propagation of electromagnetic waves at a given transition frequency from transmit antenna 1606 to receive antenna 1608.

Figure 17:
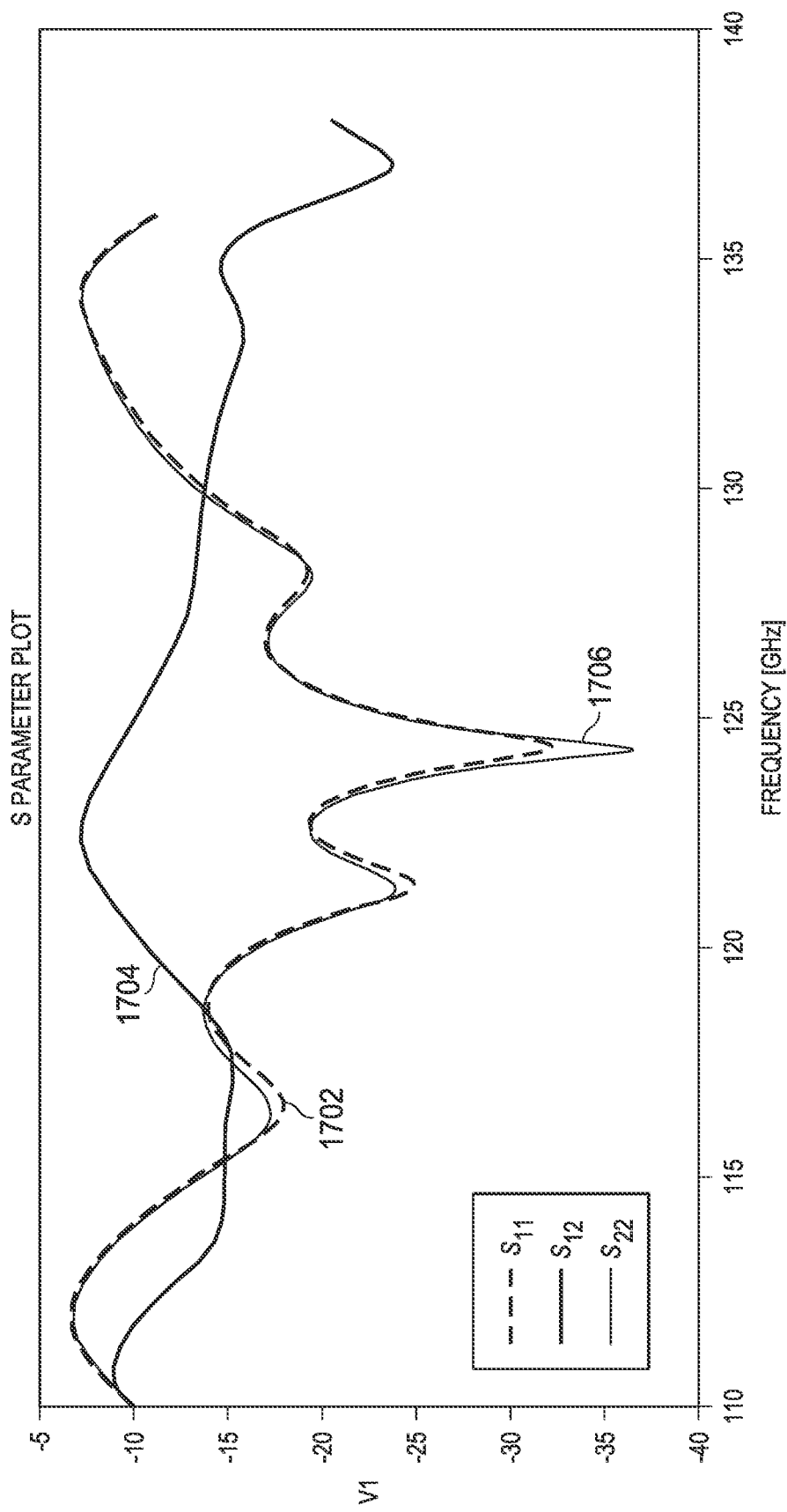
FIG. 17 is an S-parameter graph showing the power reflected and transmitted for the system of FIGS. 16A-16D.

FIG. 17 is an S-parameter graph showing the power reflected ($S_{11}$) 1702 at the transmitter and power transmitted ($S_{12}$) 1704 between the transmitter and the receiver for the system 1600 of FIGS. 16A-16D over a frequency range between 110 GHz and 140 GHz. Transmitted power 1704 is particularly high in the frequency range of about 120 GHz to about 130 GHz. The reflected power ($S_{22}$) 1706 at the receiver is also shown.

Figure 18A:
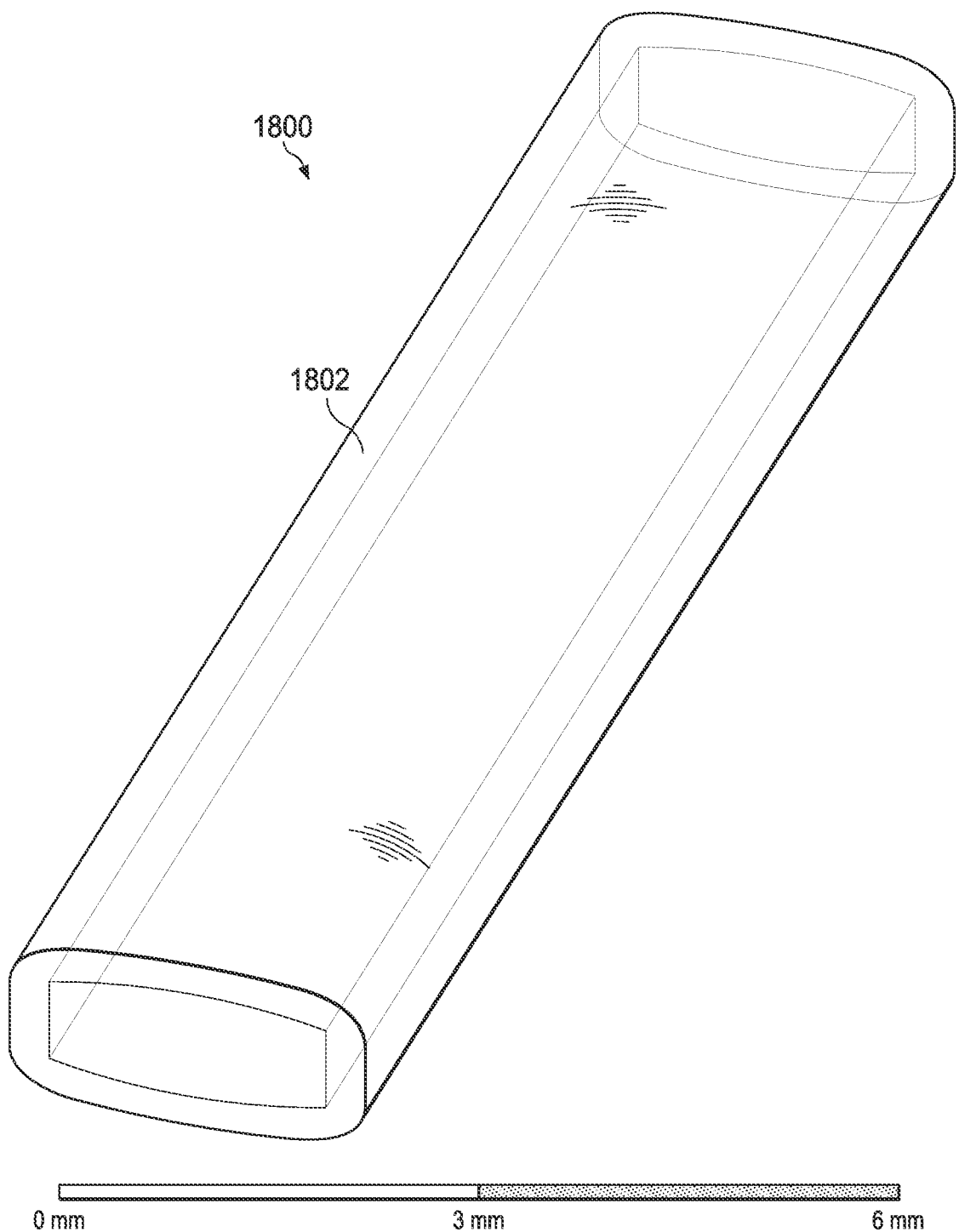
FIGS. 18A and 18B are parallel projection views of an example sealed glass vial having a rounded rectangular cross-section.

FIG. 18A is an oblique parallel projection view 1800 of an example sealed glass vial 1802 for containing a dipolar gas at low pressure as part of a quantum transitions detection system. The vial 1802 is illustrated as having a super-ellipse (rounded rectangle) cross-section. The vial 1802 can be interiorly or exteriorly coated with an electromagnetically reflective (e.g., electrically conductive) material (e.g., a metal) to form a waveguide. In the illustrated example of FIGS. 18A and 18B, either rectangular windows near one or both ends of the vial are left unmetallized, or the metal coating can be removed (e.g., etched away) at rectangular portions near one or both ends of the vial subsequent to the coating, to provide access points that are translucent or substantially transparent to the electromagnetic waves used to interrogate the confined gas. Within a certain dimension of the wavelength and the dielectric constant of the glass material of the vial 1802, the vial 1802 exhibits a mono-mode of electromagnetic propagation.

Figure 18B:
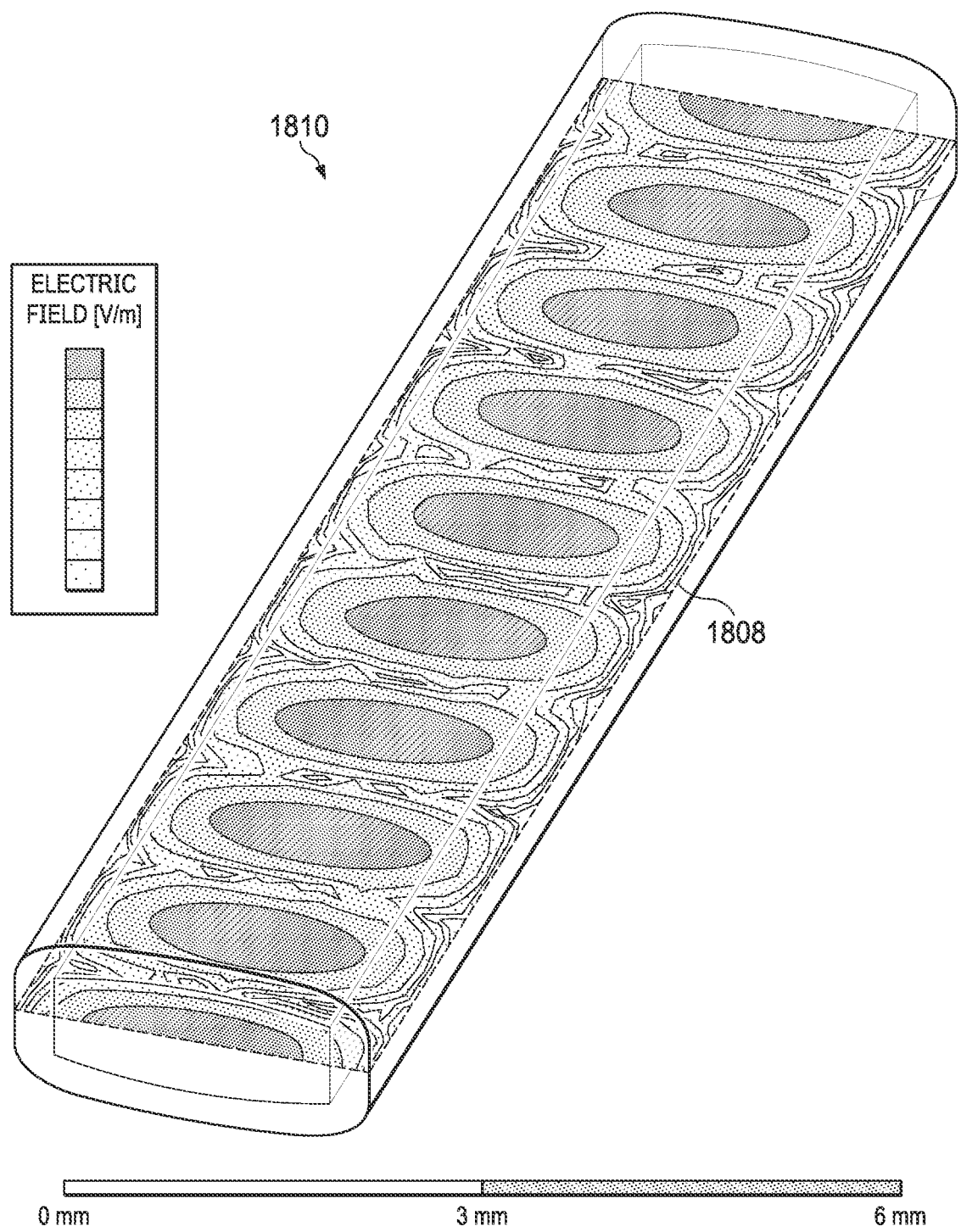

FIG. 18B provides a longitudinal section view 1810 of the vial 1802 through longitudinal plane 1808, showing the electric field in volts per meter under the condition of propagation of electromagnetic waves at a given transition frequency from a transmit antenna to receive antenna (antennas not shown in FIGS. 18A and 18B). Launch and reception are provided at the underside of the vial 1802 in the illustrated example.

When a vial, such as any of the example vials described above, is configured as a physics cell to electromagnetically interrogate a dipolar gas for an absorption frequency, the waveguide of the physics cell can be configured to operate using only a single mode of electromagnetic wave propagation. The dominant mode in a particular waveguide is the mode having the lowest cutoff frequency. For a rectangular waveguide, this dominant mode is the $TE_{10}$ mode. The "TE" (transverse electric) signifies that all electric fields are transverse to the direction of electromagnetic wave propagation and that no longitudinal electric field is present. Mono-mode propagation can be achieved, for example, by selecting appropriate waveguide dimensions for the wave frequency range of interest to make only the lowest order mode ($TE_{10}$) not cut off. Thus, the dimensions of the vial can be chosen to provide a mono-mode of propagation (propagation in one particular frequency).

Figure 19:
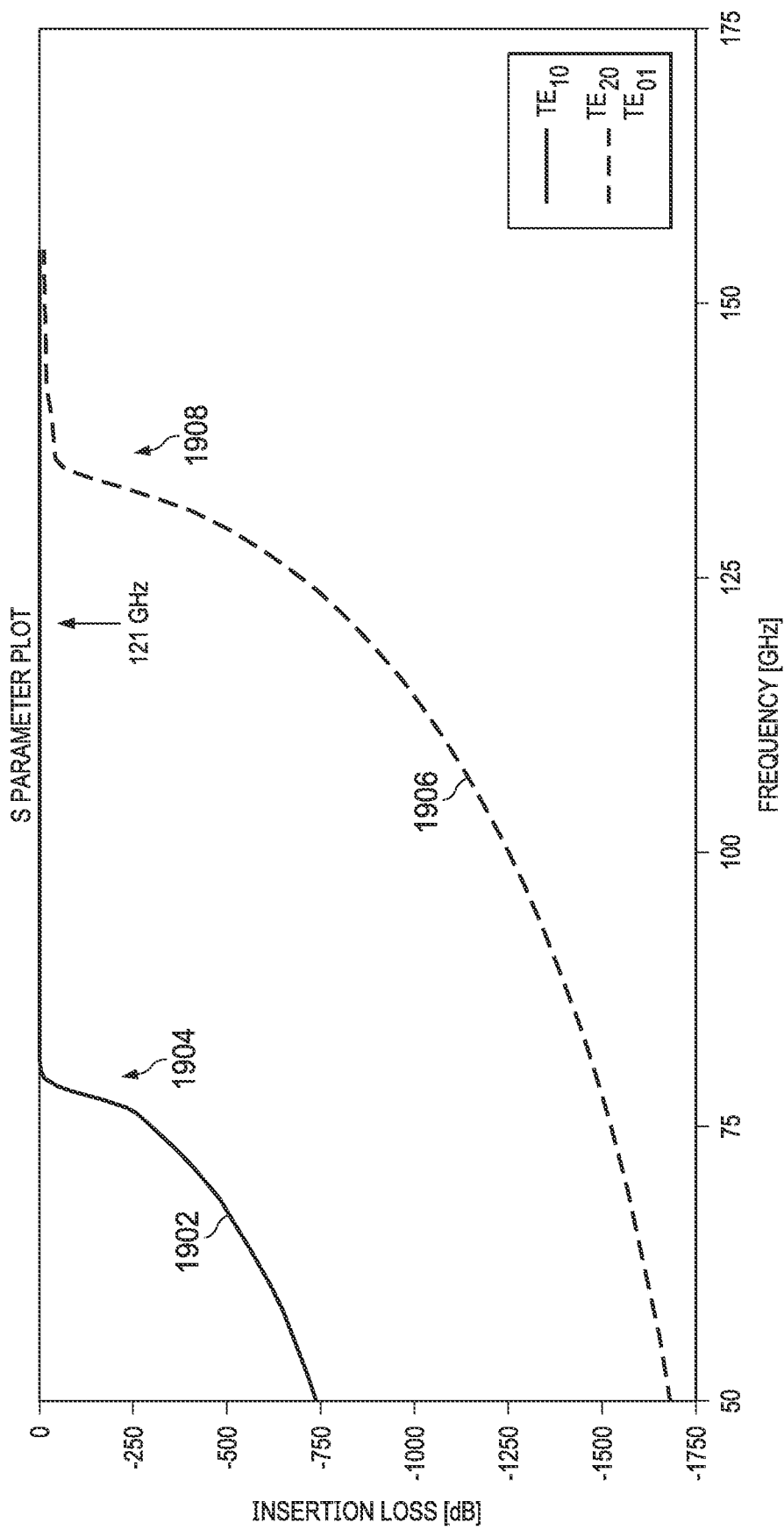
FIG. 19 is an S-parameter graph showing the frequency cutoffs for the modes of electromagnetic propagation of the vial of FIGS. 18A and 18B.

As an example, the graph of FIG. 19 plots $S_{12}$ parameters for modes of propagation for the rounded rectangle cross-section vial 1802 of FIGS. 18A and 18B, having a vial length of 57 millimeters. A value at 0 dB on the graph of FIG. 19 indicates no insertion loss. Drop-offs in plot values below the indicated cutoff frequencies signify increasingly higher return loss (the lower the frequency). Plot 1902 shows the insertion loss of the dominant mode of propagation $TE_{10}$ as a function of frequency in the range between about 50 GHz and about 175 GHz. As shown in FIG. 19, for the dimensions of vial 1802, the $TE_{10}$ mode has a cutoff frequency 1904 of about 80 GHz. Below this cutoff frequency 1904, with reduction in frequency, the increasingly highly negative values of insertion loss signify the substantial reduction or elimination of the $TE_{10}$ mode of propagation. The $TE_{20}$ and $TE_{01}$ modes, represented by plot 1906, have a higher cutoff frequency 1908, at about 135 GHz, for the dimensions of vial 1802. Above about 135 GHz, multiple modes of propagation survive transmission across the length of the vial (three modes within the illustrated frequency band). However, within the range between $TE_{10}$ cutoff frequency 1904 and $TE_{20}/TE_{01}$ cutoff frequency 1908, only one mode can propagate over the length of the vial. The dimension of the vial, including the length of the vial, can be chosen such that this range between $TE_{10}$ cutoff frequency 1904 and $TE_{20}/TE_{01}$ cutoff frequency 1908 includes the quantum transition frequency of interest to be locked to, which, in the case of OCS, is about 121 GHz.

Figure 20:
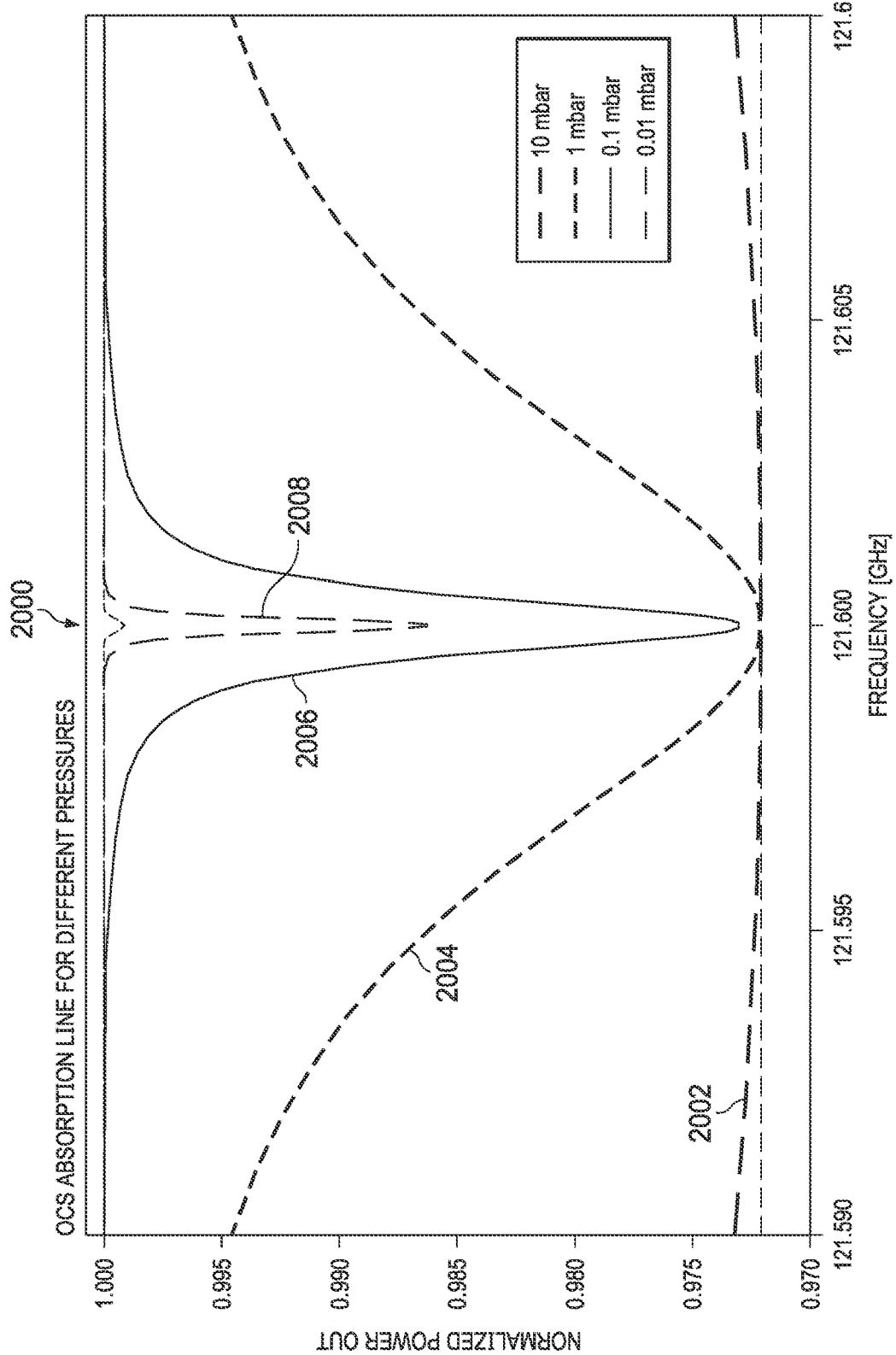
FIG. 20 is a graph illustrating the relationship between pressure of a confined gas and transmitted power over a frequency range for an example gas (OCS).
Figure 21:
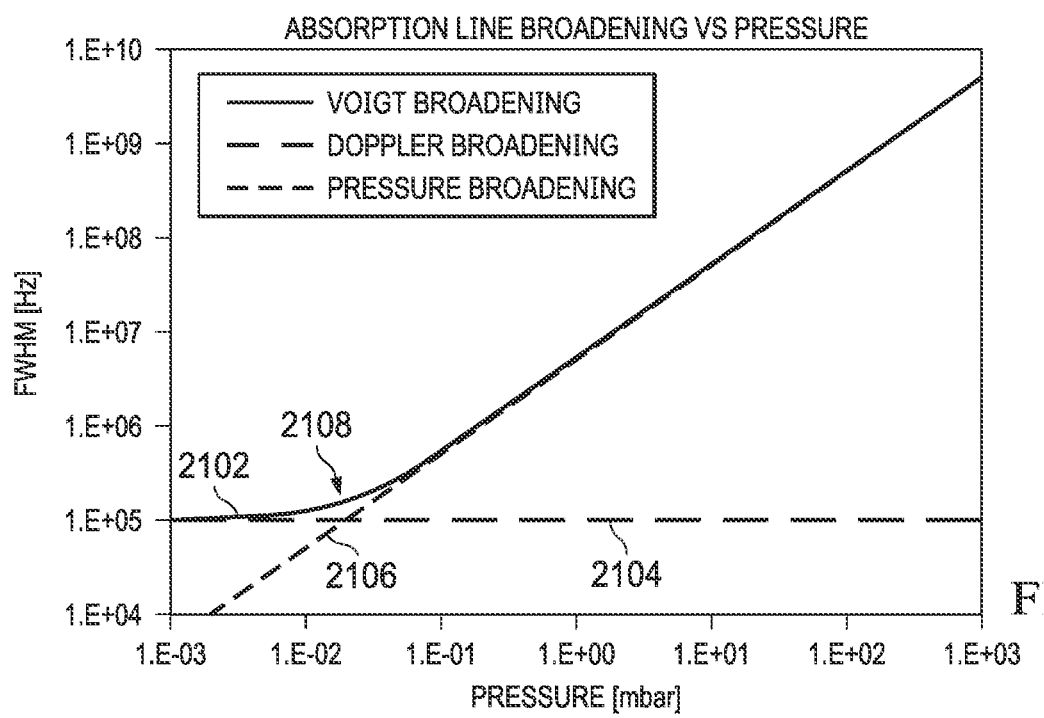
FIG. 21 is a graph illustrating the relationship between absorption line dip width and confined gas pressure.

The pressure of confined gas in an example glass vial, such as any of the glass vials illustrated in FIGS. 1-18B, can be chosen in accordance with the relationships illustrated in the graphs of FIGS. 20 and 21. The shape of the absorption line varies with gas pressure. When gas pressure is very low, the absorption by the gas of electromagnetic waves, even at the frequency of quantum transition, is very small, because of the scarcity of gas molecules to absorb the electromagnetic energy. As the gas pressure and therefore the number of molecules of confined gas increases, the absorption dip becomes larger in magnitude, up to a saturation point where the absorption dip becomes broader with increased pressure. The broader the absorption dip, the more difficult it becomes (e.g., for circuitry 108 in detector 100 of FIG. 1) to accurately track the quantum transition frequency of the confined dipolar gas (the frequency at the bottom of the dip).

The graph of FIG. 20 illustrates the relationship between pressure of the confined gas, the gas being OCS in the illustrated examples, and transmitted power over a frequency range of interest (in the illustrated graph, between 121.59 GHz and 121.61 GHz). Absorption line plot 2002, for example, shows the OCS absorption line for a confined gas pressure of 10 millibar. This plot 2002 shows a very wide dip 2000. Absorption line plot 2004 shows the OCS absorption line for a confined gas pressure of 1 millibar. This plot 2004 has a narrower dip 2000 than plot 2002. Absorption line plot 2006 shows the OCS absorption line for a confined gas pressure of 0.1 millibar. Absorption line plot 2008 shows the OCS absorption line for a confined gas pressure of 0.01 millibar. As compared to the dip 2000 of 0.1 millibar plot 2006, the dip 2000 of 0.01 millibar plot 2008 is sharper, but of reduced magnitude difference. The sharpness (or narrowness, or width) of an absorption line dip can be characterized, for example, by the dip's full width at half maximum (FWHM); a sharper dip is indicated by a lower FWHM value for the dip.

As shown in the graph of FIG. 20, at lower pressures, the transmitted power dip 2000 indicative of the quantum transition of the confined OCS gas at about 121.6 GHz has a low magnitude difference as compared to the transmitted power at interrogation wave frequencies outside of the dip 2000. At higher pressures, the dip 2000 broadens. A dip that is of too insubstantial a magnitude difference or that is too wide can be difficult to lock to (e.g., by transition frequency-locking control loop circuitry 108 in the example frequency detector 100 of FIG. 1). For any given dipolar gas, a compromise pressure can be chosen that balances the competing considerations of dip magnitude and dip narrowness.

The graph of FIG. 21 shows a plot 2102 of the FWHM, in units of hertz, of absorption line dips for absorption lines at a range of confined gas pressures. As shown in FIG. 21, a pressure 2108, at between about 0.1 millibar and about 0.01 millibar in the illustrated example, can be selected near the bend of the plot 2102, where the FWHM is not substantially reduced from its minimum value at about $1 \times 10^5$ Hz. The breadth of the absorption dip can be affected by Doppler broadening 2104, which is independent of contained gas pressure, and pressure broadening 2106, which is linear with pressure. The pressure 2108 of the confined gas may be selected to be a pressure at which the Doppler broadening 2104 is approximately equal to the pressure broadening 2106. In the range of between 0.1 millibar and 0.01 millibar for OCS, the quantum absorption is maximum for the minimum dip broadening. Similar measurements and analysis can be performed to select a desired pressure for any given dipolar gas.

The pressure can, in some examples, be adjusted from a pressure as determined above to increase absorption for a given vial length. A vial may be fabricated (e.g., laser-cut, as in the example of FIG. 2) to have a length that provides a mono-mode of propagation. Absorption can be defined as the fraction of unit of output power of electromagnetic interrogation waves received at the receiver antenna of a vial for a unit of input power of electromagnetic interrogation waves launched into the vial, and can be written as out $P_{out}/P_{in}$. An absorption line as a function of frequency can be approximated by the Beer-Lambert law using the formula $P_{out}(f)/P_{in}(f)=e^{-sclx(f)}$, where e is Euler's number (approximately equal to 2.71828), s is intensity in nat.cm/molecule, c is concentration of the confined gas in molecules/cm$^3$, l is the length of the vial, and x(f) is the line shape function in centimeters, which varies with frequency of the electromagnetic waves used to interrogate the confined dipolar gas. The intensity s may be given for a chosen confined gas by HITRAN, the high-resolution transmission molecular absorption database. The line shape x(f) may be given by physical laws (e.g., the Voigt profile probability distribution). The vial length l can be chosen to provide a mono-mode of propagation. The concentration c may be then chosen by the compromise pressure, as described above with regard to FIGS. 20 and 21, or can be adjusted for the selected length l. In some examples, the pressure of the confined gas is selected to be between about 0.01 millibar and 0.2 millibar, e.g., between about 0.01 millibar and 0.1 millibar, e.g., between about 0.03 millibar and about 0.06 millibar.

Figure 22:
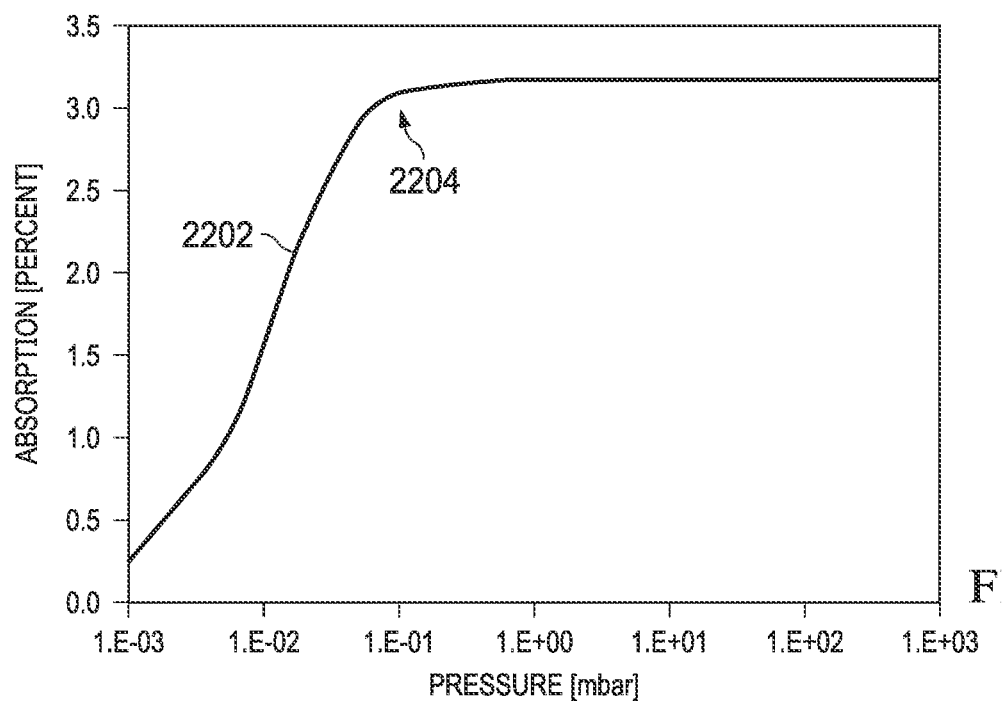
FIG. 22 is a graph illustrating an example absorption curve 2202 as a function of confined dipolar gas pressure for an example 56 millimeter long vial.

The graph of FIG. 22 shows an example absorption curve 2202 as a function of OCS pressure between about $1\times10^{-3}$ millibar and about $1\times10^3$ millibar for an example vial length l of 56 millimeters. For this vial length l, the confined gas pressure may be selected to provide a gas concentration c at the point 2204 at which absorption is not substantially reduced from its maximum of about 3.2%.

Figure 23:
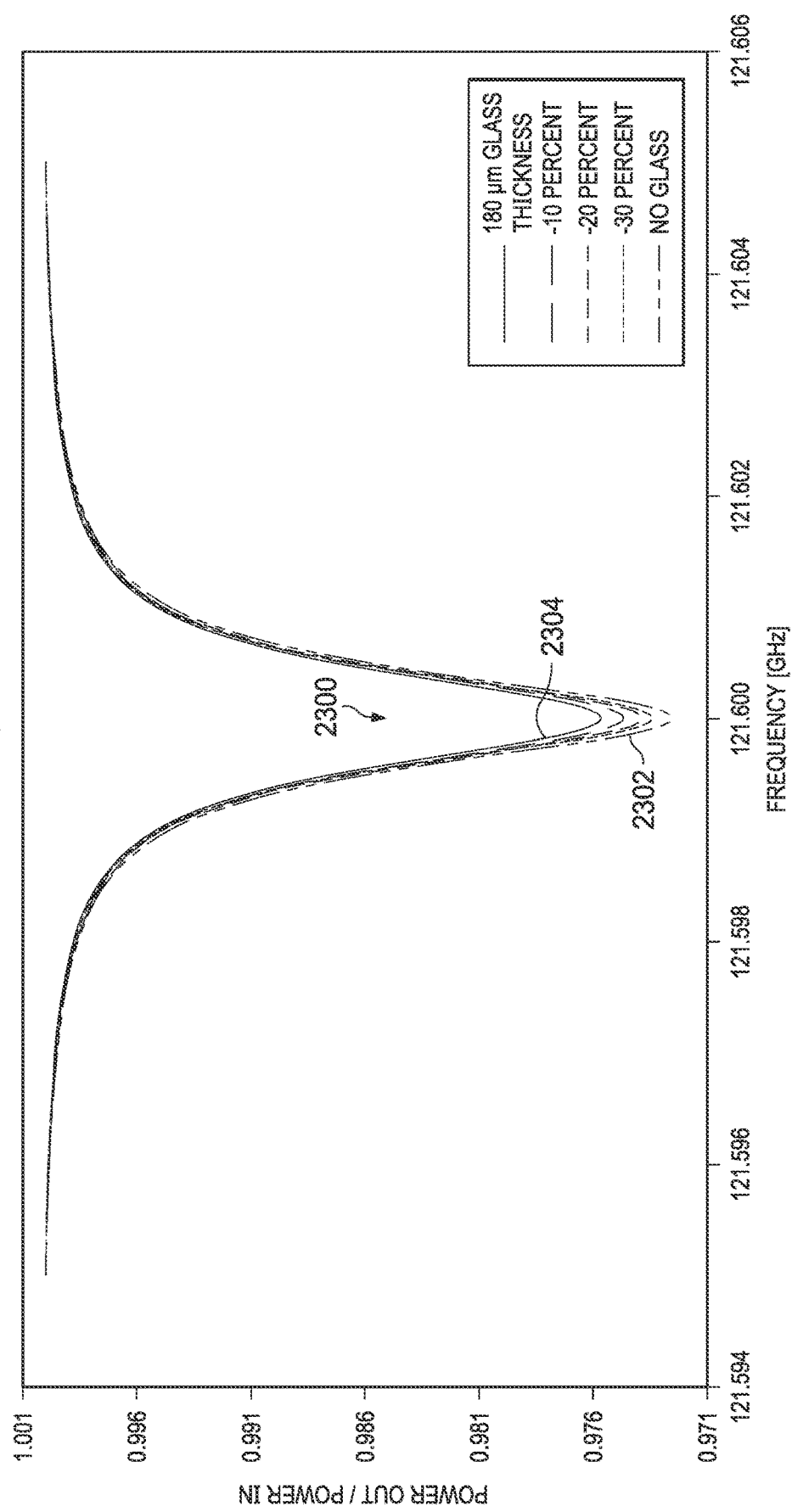
FIG. 23 is a graph illustrating the relationship between thickness of the glass walls of an example 57 millimeter long glass vial and transmitted power over a frequency range.

The graph of FIG. 23 shows the relationship between thickness of the glass walls of an example glass vial (57 millimeters long with walls of glass having a dielectric constant of 4.8) and transmitted power over a frequency range of interest (in the illustrated graph, between 121.594 GHz and 121.606 GHz). For cases of exterior metal coating outside of infinitesimally thin glass ("no glass"), or interior metal coating, the transmitted power dip 2300 indicative of the quantum transition of the confined gas at about 121.6 GHz is indicated by plot 2302, which is the sharpest and most well-defined plot of those illustrated. Plot 2304 shows the amplitude of the dip 2300 for an example glass vial having walls that are 180 micrometers thick. Other plots, with values falling between the values of the "no glass" plot 2302 and the 180 micrometer thickness plot 2304, indicate intermediate cases of 10% less thick than 180 micrometers, 20% less thick than 180 micrometers, and 30% less thick than 180 micrometers.

Thicker glass vial walls have the benefit of greater mechanical robustness. Being under pressure from outside, the glass vial should have walls thick enough to maintain the mechanical integrity of the vial and not to crumble. By contrast, infinitesimally thin glass vial walls reduce concentration of electric field in the glass, thereby reducing travel of electromagnetic waves through the glass and increasing absorption in the confined gas. Additionally, cutoff frequencies, such as cutoff frequencies 1904, 1908 in FIG. 19, are impacted by the dielectric constant of the glass material, which can be, for example, between about 4 and about 5. If the glass wall is too thick, the cutoff frequencies can be situated such that the transition frequency of interest is not within the mono-mode of propagation frequency region of operation.

As shown in the graph of FIG. 23, the thinner the walls of the glass vial, the sharper the transmitted power dip 2200. However, thinner glass walls may also be less practicable to manufacture, and may suffer from lack of robustness during fabrication and operation, resulting in breakages or fractures of the vials and consequent leaks of the confined dipolar gas. Accordingly, in some examples, glass vial wall thickness is between about 50 micrometers and about 250 micrometers, e.g., between about 100 micrometers and about 180 micrometers, e.g., between about 120 micrometers and about 150 micrometers.

Figure 24A:
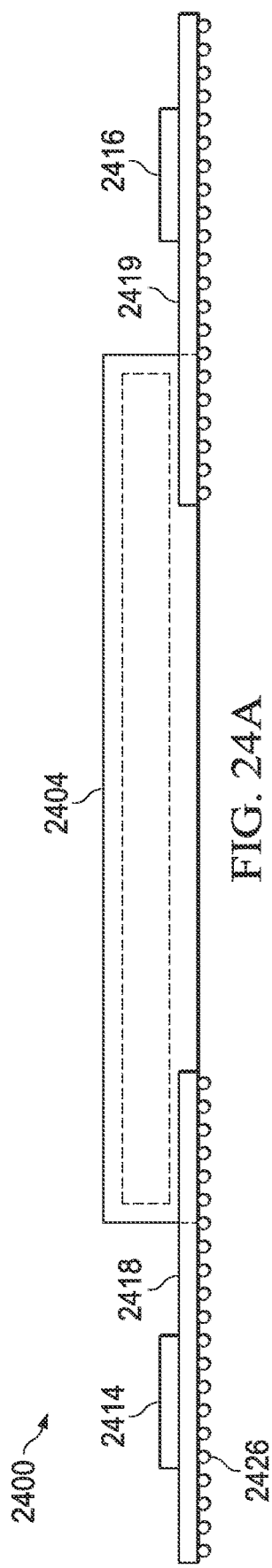
FIGS. 24A and 24B are side and top-down views of an example quantum transition frequency detector system incorporating a single glass vial with transmit and receive electronics at either end of the vial.
Figure 24B:
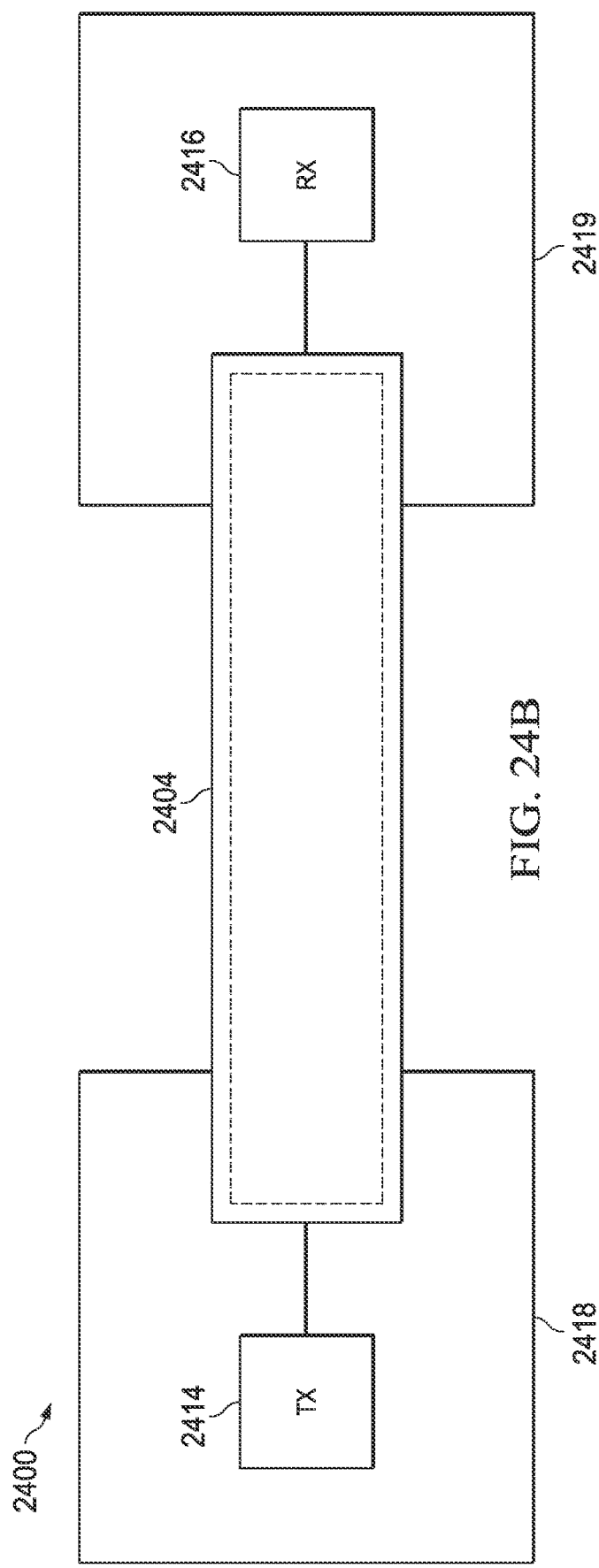

FIGS. 24A and 24B show an example quantum transition frequency detector system 2400 incorporating a single glass vial 2404 with transmit and receive circuitry 2414, 2416 at either end of the vial 2404. Vial 2404 can be configured with respective rectangular windows at the locations of millimeter wave antennas (not shown) for either under-side signal launch and receipt or lateral signal launch and receipt (or some combination of these). Vial 2404 can be, for example, of any type depicted in FIG. 3A, 4A, 6A, 7A, 8, 9A, 9B, 10A, 10B, or 12A. Vial 2404 is illustrated as being rectangular in cross-section, but can be of any shape. Vial 2404 can be interiorly or exteriorly coated with an electromagnetically reflective (e.g., electrically conductive) material (e.g., a metal), or can be seated in a substantially adjoining enclosure (not shown) that is interiorly coated with an electromagnetically reflective material and functions to provide an exterior coating to vial 2404. The vial enclosure can be made, for example, of a molded plastic.

During operation of system 2400, electromagnetic signals propagate through the vial 2404 from the transmit end, to which transmitter circuitry 2414 is coupled, to the receive end, to which receive circuitry 2416 is coupled. Control circuitry can be provided within either transmit or receive circuitry 2414, 2416, which can be coupled to each other via a wired or wireless connection (not shown). A transmitter antenna (not shown) can be electrically coupled to transmitter circuitry 2414. A receiver antenna (not shown) can be electrically coupled to receiver circuitry 2416. Transmitter and receiver circuitry 2414, 2416 can be fabricated on respective individual IC semiconductor chips. Circuitry 2414, 2416 can be mounted on and electrically coupled to respective electronics boards 2418, 2419, e.g., PCBs. The boards 2418, 2419 can include wiring to electrically couple the circuitry 2414, 2416 to the respective antennas.

Each board 2418, 2419 in system 2400 can, for example, be soldered by bump bonds 2426 to a larger board (not shown) or to other components (not shown) for integration into a larger system (not shown), such as a motherboard of a computer system or main system board of a mobile device, such as a smartphone. Output signals can be provided via the bump bonds from the quantum transition frequency detector system 2400 to the larger system, and/or input signals can be provided to the quantum transition frequency detector system 2400 from the larger system. Circuitry 2414, 2416 can be encapsulated over the respective boards 2418, 2419 with a molded enclosure. The vial 2404 or its enclosure can be mounted to the boards 2418, 2419 by pin, screw, or other securing device, or can be glued thereon. Output signals can be provided from the quantum transition frequency detector system 1100 to the larger system, and/or input signals can be provided to the quantum transition frequency detector system 1100 from the larger system.

System 2400 has the advantage of simplicity of fabrication and construction because it does not require a waveguide to couple two independent vials and does not require the bending of a glass vial to create a U-shaped or serpentine vial. As compared to system 1100, system 2400 retains the advantages that antennas can consist of metal flats that are on a single plane, which plane can be the plane of electronics boards 2418, 2419 on which electronic circuitry 2414, 2416 are mounted. The antennas can therefore be printed on the electronics boards 2418, 2419 and electrically coupled to the circuitry 2414, 2416 via wiring printed on the electronics boards 2418, 2419. Depending on how the vial 2404 is seated with respect to the boards 2418, 2419, the antennas can be configured for either lateral or under-side signal launch, or some combination of these. The millimeter electromagnetic waves used to interrogate the dipolar gas contained by the vial 2404 can therefore be launched directly from the electronics board 2418 to which the vial 2404 is coupled.

Figure 25:
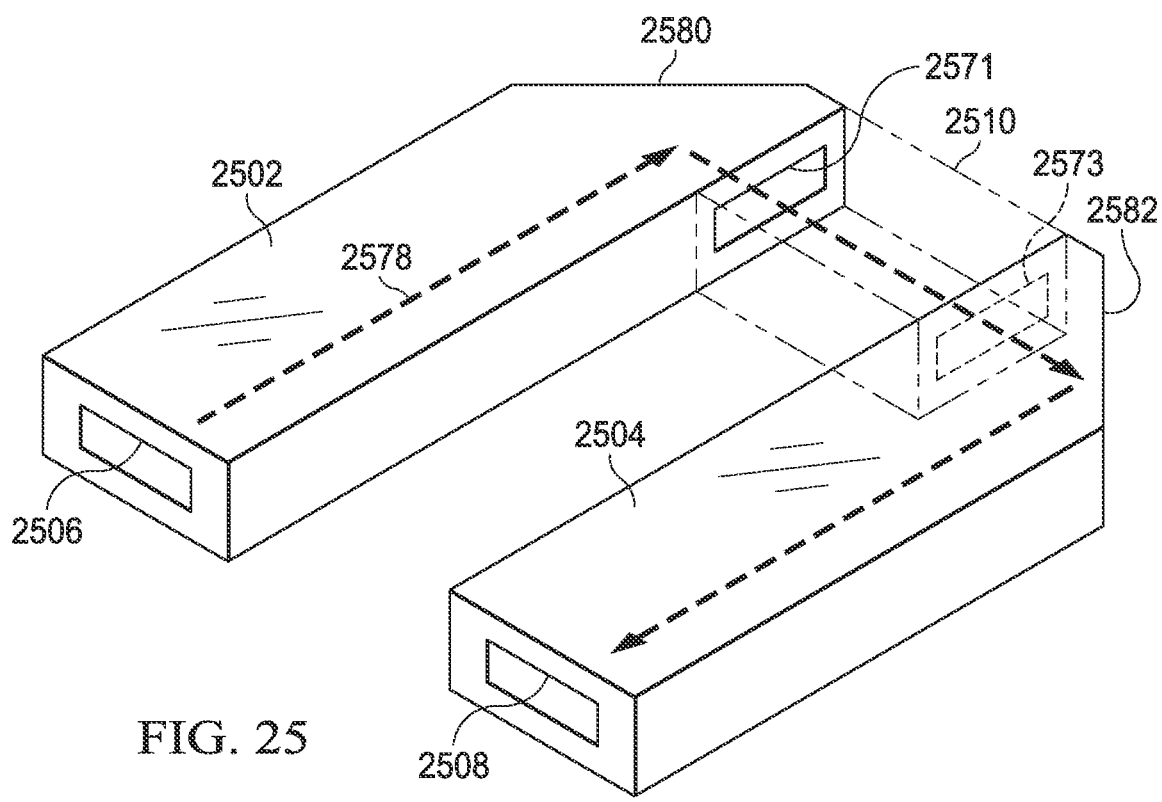
FIG. 25 is a parallel projection view of an example vial arrangement for use in a quantum transition frequency detector system incorporating two glass vials coupled by a straight waveguide, the vials having a diagonal corner and windows for lateral signal launch and receipt.
Figure 26:
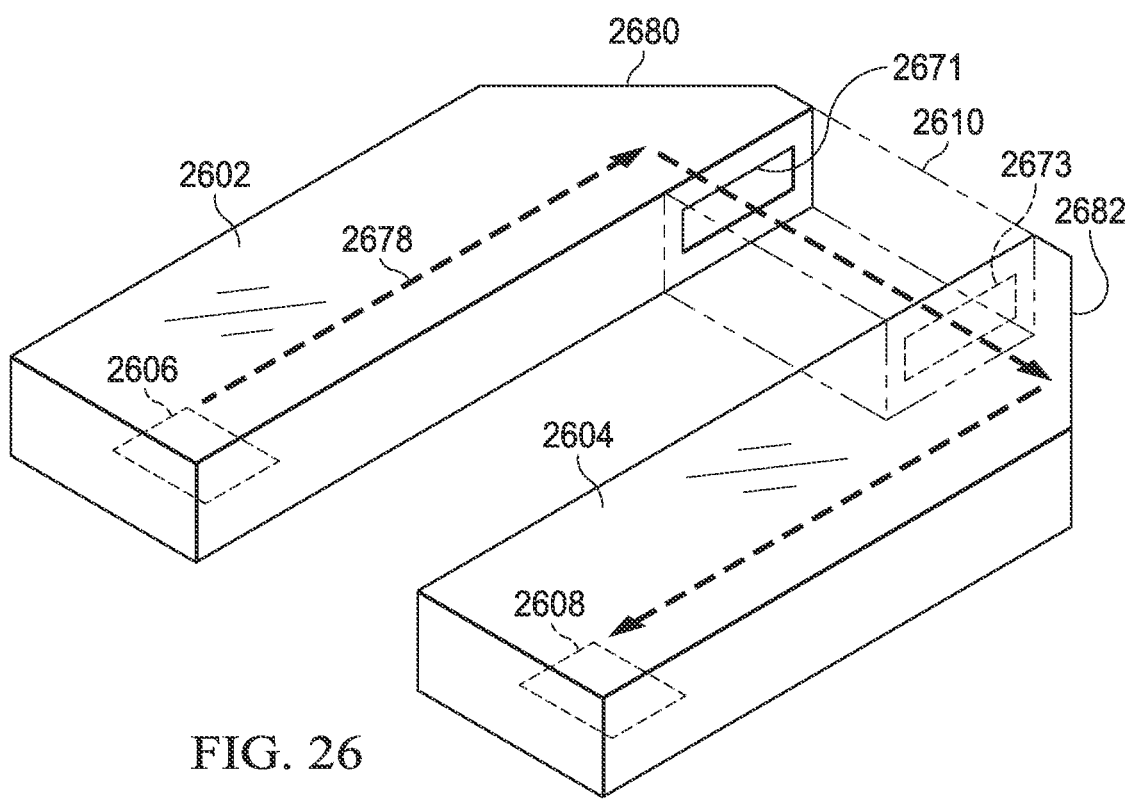
FIG. 26 is a parallel projection view of an example vial arrangement for use in a quantum transition frequency detector system incorporating two glass vials coupled by a straight waveguide, the vials having a diagonal corner and windows for under-side signal launch and receipt.

FIGS. 25 and 26 show example vial arrangements for use in a quantum transition frequency detector system in which each vial is configured with a diagonal corner to provide directed electromagnetic reflection. In FIG. 25, the system includes two low-pressure dipolar gas confining glass vials 2502, 2504 coupled by a straight waveguide 2510. Waveguide 2510 can, for example, be a plastic shell or housing that is interiorly coated with electromagnetically reflective material, or can itself be made of the electromagnetically reflective material (e.g., a metal). Vial 2502 is provided, on a side, exit window 2571 into waveguide 2510. Vial 2504 is provided, on a side, entrance window 2573 out of waveguide 2510. Each of the two glass vials 2502, 2504 can be provided with respective millimeter wave antennas (not shown) respectively coupled at launch and receive windows 2506, 2508. At the end of each vial 2502, 2504 opposite its respective window 2506, 2508, the vial is shaped to have a surface that is at an angle that is diagonal with respect to the longitudinal dimension of the vial, e.g., at or approximately at a 45° angle thereto, so as to provide a surface that directedly reflects the interrogating electromagnetic radiation along electromagnetic energy propagation path 2578. The angle can be created, for example, by crimping the glass vial 2502 or 2504.

Vials 2502, 2504 can, for example, be laser cut and sealed on the ends having windows 2506, 2508 and crimp cut and sealed on the ends having angled reflection surfaces 2580, 2582. Vials 2502, 2504 are illustrated as being rectangular in cross-section, but can be of any shape. Antennas can be electrically coupled to transmit or receive circuitry, which can be mounted on a single electronics board (or respective electronics boards), as illustrated in other examples, such as FIG. 16A. In the illustrated example, windows 2506, 2508 are configured for lateral signal launch and receipt, but in other examples, other configurations are possible. The coupling waveguide 2150 can be, for example, made of metal or a metal-coated plastic, but is either open on its ends or is not metal-coated on its ends where it interfaces with windows 2571, 2573. The waveguide 2510 can be filled with air or a dielectric.

The quantum transition frequency detector arrangement shown in FIG. 26 is similar to that of FIG. 25, except that the launch and receive windows 2606, 2608 are arranged for under-side signal launch and receipt. For example, millimeter-wave interrogation signals can be launched through under-side launch window 2606 along path 2678 through vial 2602, reflecting off the surface at diagonal end 2680 of vial 2602, exiting vial 2602 through window 2671 into waveguide 2610, passing through waveguide 2610 into vial 2604 via window 2673, reflecting off the surface at diagonal end 2682 of vial 2604, and exiting through under-side receive window 2608. The waveguide 2510 in FIG. 25 or 2610 in FIG. 26 can be very short to nil. In some examples, a third gas-filled glass vial can be substituted for waveguide 2510 or 2610, providing additional effective electromagnetic interrogation length.

In some examples, a metal or metal-coated waveguide can be substituted for one of the launch vial 2502 or 2602 or the receive vial 2504 or 2604. Such examples provide the benefit of returning the signal to the same side of the single vial, offering simplicity of construction with respect to the arrangement of the electronics on only one side of the vial, as compared to the arrangement of FIGS. 24A and 24B, which includes electronics on both sides of the single vial 2404. In some examples, the angle at face 2580 or 2680 is not approximately 45°, but is instead a substantially larger or smaller angle, with the angle at face 2582 or 2682 being correspondingly smaller or larger, respectively, to ensure that the direction of propagation of the electromagnetic energy propagation path 2578 or 2678 is redirected about 180°. For example, rather than faces 2580 (or 2680) and 2582 (or 2682) both being about 45° with respect to the longitudinal dimension of the respective vials 2502 (or 2602) and 2504 (or 2604), face 2580 (or 2680) can provide an approximately 30° angle and face 2582 (or 2682) can correspondingly provide an approximately 60° angle; the waveguide 2510 (or 2610) may be arranged to be correspondingly slanted, rather than perpendicular to vials 2502 and 2504 (or 2602 and 2604). The examples discussed above with reference to FIGS. 25 and 26 can be extended to provide serpentine-shaped structures composed of more than two vials coupled by additional waveguides or connecting vials, thus extending the effective length of the physics cell by increasing the amount of low-pressure dipolar gas through which the interrogation millimeter waves are made to travel.

Figure 27:
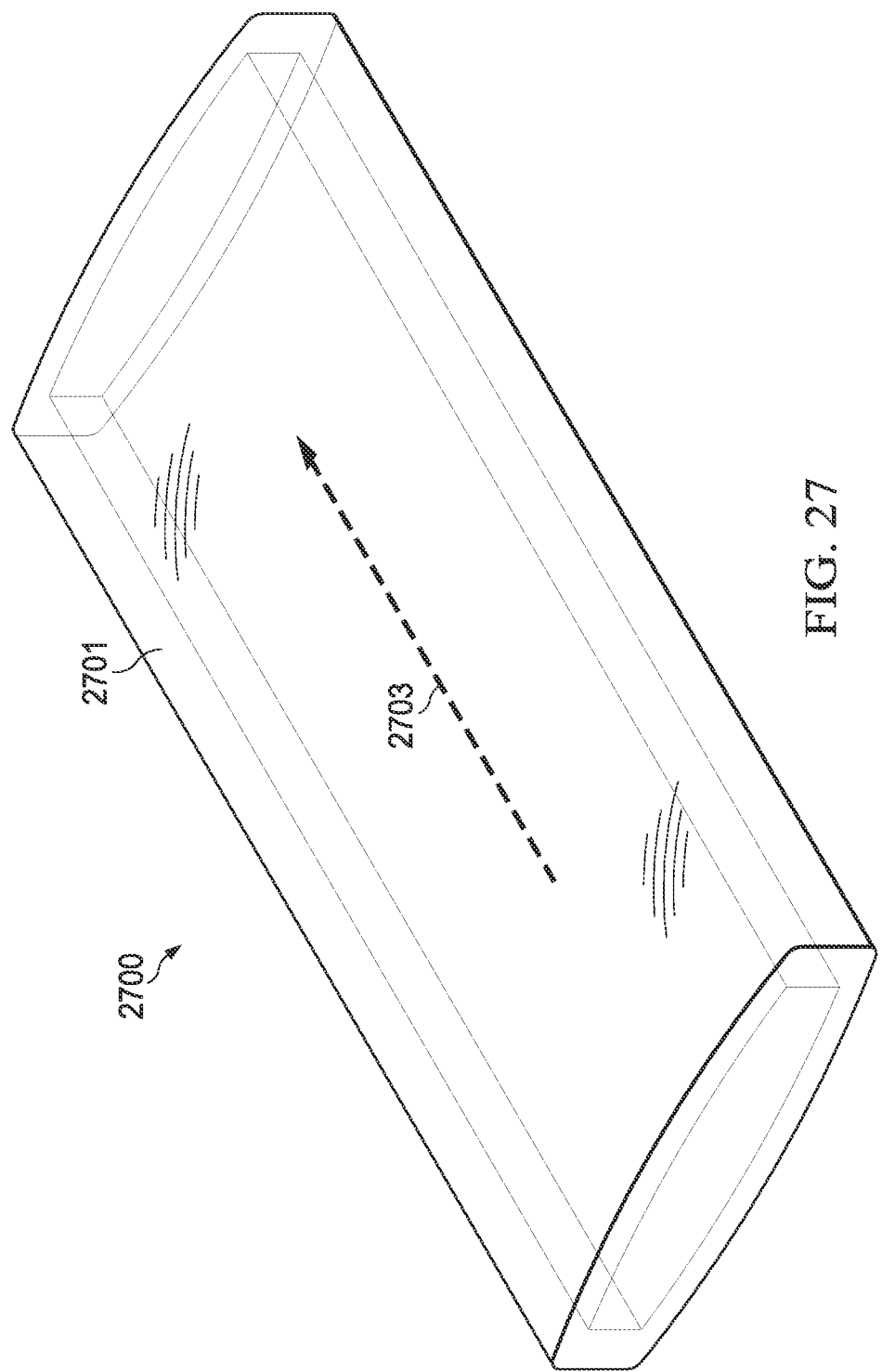
FIG. 27 is a parallel projection view of an example flattened glass vial for use in fabricating a single-vial U-shaped physics cell as shown in FIGS. 28 and 29.
Figure 28:
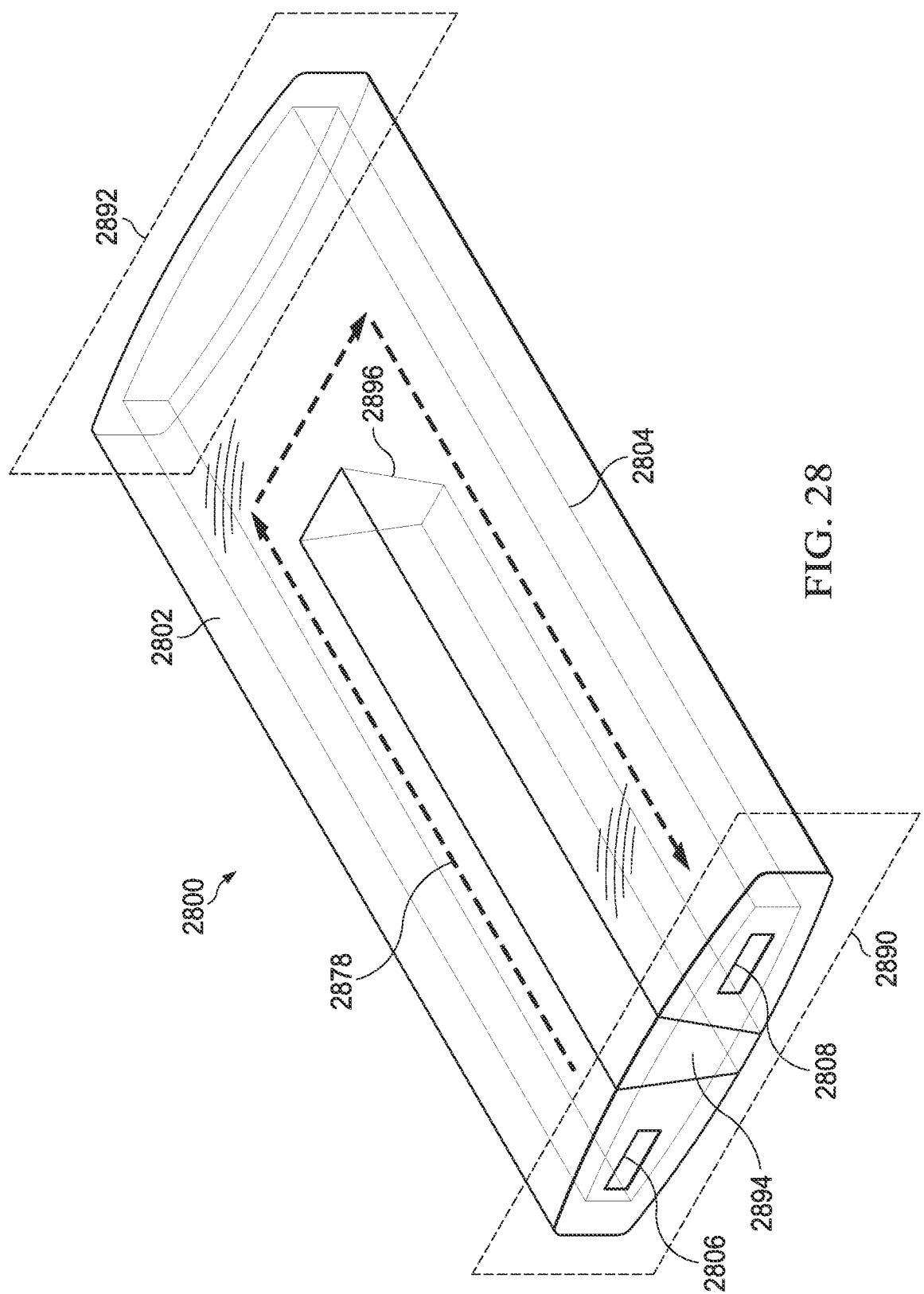
FIG. 28 is a parallel projection view of an example single-vial U-shaped physics cell having windows for lateral signal launch and receipt.
Figure 29:
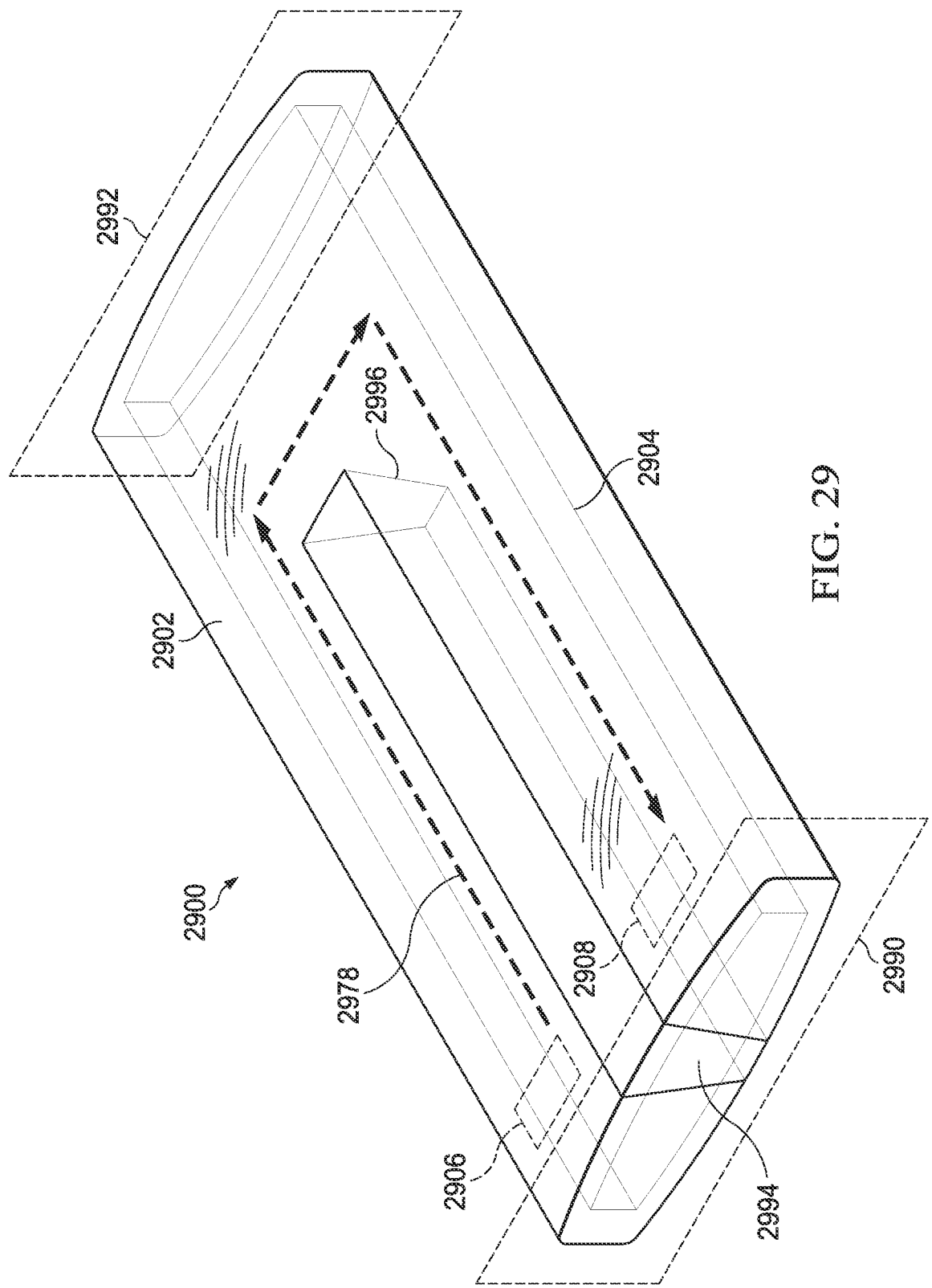
FIG. 29 is a parallel projection view of an example single-vial U-shaped physics cell having windows for under-side signal launch and receipt.
Figure 30:
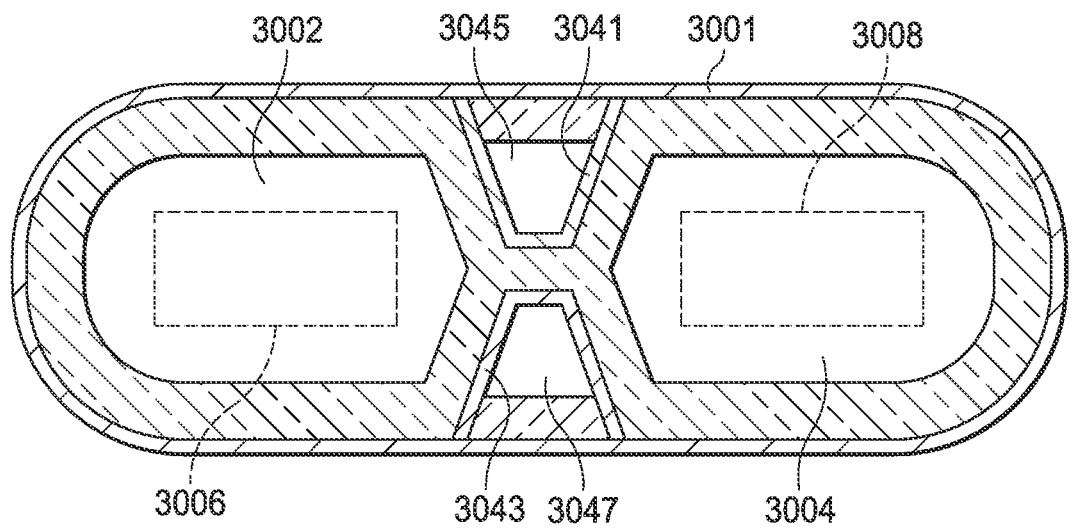
FIGS. 30 and 31 are cross-sectional views of example single-vial U-shaped physics cells like that of FIG. 28.
Figure 31:
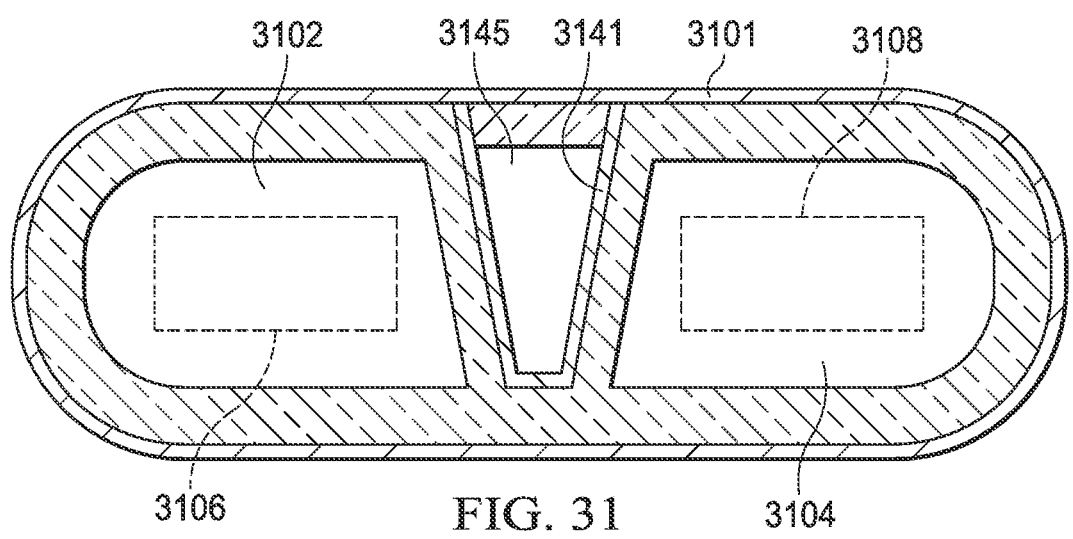

FIGS. 27 through 31 show example U-shaped physics cells that can be fabricated from a single glass vial, potentially reducing fabrication cost, reducing system complexity, and increasing system ruggedness by eliminating fragile interfaces between components, as compared to examples requiring connection of multiple glass vials to derive U-shaped structures. A single-vial U-shaped physics cell as shown in FIGS. 28 and 29 can begin 2700 as shown in FIG. 27, with a wide glass vial 2701 that is initially unsealed at least one end. For example, the glass vial 2701 is substantially wider than it is tall in cross section, e.g., with a width-to-height ratio of greater than 2:1, e.g., greater than 3:1, e.g., greater than 4:1, e.g., greater than 5:1, e.g., greater than 6:1. For example, the aspect ratio is 4.5:1. Example cross-sections are shown in FIGS. 30 and 31. The starting wide vial 2701 shown in FIG. 27 is illustrated as having a super-ellipse (rounded rectangle) cross-section, but can be of a number of other shapes.

During fabrication, the starting wide vial 2701 can be processed by a high-temperature crimp (e.g., using a clamp that is of high enough temperature to melt and crimp the glass of the vial 2701) or a laser heating to collapse the middle of the starting wide vial 2701, along a portion of the length of the starting wide vial 2701, to form a wall that is substantially collinear with Z-axis 2703, and thus to form a U-shaped structure in the single glass vial 2701. The collapsing of the portion of the middle of the starting wide vial 2701 creates two connected cavities 2802, 2804 on either side of the vial, as shown in the example U-shaped single-vial physics cell 2800 of FIG. 28. Following the formation of the middle wall between region 2894 in near sealing plane 2890 and region 2896, the dual-cavity vial 2800 can be filled with low-pressure dipolar gas at the desired pressure, in accordance with the examples given above, and sealed by a laser beam or heated and crimped at one or both ends to complete the seal of the vial 2800. For example, the end of the vial 2800 at far sealing plane 2892 can be sealed prior to the filling of the vial 2800 with low-pressure dipolar gas, and a laser beam can seal the opposite end of the vial 2800 at near sealing plane 2890 after the filling of the vial 2800 with low-pressure dipolar gas. After sealing, the vial 2800 can be exteriorly coated with an electromagnetically reflective (e.g., electrically conductive) material (e.g., a metal). The coating covers at least a portion of the interior of the middle wall, on the exterior of the vial 2800. The coating can be done so as not to coat the portions of the vial 2800 at near seal plane 2890 that are the locations of electromagnetically translucent or substantially transparent launch and receive windows 2806, 2808, or such windows can be opened after coating by, for example, etching away the coating at the locations of the windows 2806, 2808. During physics cell operation, an electromagnetic energy propagation path 2878 between launch window 2806 and receive window 2808 traverses a first dipolar-gas-filled vial cavity 2802 and returns via a second dipolar-gas-filled vial cavity 2804.

The windows 2806, 2808 of FIG. 28 are configured for lateral signal launch and receipt. FIG. 29 illustrates an example single-vial U-shaped physics cell 2900 similar to physics cell 2800 shown in FIG. 28 but having launch and receive windows 2906, 2908 for under-side (or top-side) signal launch and receipt. During physics cell operation, an electromagnetic energy propagation path 2978 between launch window 2906 and receive window 2908 traverses a first dipolar-gas-filled vial cavity 2902 and returns via a second dipolar-gas-filled vial cavity 2904. Middle wall, which divides cavity 2902 from cavity 2904, extends from region 2994 in near sealing plane 2990 to region 2996, and does not extend completely to far sealing plane 2992.

FIGS. 30 and 31 show example cross-sections of the U-shaped single vials 2800, 2900 of FIGS. 28 and 29. In both illustrated cross-sections, the launch window 3006, 3106 and the receive window 3008, 3108 are configured for lateral signal launch and receipt, but, as indicated with reference to FIG. 29, in other examples, the windows can be configured for under-side (or top-side) signal launch and receipt. The cross-section of FIG. 30 shows first cavity 3002 separated from second cavity 3004 by a middle wall formed by heating and crimping the top and the bottom of the starting wide glass vial together to meet somewhere in the middle. The wall does not extend entirely through the vial, such that far glass wall regions 3045, 3047 correspond to regions 2896, 2996 in FIGS. 28 and 29. The exterior of the vial is coated with an electromagnetically reflective (e.g., electrically conductive) material (e.g., a metal) 3001. Coating also covers the insides 3043, 3045 of the wall on the exterior of the vial. In the example of FIG. 31, first cavity 3102 is separated from second cavity 3104 by a middle wall formed by heating and crimping the top of the starting wide glass vial to meet the bottom of the glass vial. The wall does not extend entirely through the vial, such that far glass wall region 3145 corresponds to regions 2896, 2996 in FIGS. 28 and 29. The exterior of the vial is coated with an electromagnetically reflective (e.g., electrically conductive) material (e.g., a metal) 3101. Coating also covers the inside 3141 of the wall on the exterior of the vial.

Other examples, not illustrated, can be formed as extensions of the examples of FIGS. 27 through 31, in which the starting vial 2701 is shaped differently or the central crimped region has a different shape. For example, the central crimped region may not extend all the way to a seal plane 2890 or 2990, thus creating a donut-shaped vial having an effectively circular electromagnetic propagation path. Such an example can have only a single launch/receive window and can be configured to operate in a similar fashion to the single-window example of FIGS. 15A and 15B. In other examples, not illustrated, an even wider starting vial (e.g., having a cross-sectional aspect ratio of greater than 5:1) can be crimped to have multiple walls, offset with respect to each other, to provide serpentine-shaped or spiral-shaped structures composed of more than two coupled cavities, thus extending the effective length of the physics cell by increasing the amount of low-pressure dipolar gas through which the interrogation millimeter waves are made to travel.

Figure 32:
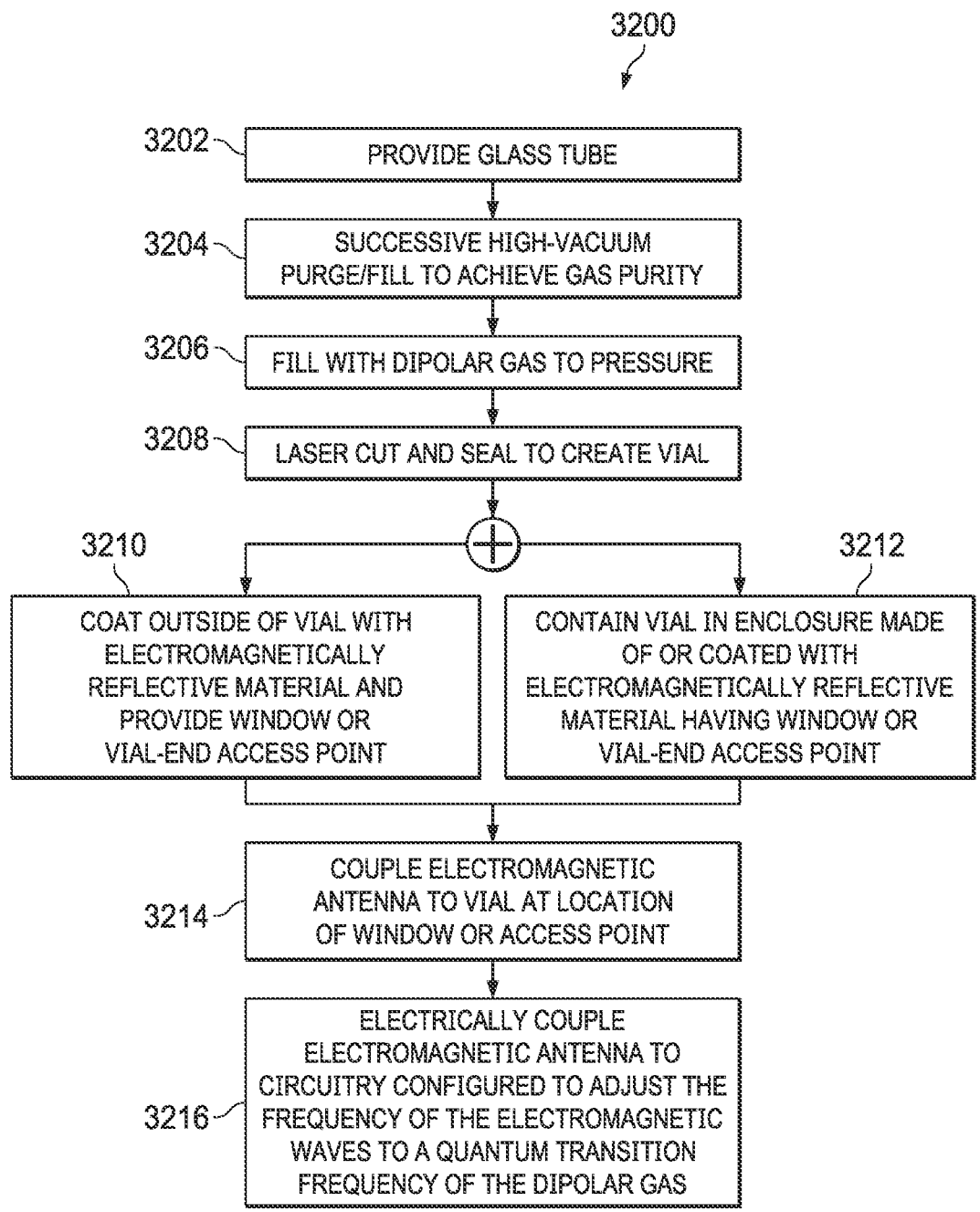
FIG. 32 is a flow chart showing an example method of manufacturing a glass vial-based physics cell.

The flow chart of FIG. 32 illustrates an example method 3200 of fabricating a glass vial-based physics cell, such as may be used in a quantum transition frequency detector like detector 100 of FIG. 1. A glass tube is provided 3202. The glass tube can be manufactured using, as examples, an extrusion process, a Danner process, a Vello process, a down-draw, or any suitable process. For example, the glass tube can have a width of between about 1 millimeter and about 10 millimeters. As examples, the glass tube can have walls of thickness between about 50 micrometers and about 250 micrometers, e.g., between about 100 micrometers and about 180 micrometers, e.g., between about 120 micrometers and about 150 micrometers. The glass tube can have a cross-section that is square, rectangular, rounded rectangular, oval, ellipsoid, or another shape.

A successive vacuum purge and fill process is then used 3204 to achieve a gas purity of a dipolar gas. As examples, the dipolar gas can be $H_2O$, $CH_3CN$, $HC_3N$, $NH_3$, OCS, HCN, or $H_2S$. The provided tube is filled with a dipolar gas, which gas is then purged from the tube under vacuum. The fill and purge are repeated until the gas is present to a desired purity. At the conclusion of the fill-and-purge process 3204, the tube is filled 3206 with the dipolar gas to a desired low pressure. As examples, the pressure of the dipolar gas within the tube is between about 0.01 millibar and 0.2 millibar, e.g., between about 0.01 millibar and 0.1 millibar, e.g., between about 0.03 millibar and about 0.06 millibar.

The low-pressure dipolar gas-filled tube is then laser cut and sealed 3208 to create a vial of a chosen length containing the dipolar gas at the chosen pressure. As examples, the length can be between about 1 centimeter and about 15 centimeters, e.g., between about 2 centimeters and about 10 centimeters, e.g., between about 5 centimeters and about 7 centimeters. The laser cutting and sealing process can be, for example, as described above with reference to FIG. 2, illustrating cutting and sealing process 200.

The vial can be coated 3210 on the outside with an electromagnetically reflective material (e.g., metallized) and provided with an electromagnetically translucent window or vial-end access point in the coating. The window or vial-end access point can be provided either by not coating the vial at the region of the window or vial-end access point during the coating, or by post-coating removal of the coating at the region of the window or vial-end access point, e.g., by photolithographic etching or laser ablating. Examples of vials having vial-end access points are illustrated in FIGS. 3A, 4A, 5A, and 16A. Examples of vials having windows are illustrated in FIGS. 6A, 7A, 12A, 14A, and 15A.

The vial is not required to be entirely exteriorly coated 3210. It can be exteriorly coated 3210 at some portions of the exterior of the vial, or not at all. It can be contained 3212 in an enclosure that is made of or coated with an electromagnetically reflective material and has an electromagnetically translucent window or vial-end access point such that exterior walls of the vial adjoin (e.g., are substantially in contact with) the electromagnetically reflective material of the enclosure, at least for portions of the vial that have not been exteriorly coated with the electromagnetically reflective material. Examples of enclosures that can be coated in this fashion are described with reference to FIGS. 11A, 12A, 14A, and 15A.

An electromagnetic antenna, such as antenna 104 or 106 in the detector 100 of FIG. 1, can be coupled 3214 to the vial at the location of the electromagnetically translucent window or vial-end access point. The electromagnetic antenna can be configured to launch or receive (or, in some examples, both launch and receive, as in examples described above with reference to FIGS. 15A and 15B) electromagnetic waves propagated through the dipolar gas contained in the vial. Examples of antennas configured for lateral signal launch or receipt are described with reference to FIGS. 3A, 5A, and 16A, and include Vivaldi antennas. Examples of antennas configured for under-side signal launch or receipt are described with reference to FIGS. 6A, 11A, 12A, 14A, and 15A. In any of these examples, the antenna(s) can be drawn or printed on a PCB. The electromagnetic antenna can be electrically coupled 3216 to circuitry configured to adjust the frequency of the electromagnetic waves to a quantum transition frequency of the dipolar gas. The circuitry can be as described above with reference to circuitry 108 of the detector 100 of FIG. 1, and can be fabricated on one or more IC chips, as shown, for example, in FIG. 11B, 12A, 14B, 15B, 16A, or 16C.

In another example method, modified from method 3200, the vial is interiorly coated with an electromagnetically reflective material (e.g., metalized with a non-reactive metal, such as Au, Ag, Pt, Pd, Ru, Rh, Os, or Ir) prior to gas introduction 3204, pressurization 3206 and sealing 3208. In this modified method, the vial is not exteriorly coated 3210 (e.g., metallized), nor does any enclosure provided 3212 necessarily need to be coated (e.g., metallized) for those portions of enclosure in contact with the walls of the vial that are already interiorly coated.

Figure 33:
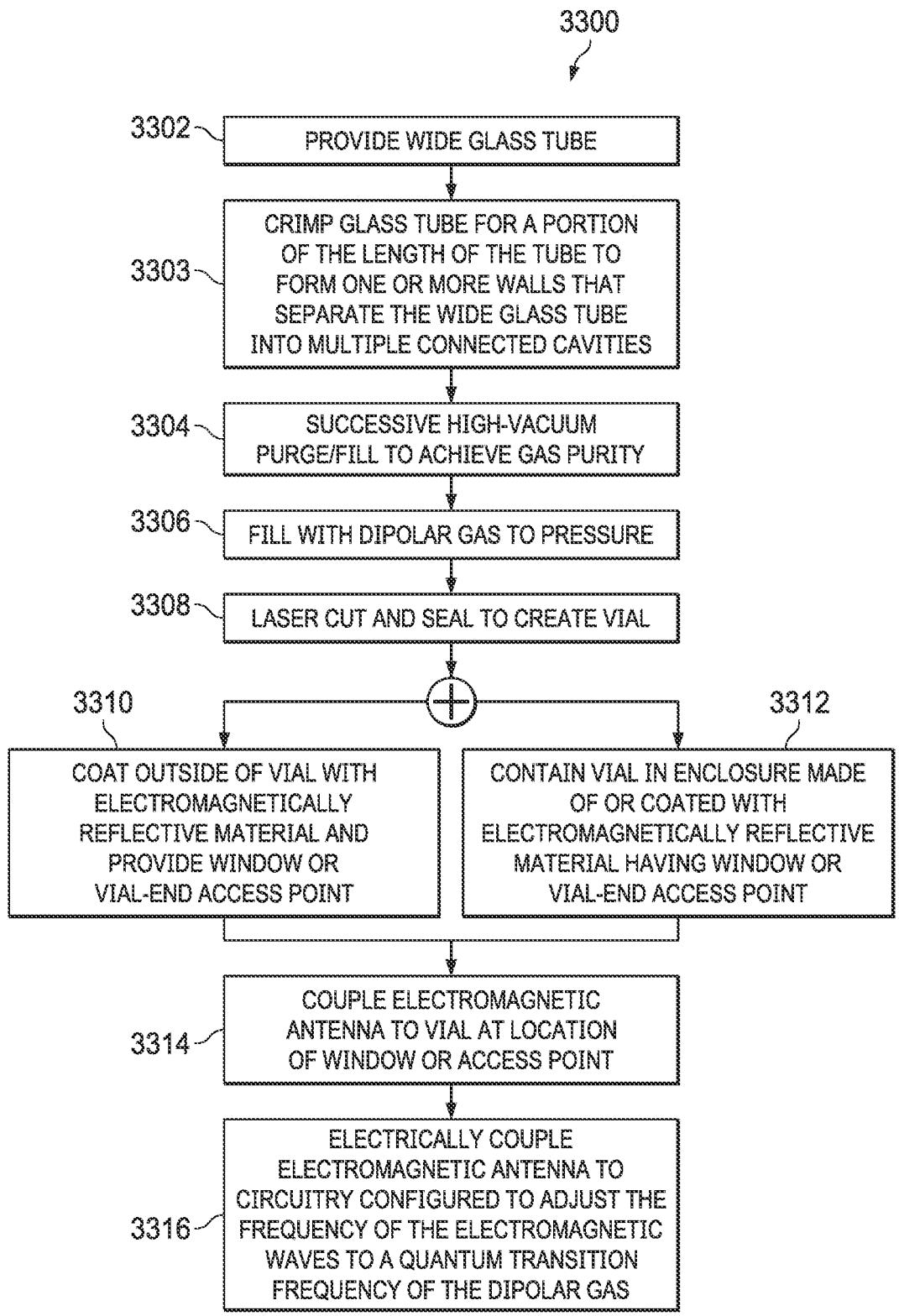
FIG. 33 is a flow chart showing an example method of manufacturing a single-vial U-shaped physics cell.

The flow chart of FIG. 33 illustrates an example method 3300 of fabricating a glass vial-based physics cell like that shown in FIGS. 28 through 31, such as may be used in a quantum transition frequency detector like detector 100 of FIG. 1. A wide glass tube is provided 3302. The glass tube can be manufactured using, as examples, an extrusion process, a Danner process, a Vello process, a down-draw, or any suitable process. For example, the glass tube is substantially wider than it is tall in cross section, e.g., with a width-to-height ratio of greater than 2:1, e.g., greater than 3:1, e.g., greater than 4:1, e.g., greater than 5:1, e.g., greater than 6:1. For example, the aspect ratio is 4.5:1. For example, the wide glass tube can have a width of between about 5 millimeter and about 50 millimeters. As examples, the glass tube can have walls of thickness between about 50 micrometers and about 250 micrometers, e.g., between about 100 micrometers and about 180 micrometers, e.g., between about 120 micrometers and about 150 micrometers. The glass tube can have a cross-section that is square, rectangular, rounded rectangular, oval, ellipsoid, or another shape. The wide glass tube may be sealed at one end.

A portion of the length of the tube may then be heated and crimped 3303 to form one or more walls that separate the wide glass tube into multiple connected cavities. For example, a single wall may be formed to create a two-cavity portion of the tube as shown in the examples of FIGS. 28 through 31. As another example, more than one wall may be formed to create a serpentine portion of the tube having more than two coupled cavities.

A successive vacuum purge and fill process is then used 3304 to achieve a gas purity of a dipolar gas. As examples, the dipolar gas can be $H_2O$, $CH_3CN$, $HC_3N$, $NH_3$, OCS, HCN, or $H_2S$. The provided tube is filled with a dipolar gas, which gas is then purged from the tube under vacuum. The fill and purge are repeated until the gas is present to a desired purity. At the conclusion of the fill-and-purge process 3304, the tube is filled 3306 with the dipolar gas to a desired low pressure. As examples, the pressure of the dipolar gas within the tube is between about 0.01 millibar and 0.2 millibar, e.g., between about 0.01 millibar and 0.1 millibar, e.g., between about 0.03 millibar and about 0.06 millibar.

The low-pressure dipolar gas-filled tube is then laser cut and sealed 3308 to create a vial of a chosen length containing the dipolar gas at the chosen pressure. As examples, the length can be between about 1 centimeter and about 15 centimeters, e.g., between about 2 centimeters and about 10 centimeters, e.g., between about 5 centimeters and about 7 centimeters. The laser cutting and sealing process can be, for example, as described above with reference to FIG. 2, illustrating cutting and sealing process 200.

The vial can be coated 3310 on the outside with an electromagnetically reflective material (e.g., metallized) and provided with an electromagnetically translucent window or vial-end access point in the coating. The window or vial-end access point can be provided either by not coating the vial at the region of the window or vial-end access point during the coating, or by post-coating removal of the coating at the region of the window or vial-end access point, e.g., by photolithographic etching or laser ablating. Examples of vials having vial-end access points are illustrated in FIGS. 3A, 4A, 5A, and 16A. Examples of vials having windows are illustrated in FIGS. 6A, 7A, 12A, 14A, 15A, 25, 26, 28, 29, 30, and 31.

The vial is not required to be entirely exteriorly coated 3310. It can be exteriorly coated 3310 at some portions of the exterior of the vial, or not at all. It can be contained 3312 in an enclosure that is made of or coated with an electromagnetically reflective material and has an electromagnetically translucent window or vial-end access point such that exterior walls of the vial adjoin (e.g., are substantially in contact with) the electromagnetically reflective material of the enclosure, at least for portions of the vial that have not been exteriorly coated with the electromagnetically reflective material. Examples of enclosures that can be coated in this fashion are described with reference to FIGS. 11A, 12A, 14A, and 15A.

An electromagnetic antenna, such as antenna 104 or 106 in the detector 100 of FIG. 1, can be coupled 3314 to the vial at the location of the electromagnetically translucent window or vial-end access point. The electromagnetic antenna can be configured to launch or receive (or, in some examples, both launch and receive, as in examples described above with reference to FIGS. 15A and 15B) electromagnetic waves propagated through the dipolar gas contained in the vial. Examples of antennas configured for lateral signal launch or receipt are described with reference to FIGS. 3A, 5A, and 16A, and include Vivaldi antennas. Examples of antennas configured for under-side signal launch or receipt are described with reference to FIGS. 6A, 11A, 12A, 14A, and 15A. In any of these examples, the antenna(s) can be drawn or printed on a PCB. The electromagnetic antenna can be electrically coupled 3316 to circuitry configured to adjust the frequency of the electromagnetic waves to a quantum transition frequency of the dipolar gas. The circuitry can be as described above with reference to circuitry 108 of the detector 100 of FIG. 1, and can be fabricated on one or more IC chips, as shown, for example, in FIG. 11B, 12A, 14B, 15B, 16A, or 16C.

In another example method, modified from method 3300, the vial is interiorly coated with an electromagnetically reflective material (e.g., metalized with a non-reactive metal, such as Au, Ag, Pt, Pd, Ru, Rh, Os, or Ir) prior to gas introduction 3204, pressurization 3306 and sealing 3308. In this modified method, the vial is not exteriorly coated 3210 (e.g., metallized), nor does any enclosure provided 3212 necessarily need to be coated (e.g., metallized) for those portions of enclosure in contact with the walls of the vial that are already interiorly coated.

Physics cells and frequency-locking systems using glass vials as described herein provide manufacturability and cost advantages over physics cells and systems using bonded wafers having a hollowed cavity. In examples, a physics cell or frequency-locking system can be fabricated by coupling one or more glass vials to a PCB bearing one or more antennas and one or more IC chips containing electronics implementing transmit, receive, and control functions. Coupling two or more glass vials together by a waveguide, which in some examples can consist of a molded plastic having a cavity interiorly coated with an inexpensive reactive metal, can effectively extend the length of the physics cell within a compact system package while further providing the benefit of coupling antennas and electronics to the physics cell at only one end of the physics cell.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. An apparatus comprising:
  a container made of a same material, the container being sealed and enclosing a dipolar gas and including an electromagnetic (EM) reflective coating, the EM reflective coating including an opening that allows an EM signal to propagate into or out of the container; and
  an antenna at the opening.

2. The apparatus of claim 1, wherein the container is configured to support a mono-mode of propagation of the EM signal at a frequency of a quantum transition of the dipolar gas.

3. The apparatus of claim 1, wherein the material includes borosilicate.

4. The apparatus of claim 1, wherein a pressure of the dipolar gas in the container is between 0.01 millibar and 0.2 millibar.

5. The apparatus of claim 1, wherein the container has two straight portions and a bent portion coupled between the two straight portions.

6. The apparatus of claim 1, wherein the container is hermetically sealed.

7. The apparatus of claim 1, wherein the EM reflective coating is on an interior surface or on an exterior surface of the container.

8. The apparatus of claim 1, wherein the antenna includes a millimeter-wave antenna.

9. The apparatus of claim 1, wherein the container has a cross-sectional shape of at least one of: a square, a rectangle, a rounded rectangle, an oval, an ellipse, or a circle.

10. The apparatus of claim 1, wherein the dipolar gas includes at least one of: water vapor ($H_2O$), acetonitrile ($CH_3CN$), cyanoacetylene ($HC_3N$), ammonia ($NH_3$), carbonyl sulfide (OCS), hydrogen cyanide (HCN), or hydrogen sulfide ($H^2S$).

11. The apparatus of claim 1, wherein:
  the opening is a first opening, and the EM reflective coating has a second opening;
  the antenna is a first antenna;
  the apparatus further includes a second antenna at the second opening.

12. The apparatus of claim 1, wherein:
  the container is a first container, the dipolar gas is a first dipolar gas, the EM reflective coating is a first EM reflective coating, the opening is a first opening, and the antenna is a first antenna; and
  the apparatus further comprises:
    a second container enclosing a second dipolar gas, the second container being sealed and including a second EM reflective coating, the second EM reflective coating including a second opening that allows the EM signal to propagate into or out of the second container;
    a second antenna at the second opening; and
    a waveguide coupled between the first and second container.

13. The apparatus of claim 1, wherein the container has a form of a vial.

14. A system comprising:
  a container made of a same material, the container being sealed and enclosing a dipolar gas including an electromagnetic (EM) reflective coating, the EM reflective coating including an opening that allows an EM signal to propagate into or out of the container;
  an antenna at the opening and configured to transmit or receive the EM signal that propagates through the dipolar gas in the container; and
  circuitry coupled to the antenna and configured to set a frequency of the EM signal to a quantum transition frequency of the dipolar gas.

15. The system of claim 14, wherein the container has two straight portions and a bent portion coupled between the two straight portions.

16. The system of claim 14, wherein the container is configured to support a mono-mode of propagation of the EM signal at the quantum transition frequency of the dipolar gas.

17. The system of claim 14, wherein:
  the opening is a first opening, and the EM reflective coating has a second opening;
  the antenna is a first antenna;
  the system further includes a second antenna coupled to the circuitry and the container, and the second antenna is at the second opening.

18. The system of claim 14, wherein:
  the container is a first container, the dipolar gas is a first dipolar gas, the EM reflective coating is a first EM reflective coating, the opening is a first opening, and the antenna is a first antenna; and the system further comprises:
- a second container enclosing a second dipolar gas, the second container being sealed, the second container including a second EM reflective coating, the second EM reflective coating including a second opening that allows the EM signal to propagate into or out of the second container;
- a second antenna at the second opening, the second antenna coupled to the circuitry and the second container; and
- a waveguide coupled between the first and second containers.

19. The system of claim 14, wherein the container is hermetically sealed.

20. The system of claim 14, wherein the material includes borosilicate.

21. The system of claim 14. wherein a wall of the container has a thickness between 50 micrometers to 250 micrometers, and a pressure of the dipolar gas in the container is between 0.01 millibar and 0.2 millibar.

22. The system of claim 14, wherein the EM reflective coating is on an interior surface or on an exterior surface of the container.

* * * * *